US008289084B2

(12) United States Patent
Morimoto et al.

(10) Patent No.: US 8,289,084 B2
(45) Date of Patent: Oct. 16, 2012

(54) RF POWER AMPLIFIER DEVICE AND OPERATING METHOD THEREOF

(75) Inventors: Takaaki Morimoto, Saku (JP); Akira Kuriyama, Kodaira (JP); Satoshi Tanaka, Kanagawa (JP); Hayato Nakamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/116,327

(22) Filed: May 26, 2011

(65) Prior Publication Data

US 2011/0298545 A1 Dec. 8, 2011

(30) Foreign Application Priority Data

Jun. 7, 2010 (JP) ................................ 2010-130163

(51) Int. Cl.
*H03F 3/04* (2006.01)
(52) U.S. Cl. ........................................ 330/297; 330/296
(58) Field of Classification Search ..................... 330/51, 330/285, 296, 297, 302
See application file for complete search history.

(56) References Cited

U.S. PATENT DOCUMENTS

| 6,624,702 | B1 | 9/2003 | Dening |
| 7,091,790 | B2 * | 8/2006 | Doherty et al. ............... 330/297 |
| 7,102,427 | B2 * | 9/2006 | Matsumoto et al. ............ 330/10 |
| 7,123,095 | B2 * | 10/2006 | Tsutsui et al. ................ 330/285 |
| 7,782,141 | B2 * | 8/2010 | Witmer et al. ................ 330/297 |
| 2002/0055376 | A1 | 5/2002 | Norimatsu |
| 2007/0085602 | A1 | 4/2007 | Park et al. |
| 2007/0298736 | A1 | 12/2007 | Fujioka et al. |
| 2010/0301947 | A1 | 12/2010 | Fujioka et al. |

FOREIGN PATENT DOCUMENTS

| JP | 11-312933 A | 11/1999 |
| JP | 2007-116694 A | 5/2007 |
| JP | 2008-35487 A | 2/2008 |

OTHER PUBLICATIONS

GSM Association, Battery Life Measurement Technique, Version 5.1, Sep. 15, 2009, http://gsmworld.com/documents/DG_09_v51.doc (searched Mar. 15, 2010).

* cited by examiner

*Primary Examiner* — Henry Choe
(74) *Attorney, Agent, or Firm* — Mattingly & Malur, PC

(57) ABSTRACT

An RF power amplifier device includes a driver stage amplifier, a first RF amplifier, a second RF amplifier and a DC voltage converter operated by first, second and third external power supply voltages. The output of the driver stage amplifier is supplied to the inputs of the first and second RF amplifiers. An effective device size of the first RF amplifier is set to a device size larger than that of the second RF amplifier. The third external power supply voltage is supplied to the DC voltage converter, so that the DC voltage converter generates a fourth operating power supply voltage corresponding to a low voltage and supplies it to an output terminal of the second RF amplifier. An output terminal of the first RF amplifier can be supplied with the second external power supply voltage without via the DC voltage converter.

20 Claims, 18 Drawing Sheets

RF POWER AMPLIFIER DEVICE AND OPERATING METHOD THEREOF

CROSS-REFERENCE TO RELATED APPLICATIONS

The present application claims priority from Japanese patent application JP 2010-130163 filed on Jun. 7, 2010, the content of which is hereby incorporated by reference into this application.

BACKGROUND

The present invention relates to an RF (Radio Frequency) power amplifier device and an operating method thereof, and in particular to a technology useful in reducing current consumption at low power output and lightening an increase in mounting area.

A plurality of communication systems exist in mobile communications typified by portable phones. There is known in Europe, for example, W-CDMA corresponding to the wireless communication system for 3rd generation started with service in recent years, in addition to a GSM prevalent as the wireless communication system for 2nd generation and EDGE improved in data communication rate of the GSM. Cdmalx corresponding to the wireless communication system for 3rd generation is in widespread use in North America in addition to a DCS and a PCS each corresponding to the wireless communication system for 2nd generation.

Incidentally, GSM is an abbreviation of Global System for Mobile Communications. EDGE is an abbreviation of Enhanced Data rates for GSM Evolution. W-CDMA is an abbreviation of Wide band Code Division Multiple Access. DCS is an abbreviation of Digital Cellular System. PCS is an abbreviation of Personal Communications Services. cdmalx is an abbreviation of Code Division Multiple Access 1x.

The operation of a high frequency power amplifier included in a portable phone terminal is specified to a saturation operation in the case of GSM in a basic mode, which uses only phase modulation, and specified to a linear operation at an operating point where a backoff of a few dB is taken from the saturation operating point of GSM, in the case of EDGE using even amplitude modulation along with phase modulation. Even in the case of W-CDMA and cdma-1x using even amplitude modulation along with phase modulation, the operation of a high frequency power amplifier is specified to a linear operation.

While there is a need to extend the maximum talking time for the purpose of improving the convenience of the portable phone terminal, a reduction in current consumed or used up during talking on the portable phone terminal is required. Since a part relatively large in proportion occupied within all current consumption in particular is of an RF power amplifier of a transmission section, a reduction in the current consumption of the RF power amplifier of the transmission section is effective in reducing the current consumption of the portable phone terminal.

Reducing current consumed on average is required under actual use environments of the portable phone terminal in particular. This current is hereinafter called "average current consumption".

With a size reduction in the recent portable phone terminal, the RF power amplifier of the transmission section needs to be reduced in size.

Various methods have been reported for the achievement of miniaturization. As one example, there is a method disclosed in each of the following patent documents 1 through 4.

For example, a power amplifier described in the following patent document 1 is configured by an RF signal input terminal, an RF output terminal, a power supply voltage source input terminal, and a bias input terminal. An RF signal is inputted from the RF signal input terminal and amplified. The amplified RF signal is outputted from the RF output terminal and transmitted from an antenna through a matching circuit.

A power supply voltage is inputted from a DC-DC converter to the power supply voltage source input terminal. In one embodiment, the DC-DC converter is a buck converter also called a step-down circuit. In another embodiment, the DC-DC converter is a boost converter called a step-up circuit. In a further embodiment, the DC-DC converter is a buck/boost converter having both functions of step-up and step-down. The DC-DC converter converts a battery voltage or a supply voltage from a battery or another power supply to a power supply voltage used in the power amplifier.

A control circuit is equipped with a schottky diode or a normal diode, which thereby detects an amplification output signal and outputs a signal corresponding to an output power intensity. That is, two signals responsive to the output power intensity are generated by the control circuit. The first signal is supplied to the DC-DC converter, and the second signal is supplied to a bias circuit.

Since the DC-DC converter changes in voltage transformation ratio due to the first signal supplied thereto, the power supply voltage changes. When a low amplification output signal is detected by the control circuit, the DC-DC generates a low power supply voltage in accordance with the first signal generated by the control circuit. Thus, since power consumption of the power amplifier decreases, high power efficiency can be achieved.

Simultaneously with the control of the DC-DC converter, a bias voltage set signal supplied to the bias input terminal changes due to the second signal supplied to the bias circuit. Since the bias voltage is lowered in the case of the low amplification output signal, current consumption from the battery can be reduced. There is a linear correlation between the input bias voltage and the bias voltage. The input bias voltage is converted to a desired value to achieve the maximum efficiency, using a suitable circuit, for example.

A power amplifier described in the following patent document 2 is comprised of a first transistor and a second transistor coupled in parallel. A static characteristic being preferably a pinchoff voltage, of the first transistor is different from that of the second transistor.

An RF signal is inputted from an RF signal input terminal to the first and second transistors, and a bias voltage is inputted from a bias voltage input terminal. The RF signal amplified by the first and second transistors is outputted from an RF signal output terminal. The source of an FET (Field Effect Transistor) that configures each of the first and second transistors is coupled to a ground potential, and a fixed drain voltage is supplied from a drain voltage input terminal.

The first transistor and the second transistor are different from each other in pinchoff voltage. The pinchoff voltage of the second transistor is a voltage higher than the pinchoff voltage of the first transistor. Therefore, when a relatively high voltage is applied to the bias voltage input terminal, the first transistor and the second transistor are turned on, whereas when an intermediate voltage is applied, only the first transistor is turned on.

Thus, the size of the second transistor having the high pinchoff voltage is set large to maintain output power at high output. Further, the size of the first transistor having the low pinchoff voltage is set small to enable an improvement in the efficiency at low output.

A power amplifier described in the following patent document 3 is equipped with an input impedance matching unit, an intermediate stage impedance matching unit, a low output amplifier, a high output amplifier, an output impedance matching unit, an amplifier control unit, and a dynamic voltage supply unit. The high output amplifier corresponding to a high linear amplifier has the function of operating in a high output mode in the maximum power consumption region by control of the amplifier control unit and amplifying a signal given from the intermediate stage impedance matching unit.

The low output amplifier corresponding to a non-linear amplifier has the function of operating in a low output mode in the maximum frequency-of-use region by control of the amplifier control unit, providing parallel coupling to the high output amplifier and amplifying a signal given from the intermediate stage impedance matching unit.

The low output amplifier is of an amplifier of Class E operation, for example, to obtain a high efficiency characteristic, which is comprised of a bias unit coupled to an output stage of the amplifier control unit and for on/off-controlling the low output amplifier, a first transistor driven by a control signal of the amplifier control unit, and a Class E load which is coupled between the collector of the first transistor and an input stage of the output impedance matching unit and causes the output impedance matching unit to input an RF signal.

The amplifier control unit generates a predetermined power control signal, based on an antenna output signal given from outside. During a high output mode operation, the amplifier control unit turns off the low output amplifier to control the low output amplifier in such a manner as not to be driven and turns on only the high output amplifier to control the high output amplifier in such a manner as to be driven. On the other hand, during a low output mode operation, the amplifier control unit turns off the high output amplifier and turns on only the low output amplifier to control the low output amplifier in such a manner as to be driven. Thus, according to the power amplifier described in the following patent document 3, a power stage of the power amplifier is divided into one or more. At low output, a non-linear amplifier is used for achieving high efficiency and a high linear amplifier is used for an improvement in linearity at high output, thereby supplying a variable power supply voltage from the dynamic voltage supply unit to the non-linear amplifier for the purpose of maximizing power efficiency at the maximum frequency of use. There are thus advantages that efficiency in the region of the maximum frequency of use can be increased and the battery runtime can be prolonged.

An RF power amplifier described in the following patent document 4 includes a first amplifying device and a second amplifying device used as final stage amplifying devices coupled in parallel between an input terminal and an output terminal. The first amplifying device is operated in any of Class B to Class AB, and the second amplifying device is operated in Class C. A first execution device size of the first amplifying device is set smaller than a second execution device size of the second amplifying device.

At low output power, the second amplifying device large in device size in a Class C operation is deactivated, and the first amplifying device small in device size in one of Class B and Class AB amplifies an RF input power signal. It is therefore possible to improve power application efficiency at the low output power. At high output power, the second amplifying device as well as the first amplifying device amplifies an RF input power signal. Since the second amplifying device is large in device size, power application efficiency at the high output power can be improved.

Further, an RF power amplifier according to another embodiment described in the following patent document 4 includes a DC-DC converter controlled by an output control signal in order to use a high power supply voltage at high output power and use a low power supply voltage at low output power. A DC output voltage of the DC-DC converter is supplied to the drains or collectors of first and second amplifiers coupled in parallel between an input terminal and an output terminal via a first power supply voltage supply circuit and a second power supply voltage supply circuit.

On the other hand, a distribution of transmission power of a portable phone of a W-CDMA system is shown in FIG. 4.1 in page 22 of the following non-patent document 1. It is understood from this figure that a maximum usage probability of 12 to 13% is obtained at an intermediate output power of −6 to 0 dBm, and that a usage probability is also reduced to 10% or less in proportion to a reduction in output power at a low output power of −10 dBm or less, whereas at a high output power of 3 dBm or more, a usage probability is also reduced to 10% or less in inverse proportion to an increase in output power.

RELATED ART DOCUMENTS

[Patent Documents]
[Patent Document 1] U.S. Pat. No. 6,624,702 B1 Specifications
[Patent Document 2] Japanese Patent Laid-Open No. Hei 11 (1999)-312933
[Patent Document 3] Japanese Patent Laid-Open No. 2007-116694
[Patent Document 4] Japanese Patent Laid-Open No. 2008-035487
[Non-Patent Document]
[Non-Patent Document 1] GSM Association, "Battery Life Measurement Technique", Version 5.1, 15 Sep. 2009, http://gsmworld.com/documents/DG_09_v51.doc
[Searched on Mar. 15, 2010 (Hei 22)]

SUMMARY

According to the power amplifier described in the above patent document 1, a large current consumption reducing effect can be obtained at the low output power. In the RF power amplifier described in the patent document 1, however, the DC-DC converter needs to supply a large current of, for example, 1 A or so consumed or used up by an RF power amplifier device at the maximum output to the RF power amplifier.

Thus, the DC-DC converter needs a power transistor of a large chip size, which enables the passage of large electric current, and external parts each having a large size. As a result, the area of the DC-DC converter increases. Accordingly, a problem that the mounting area of the RF power amplifier with the DC-DC converter built therein increases greatly, has been revealed by the studies conducted by the present inventors prior to the present invention.

Since the power amplifier described in the patent document 2 does not use the DC-DC converter, its mounting area is very small and efficiency at low output power is relatively high. However, a problem that current consumption of an RF power amplifier device is still large has been revealed by the studies conducted by the present inventors prior to the present invention.

Further, in the power amplifier described in the patent document 3, a problem that since the power efficiency of the dynamic voltage supply unit for supplying power to the low output amplifier is low as compared with a DC-DC converter such as a buck converter, the current consumption of the low output amplifier and the dynamic voltage supply unit will increase as a consequence has been revealed by the studies conducted by the present inventors prior to the present invention.

A problem that since a Class-E load is required when a Class E operated amplifier is used as the low output amplifier, and a transformer and a load for impedance conversion are required for the dynamic voltage supply unit, a mounting area will increase, has been revealed by the studies conducted by the present inventors prior to the present invention. Further, a problem that since the Class E operated amplifier is not capable of coping with a variety of frequency bands because an amplifiable frequency band is narrow, and serves as a non-linear amplifier, linearity will be degraded, has been revealed by the studies conducted by the present inventors prior to the present invention.

On the other hand, in the RF power amplifier described in the patent document 4, problems that the DC-DC converter supplying the variable power supply voltage to the first and second amplifiers coupled in parallel needs a power transistor of a large chip size, which enables the passage of large electric current, and external parts each having a large size, in a manner similar to the power amplifier described in the patent document 1, thereby resulting in an increase in the area of the DC-DC converter, whereby the mounting area of the RF power amplifier with the DC-DC converter built therein increases greatly, have been revealed by the studies conducted by the present inventors prior to the present invention.

FIG. 4 is a diagram showing a configuration of an RF power amplifier discussed by the present inventors prior to the present invention.

In FIG. 4, reference numeral 210 denotes an RF signal input terminal, reference numeral 290 denotes an RF signal output terminal, reference numeral 216 denotes a bias set signal input terminal, reference numeral 215a denotes a drive power supply terminal of a driver stage amplifier, reference numeral 215b denotes a drive power supply terminal of a first RF power amplifier, reference numeral 230 denotes the driver stage amplifier, reference numeral 270a denotes the first RF power amplifier, reference numeral 220a denotes an input matching circuit, reference numeral 220b denotes an interstage matching circuit, reference numeral 220c denotes an output matching circuit, reference numeral 250a denotes a coupling capacitor, reference numerals 245a and 245b denote bypass capacitors, reference numerals 240a and 240b denote choke inductors, reference numeral 265 denotes a bias supply circuit, and reference numeral 266 denotes a bias current generating circuit. Reference numeral 205 denotes a semiconductor chip for a semiconductor integrated circuit, and reference numeral 200 denotes an RF power amplifier module.

The driver stage amplifier 230 and the first RF power amplifier 270a are N-type LDMOS transistors each having a gate electrode, a source electrode and a drain electrode. Incidentally, LDMOS is an abbreviation of Laterally Diffused Metal-Oxide Semiconductor.

The RF signal input terminal 210 is coupled to an input terminal of the input matching circuit 220a. An output terminal of the input matching circuit 220a is coupled to the gate electrode of the driver stage amplifier 230. The respective source electrodes of the driver stage amplifier 230 and the first RF power amplifier 270a are coupled to a ground potential.

The drain electrode of the driver stage amplifier 230 is coupled to an input terminal of the interstage matching circuit 220b. One electrode of the coupling capacitor 250a and the other electrode thereof are respectively coupled to an output terminal of the interstage matching circuit 220b and the gate electrode of the first RF power amplifier 270a.

The drain electrode of the first RF power amplifier 270a is coupled to an input terminal of the output matching circuit 220c. An output terminal of the output matching circuit 220c is coupled to the RF signal output terminal 290.

The bias current generating circuit 266 is a two terminal circuit having at least one input terminal and one output terminal, for example. The bias set signal input terminal thereof is coupled to the bias set signal input terminal 216, whereas the output terminal thereof is coupled to an input terminal of the bias supply circuit 265.

The bias supply circuit 265 is a three terminal circuit having one input and two outputs, for example. One input terminal thereof is coupled to the output terminal of the bias current generating circuit 266, and the first and second output terminals thereof are respectively coupled to the gate electrode of the driver stage amplifier 230 and the gate electrode of the first RF power amplifier 270a.

The drive power supply terminal 215a of the driver stage amplifier 230 and the drive power supply terminal 215b of the first RF power amplifier are respectively coupled to the drain electrode of the driver stage amplifier 230 and the drain electrode of the first RF power amplifier 270a via the choke inductors 240a and 240b. Further, the bypass capacitor 245a is shunt-coupled between the drive power supply terminal 215a of the driver stage amplifier 230 and the choke inductor 240a. The bypass capacitor 245b is shunt-coupled between the drive power supply terminal 215b of the first RF power amplifier 230 and the choke inductor 240b. The impedances taken as when the drive power supply terminal 215a of the driver stage amplifier and the drive power supply terminal 215b of the first RF power amplifier are respectively seen from the driver stage amplifier 230 and the first RF power amplifier 270a are designed to be sufficiently high.

FIG. 5 is a diagram showing the relationship between output power of the RF power amplifier of FIG. 4 discussed by the present inventors prior to the present invention and current consumption of the first RF power amplifier 270a thereof.

Incidentally, the relationship shown in FIG. 5 is a result obtained by simulation. Here, assumes that an output power of approximately 10 dBm or more is called "high power", and an output power of approximately 10 dBm or less is called "low power". It is understood from FIG. 5 that current consumption increases in proportion to an increase in output power at high power output, whereas current consumption is approximately constant irrespective of a decrease in output power at low power output.

FIG. 6 is a diagram showing the manner in which a predetermined amplification factor of the first RF power amplifier 270a is ensured by allowing a substantially constant dc current to flow through the drain electrode of the first RF power amplifier 270a without reference to a reduction in output power when low power is outputted from the RF power amplifier of FIG. 4 discussed by the present inventors prior to the present invention.

FIG. 7 is a diagram illustrating the relationship between an idle current corresponding to a dc current of the first RF power amplifier 270a of the RF power amplifier of FIG. 4 discussed by the present inventors prior to the present invention, and an amplification factor of the first RF power amplifier 270a.

It is understood from FIG. 7 that the amplification factor of the first RF power amplifier 270a is reduced in proportion to a decrease in the idle current corresponding to the dc current of the first RF power amplifier 270a.

There is thus a need to allow a constant dc current to flow through the drain electrode irrespective of the reduction in the output power for the purpose of ensuring a predetermined amplification factor of the first RF power amplifier 270a at the low power output. The current consumption becomes approximately constant for that purpose.

FIG. 8 is a diagram showing a usage probability distribution of output power under an actual use environment of a portable phone terminal, which uses the RF power amplifier of FIG. 4 discussed by the present inventors prior to the present invention. The usage probability distribution of the RF power amplifier shown in FIG. 8 corresponds approximately to the distribution of transmission power of the portable phone of the W-CDMA system described in the non-patent document 1.

It is understood from FIG. 8 that the output power corresponding to the maximum usage probability is in the vicinity of approximately 0 dBm. It is also understood that when the probability of use of a low power output operation at approximately 10 dBm or less is integrated, the sum thereof accounts for more than 90% of the total.

FIG. 9 is a diagram showing a characteristic generally called talk current, in which the characteristic of FIG. 5 at the RF power amplifier of FIG. 4 discussed by the present inventors prior to the present invention and the characteristic of FIG. 8 thereat are multiplied by each other. A current consumption distribution for each output power is shown in FIG. 9.

It is understood from FIG. 9 that current consumption at output power in the vicinity of approximately 0 dBm is maximum, and when the sum of current consumption is calculated by integrating current consumption at a low power output of approximately 10 dBm or less, the current consumption at the low power output of approximately 10 dBm or less accounts for about 90% of the entire current consumption. It has thus been revealed through FIG. 9 by the studies conducted by the present inventors prior to the present invention that a reduction in current consumption at the low power output is important for reducing average current consumption, and a large effect is obtained by reducing the current consumption at the low power output.

The present invention has been achieved as a result of the above studies conducted by the present inventors prior to the present invention.

It is thus an object of the present invention to reduce current consumption at low power output and further lighten an increase in mounting area.

The above and other objects and novel features of the present invention will be apparent from the description of the present specification and the accompanying drawings.

A summary of a typical one of the inventive aspects of the invention disclosed in this application will be briefly described as follows:

An RF power amplifier device (200) according to a typical embodiment of the present invention includes a driver stage amplifier (230), a first RF amplifier (270a), a second RF amplifier (270b) and a DC voltage converter (280).

The driver stage amplifier (230), the first RF amplifier (270a), the second RF amplifier (270b) and the DC voltage converter (280) are respectively operated by external power supply voltages (Vcc1, Vcc2 and Vcc3) supplied from the outside of the RF power amplifier device (200).

An output signal of the driver stage amplifier (230) is supplied to an input terminal of the first RF amplifier (270a) and an input terminal of the second RF amplifier (270b). An effective device size of the first RF amplifier (270a) is set to a device size larger than that of the second RF amplifier (270b).

The DC voltage converter (280) is supplied with the external power supply voltage (Vcc3). The DC voltage converter (280) generates an operating power supply voltage (Vcc4) corresponding to a voltage lower than the external power supply voltage (Vcc3) and supplies the operating power supply voltage (Vcc4) to an output terminal of the second RF amplifier (270b).

The external power supply voltage (Vcc2) supplied from the outside of the RF power amplifier device (200) can be supplied to an output terminal of the first RF amplifier (270a) without via the DC voltage converter (280) (refer to FIG. 1).

Advantageous effects obtained by a typical one of the invention disclosed in the present application will be briefly explained as follows:

According to the present invention, it is possible to reduce current consumption at low power output and further lighten an increase in mounting area.

BRIEF DESCRIPTION OF THE DRAWINGS

FIG. 7 is a diagram illustrating the relationship between an idle current corresponding to a dc current of the first RF power amplifier 270a of the RF power amplifier of FIG. 4 and an amplification factor of the first RF power amplifier 270a;

DETAILED DESCRIPTION

1. Summary of the Embodiments

Figure 1:
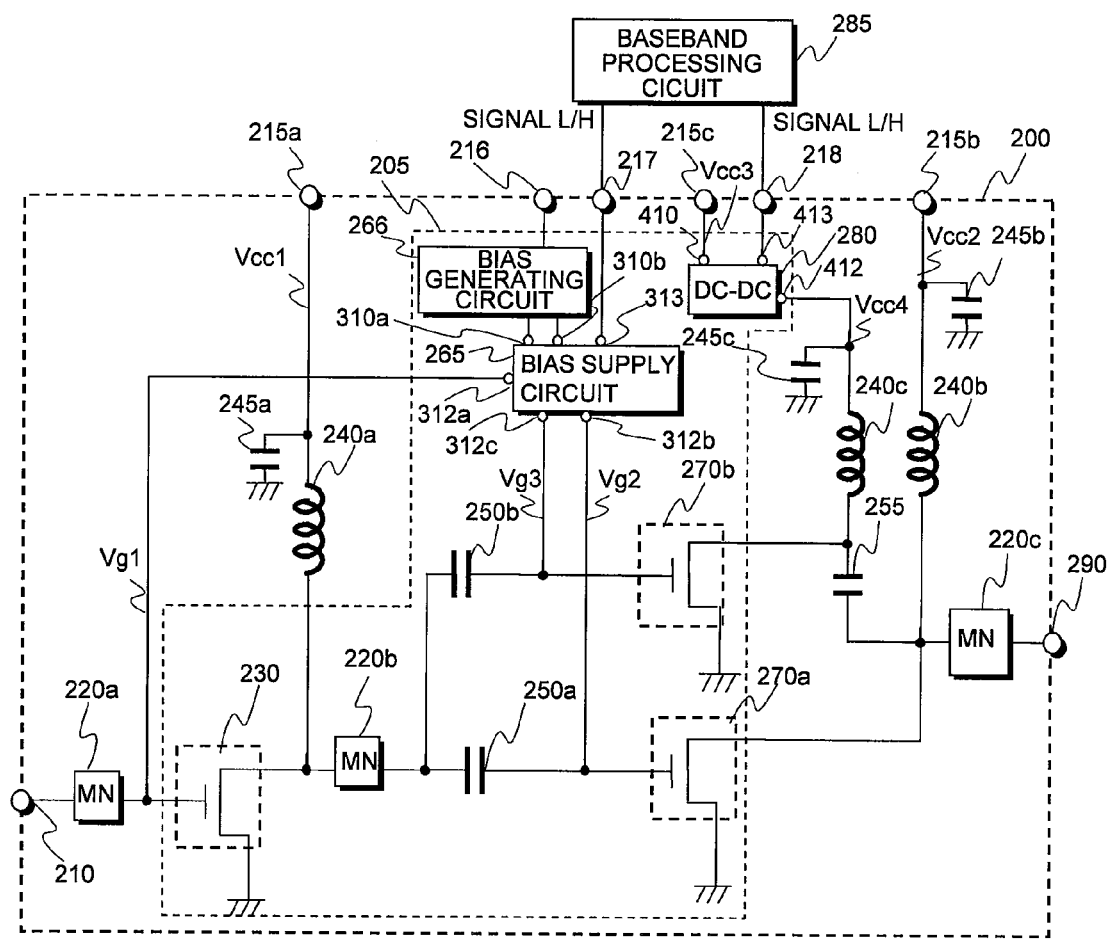
FIG. 1 is a diagram showing a configuration of an RF power amplifier device according to a first embodiment of the present invention.

A summary of typical embodiments of the invention disclosed in the present application will first be explained. Reference numerals of the accompanying drawings referred to with parentheses in the description of the summary of the typical embodiments only illustrate elements included in the concept of components to which the reference numerals are given.

[1] An RF power amplifier device (200) according to a typical embodiment of the present invention includes a driver stage amplifier (230), a first RF amplifier (270a), a second RF amplifier (270b) and a DC voltage converter (280).

The driver stage amplifier (230), the first RF amplifier (270a), the second RF amplifier (270b) and the DC voltage converter (280) are operable by external power supply voltages (Vcc1, Vcc2 and Vcc3) supplied from the outside of the RF power amplifier device (200).

An output signal generated from an output terminal of the driver stage amplifier (230) can be supplied to an input terminal of the first RF amplifier (270a) and an input terminal of the second RF amplifier (270b). An effective device size of the first RF amplifier (270a) is set to a device size larger than an effective device size of the second RF amplifier (270b).

The DC voltage converter (280) is capable of generating an operating power supply voltage (Vcc4) corresponding to a voltage lower than the external power supply voltage (Vcc3) by being supplied with the external power supply voltage (Vcc3). The DC voltage converter is able to supply the operating power supply voltage (Vcc4) to an output terminal of the second RF amplifier (270b).

The external power supply voltage (Vcc2) supplied from the outside of the RF power amplifier device (200) can be supplied to an output terminal of the first RF amplifier (270a) without via the DC voltage converter (280) (refer to FIG. 1).

According to the present embodiment, average current consumption can be reduced by a reduction in current consumption at low power output, which takes up a large operation probability. Further, an increase in mounting area due to the DC voltage converter can be reduced.

An RF power amplifier device (200) according to a preferred embodiment further includes a bias circuit (266, 255) capable of supplying a first bias voltage (Vg1), a second bias voltage (Vg2) and a third bias voltage (Vg3) to an input terminal of the driver stage amplifier (230), the input terminal of the first RF amplifier (270a) and the input terminal of the second RF amplifier (270b) respectively.

The bias circuit (266, 265) sets the second bias voltage (Vg2) and the third bias voltage (Vg3) to a low level and a high level respectively in response to a first state (L) of each of external control signals supplied to external control terminals (217 and 218) of the RF power amplifier device (200) to thereby control the first RF amplifier (270a) to an inactive state and control the second RF amplifier (270b) to an active state.

The bias circuit (266, 265) sets the second bias voltage (Vg2) and the third bias voltage (Vg3) to a high level and a low level respectively in response to a second state (H) of each of the external control signals supplied to the external control terminals (217 and 218) of the RF power amplifier device (200) to thereby control the first RF amplifier (270a) to an active state and control the second RF amplifier (270b) to an inactive state (refer to FIG. 1).

In a more preferred embodiment, the DC voltage converter (280) is controlled to an inactive state in response to the second state (H) of the external control signal to stop the generation of the operating power supply voltage (Vcc4) from the external power supply voltage (Vcc3) by the DC voltage converter (280) (refer to FIG. 1).

In another more preferred embodiment, even when the external control signal is either the first state (L) or the second state (H), the bias circuit (266, 265) sets the first bias voltage (Vg1) to a high level to thereby control the driver stage amplifier (230) to an active state (refer to FIG. 1).

In a further more preferred embodiment, the first bias voltage (Vg1), the second bias voltage (Vg2) of high level and the third bias voltage (Vg3) of high level, which are generated from the bias circuit (266, 265), are respectively set to values at which the driver stage amplifier (230), the first RF amplifier (270a) and the second RF amplifier (270b) are linearly operable respectively (refer to FIG. 1).

Figure 3:
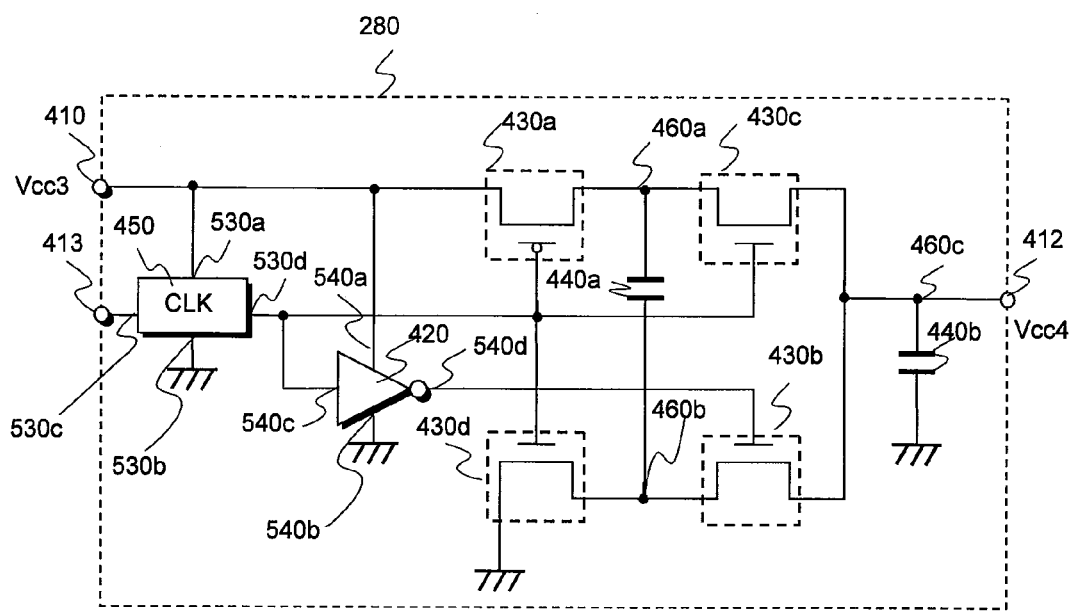
FIG. 3 is a diagram depicting a configuration of a DC-DC converter 280 included in the RF power amplifier device shown in FIG. 1.

In a satisfactory embodiment, the DC voltage converter (280) is a DC-DC converter configured by a charge pump circuit (refer to FIG. 3).

Figure 13:
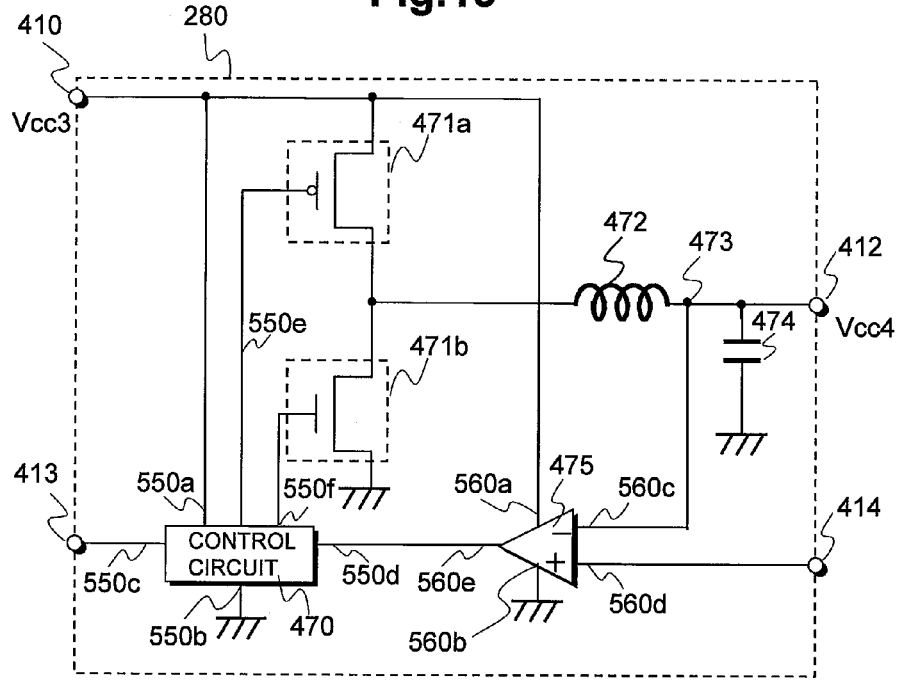
FIG. 13 is a diagram showing a configuration of a DC-DC converter 280 mounted in an RF power amplifier device according to a second embodiment of the present invention.

In another satisfactory embodiment, the DC voltage converter (280) is a DC-DC converter configured by a switching regulator using an inductor (472) (refer to FIG. 13).

An RF power amplifier device (200) according to a more satisfactory embodiment further includes a switch (287) coupled between an input terminal (410) of the DC voltage converter (280) supplied with the external power supply voltage (Vcc2) and an output terminal (412) of the DC voltage converter (280) from which the operating power supply voltage (Vcc4) is generated.

The DC voltage converter (280) is controlled to the inactive state and the switch (287) is controlled to an on state in response to the second state (H) of the external control signal. The switch (287) held in the on state bypasses between the input terminal (410) of the DC voltage converter (280) and the output terminal (412) thereof to thereby enable the external power supply voltage (Vcc2) supplied from the outside to be supplied to the output terminal of the first RF amplifier (270a) (refer to FIG. 14).

An RF power amplifier device (200) according to another more satisfactory embodiment further includes a series regulator (281) coupled between the output terminal (412) of the DC voltage converter (280) from which the operating power supply voltage is generated, and the output terminal of the second RF amplifier (270b).

Figure 15:
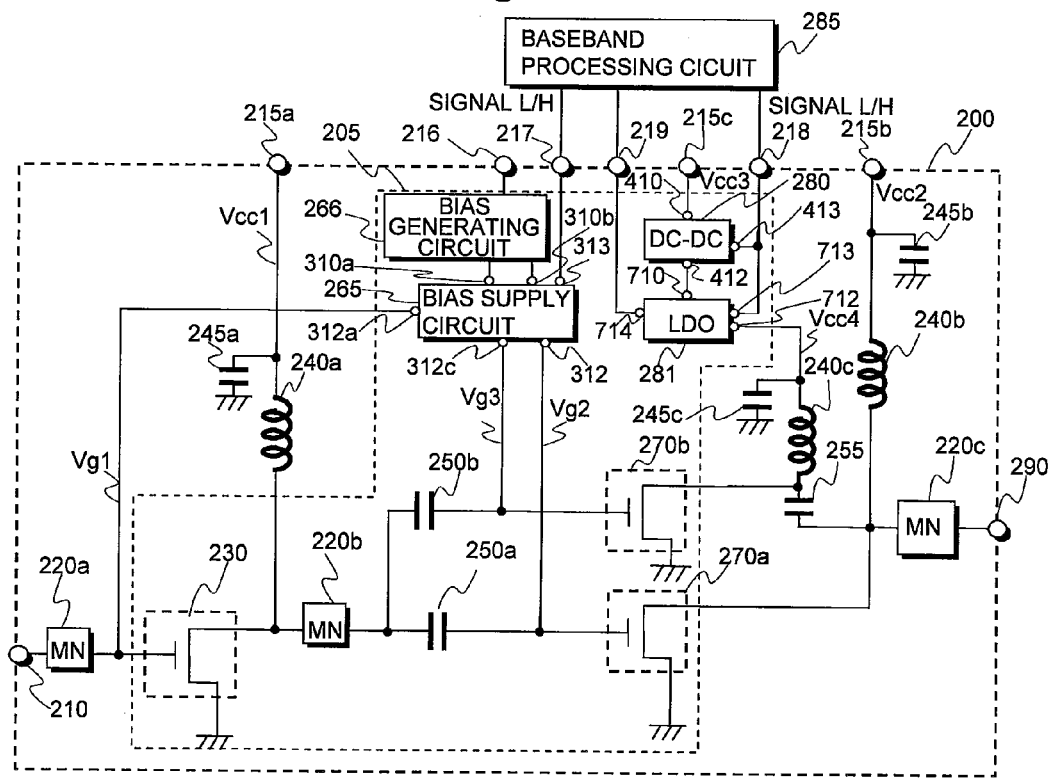
FIG. 15 is a diagram showing a configuration of an RF power amplifier device according to a fourth embodiment of the present invention.

When the DC voltage converter (280) is controlled to an active state in response to the first state (L) of the external control signal, the series regulator (281) supplied with the operating power supply voltage generated from the output terminal (412) of the DC voltage converter (280) is capable of generating an operating power supply voltage (Vcc4) adjusted by an output voltage set signal (714) supplied from the outside of the RF power amplifier device (200) and supplying the same to the output terminal of the second RF amplifier (270b) (refer to FIG. 15).

An RF power amplifier device (200) according to a further more satisfactory embodiment further includes a detector (284) capable of detecting an amplitude level of an RF input signal at the input terminal of the driver stage amplifier (230).

The operating power supply voltage (Vcc4) corresponding to the low voltage generated from the DC voltage converter (280) is varied in response to the output signal detected by the detector (284). The varied operating power supply voltage (Vcc4) is capable of being supplied to the output terminal of the second RF amplifier (270b) (refer to FIG. 17).

An RF power amplifier device (200) according to an improved embodiment further includes a change-over switch (291) having a first input terminal, a second input terminal, a control input terminal and an output terminal.

The external power supply voltage (Vcc1) is capable of being supplied to the first input terminal of the change-over switch (291). The operating power supply voltage generated from the output terminal (412) of the DC voltage converter (280) is capable of being supplied to the second input terminal of the change-over switch (291). The control input terminal of the change-over switch (291) is capable of responding to the first state (L) and the second state (H) of the external control signal. The output terminal of the change-over switch (291) is coupled to the output terminal of the driver stage amplifier (230).

Figure 19:
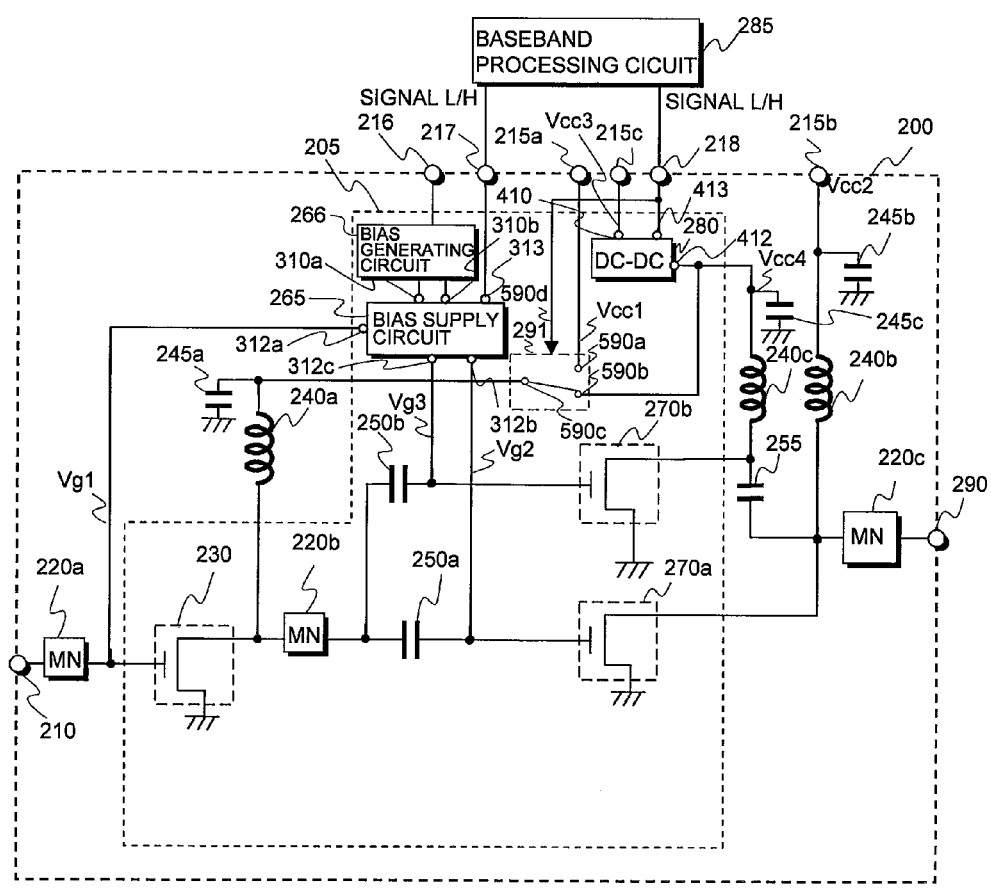
FIG. 19 is a diagram showing a configuration of an EF power amplifier device according to a sixth embodiment of the present invention.

In response to the second state (H) of the external control signal supplied to the control input terminal of the change-over switch (291), the change-over switch (291) supplies the external power supply voltage (Vcc1) supplied to the first input terminal to the output terminal of the driver stage amplifier (230) via the output terminal of the change-over switch (291) (refer to FIG. 19).

In response to the first state (L) of the external control signal supplied to the control input terminal of the change-over switch (291), the change-over switch (291) supplies the operating power supply voltage (Vcc4) corresponding to the low voltage generated from the DC voltage converter (280) to the output terminal of the driver stage amplifier (230) via the output terminal of the change-over switch (291).

In an RF power amplifier device (200) according to a more improved embodiment, the output terminal of the first RF amplifier (270a) and the output terminal of the second RF amplifier (270b) are coupled to an RF signal output terminal (290).

The output terminal of the driver stage amplifier (230) is further coupled to the RF signal output terminal (290) via a signal switch (295).

In response to a third state (LL) in which the external control signals supplied to the external control terminals (217, 218 and 296) of the RF power amplifier device (200) are respectively indicative of a lowest transmission output power state of the RF power amplifier device (200), the bias circuit (266, 265) sets the first bias voltage (Vg1), the second bias voltage (Vg2) and the third bias voltage (Vg3) to a high level, a low level and a low level respectively to thereby control the driver stage amplifier (230) to the active state, control the first RF amplifier (270a) to the inactive state and control the second RF amplifier (270b) to the inactive state.

Figure 20:
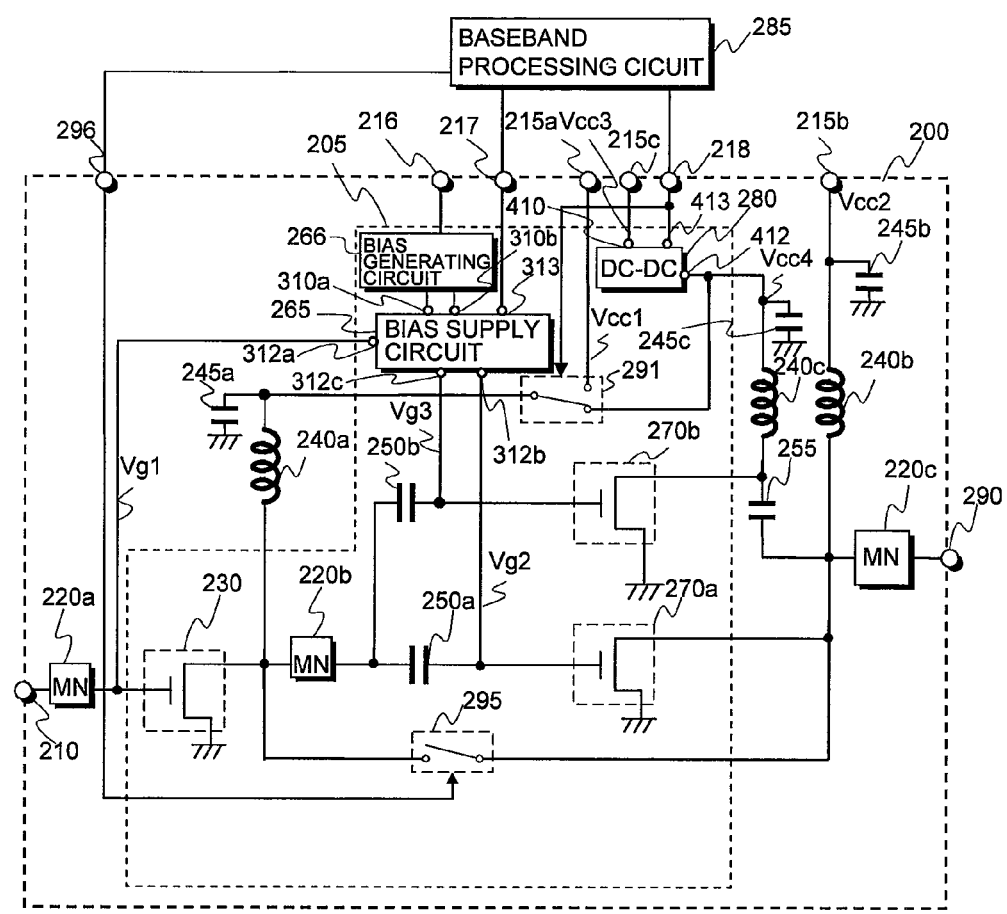
FIG. 20 is a diagram illustrating a configuration of an RF power amplifier device according to a seventh embodiment of the present invention.

The signal switch (295) is controlled to an on state in response to the third state (LL) of the external control signal to transmit an amplified signal of the output terminal of the driver stage amplifier (230) to the RF signal output terminal (290) via the signal switch (295) controlled to the on state (refer to FIG. 20).

In an RF power amplifier device (200) according to another more improved embodiment, the bias circuit (266 and 265) includes a first buffer amplifier (340a) and a second buffer amplifier (340b) which respectively supply the second bias voltage (Vg2) and the third bias voltage (Vg3) to the input terminal of the first RF amplifier (270a) and the input terminal of the second RF amplifier (270b).

In response to the second states (H) of the external control signals supplied to the external control terminals (217 and 218) of the RF power amplifier device (200), the bias circuit (266, 265) supplies the external power supply voltages (Vcc1, Vcc2 and Vcc3) supplied from the outside of the RF power amplifier device (200) to the first buffer amplifier (340a) and the second buffer amplifier (340b) respectively.

Figure 21:
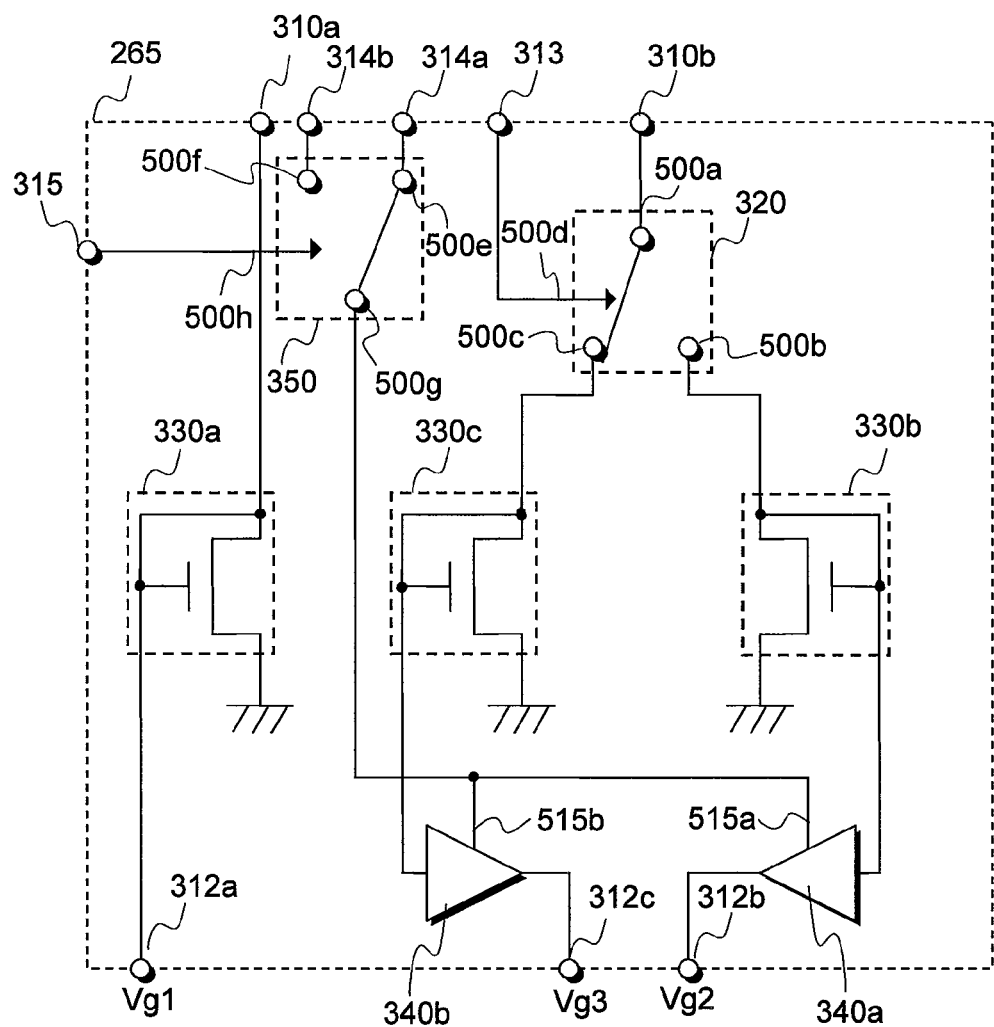
FIG. 21 is a diagram depicting a configuration of a bias supply circuit 265 according to an eighth embodiment of the present invention, usable in the RF power amplifier device according to any of the embodiments shown in FIGS. 1, 15, 17, 19, 20, 22 and 23.

In response to the first state (L) of each of the external control signals supplied to the external control terminals (217 and 218) of the RF power amplifier device (200), the bias circuit (266, 265) supplies the operating power supply voltage (Vcc4) corresponding to the low voltage generated from the DC voltage converter (280) to the first buffer amplifier (340a) and the second buffer amplifier (340b) (refer to FIG. 21).

In an RF power amplifier device (200) according to a further more improved embodiment, the output terminal of the first RF amplifier (270a) and the output terminal of the second RF amplifier (270b) are coupled to their corresponding RF signal output terminal (290).

One end of an output matching circuit (220c) is coupled to the RF signal output terminal (290). A first interstage matching circuit (220d) is coupled between the other end of the output matching circuit (220c) and the output terminal of the first RF amplifier (270a). A second interstage matching circuit (220e) is coupled between the other end of the output matching circuit (220c) and the output terminal of the second RF amplifier (270b) (refer to FIG. 22).

In a concrete embodiment, the external power supply voltage (Vcc5) generated from a DC-DC converter (299) located outside the RF power amplifier device (200) can be supplied to the RF power amplifier device (200). The driver stage amplifier (230), the first RF amplifier (270a), the second RF amplifier (270b) and the DC voltage converter (280) are operable by the external power supply voltage (Vcc5) (refer to FIG. 23).

An RF power amplifier device (200) according to another concrete embodiment further includes a third RF amplifier (270c) set to a device size smaller than the effective device size of the second RF amplifier (270b).

The bias circuit (266, 265) generates a fourth bias voltage (Vg4) and supplies it to an input terminal of the third RF amplifier (270c).

The output signal generated from the output terminal of the driver stage amplifier (230) can be supplied to the input terminal of the third RF amplifier (270c). An output terminal of the third RF amplifier (270c) is coupled to its corresponding RF signal output terminal (290) to which the output terminal of the first RF amplifier (270a) and the output terminal of the second RF amplifier (270b) are coupled (refer to FIG. 24).

In an RF power amplifier device (200) according to a further concrete embodiment, the driver stage amplifier (230), the first RF amplifier (270a) and the second RF amplifier (270b) are respectively configured by either a field effect transistor or a bipolar transistor.

Figure 27:
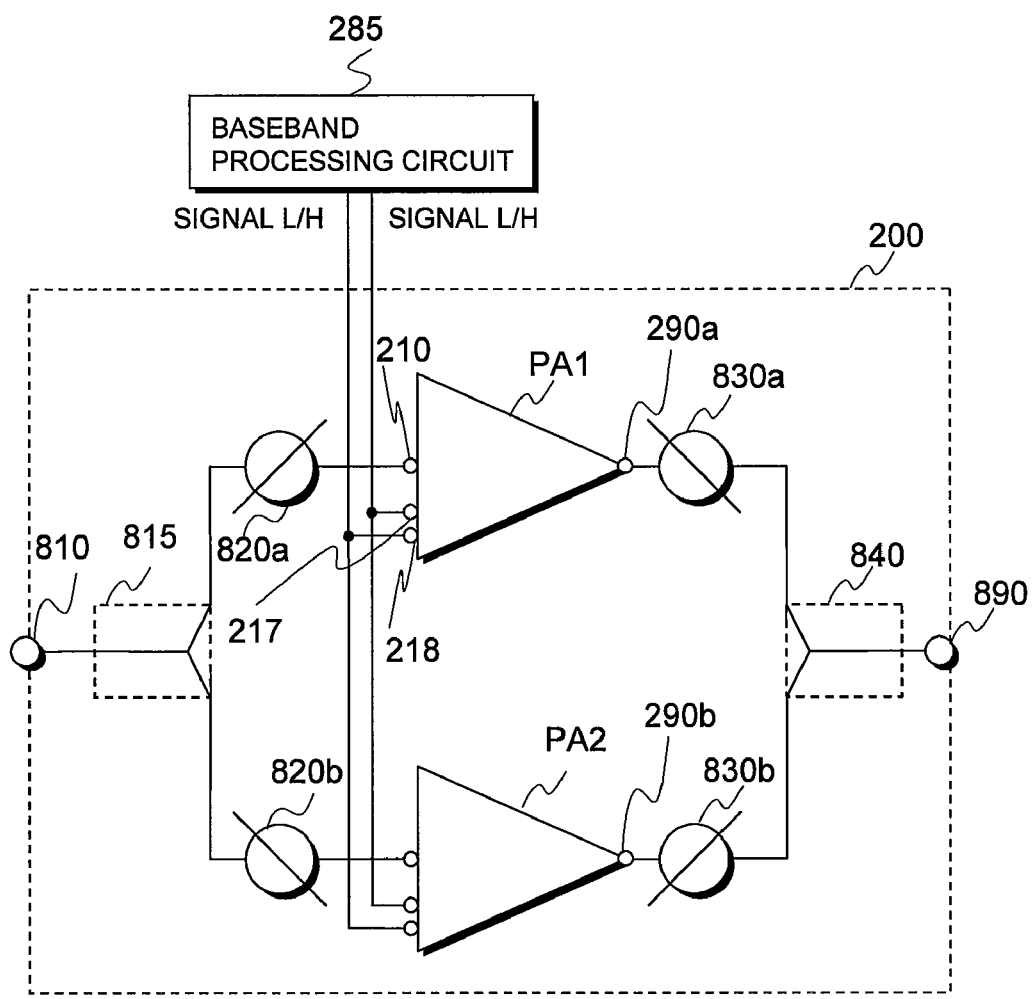
FIG. 27 is a diagram illustrating a configuration of an RF power amplifier device according to a thirteenth embodiment of the present invention.

An RF module (200) according to the most concrete embodiment has a balanced power amplifier provided inside one package, including first and second RF power amplifiers (PA1 and PA2) respectively configured by the RF amplifier device and operable in parallel (refer to FIG. 27).

[2] A typical embodiment according to another aspect of the present invention is an operating method of an RF power amplifier device (200) equipped with a driver stage amplifier (230), a first RF amplifier (270a), a second RF amplifier (270b), a DC voltage converter (280), and a bias circuit (266, 265).

The driver stage amplifier (230), the first RF amplifier (270a), the second RF amplifier (270b) and the DC voltage converter (280) are operable by external power supply voltages (Vcc1, Vcc2 and Vcc3) supplied from the outside of the RF power amplifier device (200).

An output signal generated from an output terminal of the driver stage amplifier (230) can be supplied to an input terminal of the first RF amplifier (270a) and an input terminal of the second RF amplifier (270b). An effective device size of the first RF amplifier (270a) is set to a device size larger than an effective device size of the second RF amplifier (270b).

The DC voltage converter (280) is capable of generating an operating power supply voltage (Vcc4) corresponding to a voltage lower than the external power supply voltage (Vcc3) by being supplied with the external power supply voltage (Vcc3). The DC voltage converter is able to supply the operating power supply voltage (Vcc4) to an output terminal of the second RF power amplifier (270b).

The external power supply voltage (Vcc2) supplied from the outside of the RF power amplifier device (200) can be supplied to an output terminal of the first RF amplifier (270a) without via the DC voltage converter (280).

The bias circuit (266, 265) is capable of generating a first bias voltage (Vg1), a second bias voltage (Vg2) and a third bias voltage (Vg3) respectively and supplying them to an input terminal of the driver stage amplifier (230), the input terminal of the first RF amplifier (270a) and the input terminal of the second RF amplifier (270b) respectively.

The bias circuit (266, 265) sets the second bias voltage (Vg2) and the third bias voltage (Vg3) to a low level and a high level respectively in response to first states (L) of external control signals supplied to external control terminals (217 and 218) of the RF power amplifier device (200) to thereby control the first RF amplifier (270a) to an inactive state and control the second RF amplifier (270b) to an active state.

The bias circuit (266, 265) sets the second bias voltage (Vg2) and the third bias voltage (Vg3) to a high level and a low level respectively in response to second states (H) of the external control signals supplied to the external control terminals (217 and 218) of the RF power amplifier device (200) to thereby control the first RF amplifier (270a) to an active state and control the second RF amplifier (270b) to an inactive state (refer to FIG. 1).

In a preferred embodiment, the DC voltage converter (280) is controlled to an inactive state in response to the second state (H) of the external control signal to stop the generation of the operating power supply voltage (Vcc4) from the external power supply voltage (Vcc3) by the DC voltage converter (280) (refer to FIG. 1).

2. Further Detailed Description of the Embodiments

Embodiments will next be in further detail. Incidentally, in all of the drawings for explaining the best modes for carrying out the invention, the same reference numerals are respectively given to components having the same function as in the drawings, and their repetitive description will be omitted.

[First Embodiment]

<<Configuration of RF Power Amplifier Device>>

In order to achieve simplicity in explaining the structure, operation and advantages of the present invention, an RF power amplifier device configured in a small-sized RF power amplifier module mounted to a portable phone terminal is taken as an example.

FIG. 1 is a diagram showing a configuration of an RF power amplifier device according to a first embodiment of the present invention. Incidentally, the RF power amplifier device shown in FIG. 1 configures a part of a transmission circuit of a portable phone terminal.

In FIG. 1, designated at reference numerals 210; 290; 230; 270a; 270b; 215a; 215b; 215c; 218; 220a; 220b; 220c; 250a, 250b and 255; 245a, 245b and 245c; 240a, 240b and 240c; 280; 285; 265; and 266 are an RF signal input terminal, an RF signal output terminal, a driver stage amplifier, a first RF power amplifier, a second RF power amplifier, a drive power supply terminal of the driver stage amplifier 230, a drive power supply terminal of the first RF power amplifier 270a, a drive power supply terminal of the second RF power amplifier 270b, a shutdown signal input terminal, an input matching circuit, an interstage matching circuit, an output matching circuit, coupling capacitors, bypass capacitors, choke inductors, a DC-DC converter, a baseband processing circuit, a bias supply circuit, and a bias current generating circuit, respectively. Reference numeral 205 indicates a semiconductor chip for a semiconductor integrated circuit, and reference numeral 200 indicates an RF power amplifier module. Reference numerals 310a and 310b indicate bias current input terminals, reference numerals 312a, 312b and 312c indicate bias signal output terminals, and reference numeral 313 indicates a first RF power amplifier/second RF power amplifier switch signal input terminal. Reference numerals 410, 412, 413, 216, and 217 indicate a power supply terminal, an output terminal, a shutdown terminal, a bias set signal input terminal, and a first RF power amplifier/second RF power amplifier switch control terminal, respectively.

The driver stage amplifier 230, the first RF power amplifier 270a and the second RF power amplifier 270b are respectively configured by an N-type LDMOS transistor having a gate electrode, a source electrode and a drain electrode. In particular, an effective device size of the first RF power amplifier 270a for the operation of high power output is set to a size extremely larger than that of the second RF power amplifier 270b for the operation of low power output. Further, an effective device size of the driver stage amplifier 230 is set to a size extremely smaller than that of the second RF power amplifier 270b.

The RF signal input terminal 210 is coupled to an input terminal of the input matching circuit 220a, and an output terminal of the input matching circuit 220a is coupled to the gate electrode of the driver stage amplifier 230. The source electrodes of the driver stage amplifier 230, the first RF power amplifier 270a and the second RF power amplifier 270b are coupled to a ground potential.

The drain electrode of the driver stage amplifier 230 is coupled to an input terminal of the interstage matching circuit 220b. An output terminal of the interstage matching circuit 220b is coupled to one electrodes of the coupling capacitors 250a and 250b. The other electrodes of the coupling capacitors 250a and 250b are respectively coupled to the gate electrodes of the first RF power amplifier 270a and the second RF power amplifier 270b.

The bias current generating circuit 266 is a three terminal circuit having, for example, at least one input terminal and two output terminals. The input terminal thereof is coupled to the bias set signal input terminal 216, and the two output terminals thereof are coupled to the two bias current input terminals 310a and 310b of the bias supply circuit 265.

The bias supply circuit 265 is a six terminal circuit having, for example, at least three inputs and three outputs. The two bias current input terminals 310a and 310b are coupled to the two output terminals of the bias current generating circuit 266. One control input terminal 313 of the bias supply circuit 265 is coupled to the first RF power amplifier/second RF power amplifier switch control terminal 217, and the three bias output terminals 312a, 312b and 312c thereof are respectively coupled to the gate electrode of the driver stage amplifier 230, the gate electrode of the first RF power amplifier 270a, and the gate electrode of the second RF power amplifier 270b. In particular, bias voltages Vg1, Vg2 and Vg3 respectively generated from the bias output terminals 312a, 312b and 312c of the bias supply circuit 265 are respectively set to a relatively large voltage level in such a manner that the driver stage amplifier 230, the first RF power amplifier 270a and the second RF power amplifier 270b are respectively capable of carrying out a linear operation.

The drive power supply terminal 215a of the driver stage amplifier 230 and the drive power supply terminal 215b of the first RF power amplifier 270a are respectively coupled to the drain electrode of the driver stage amplifier 230 and the drain electrode of the first RF power amplifier 270a via the choke inductors 240a and 240b. Further, the bypass capacitor 245a is shunt-coupled to the drive power supply terminal 215a and the choke inductor 240a of the driver stage amplifier, and the bypass capacitor 245b is shunt-coupled to the drive power supply terminal 215b and the choke inductor 240b of the first RF power amplifier. The impedances as the drive power supply terminal 215a of the driver stage amplifier and the drive power supply terminal 215b of the first RF power amplifier are seen from the driver stage amplifier 230 and the first RF power amplifier 270a are designed to be sufficiently high.

The DC-DC converter 280 is a three terminal circuit having, for example, at least one input terminal 410, one output terminal 412 and one control terminal 413. The input terminal 410 is coupled to the drive power supply terminal 215c of the second RF power amplifier. The control terminal 413 is coupled to the shutdown signal input terminal 218. The output terminal 412 is coupled to the drain electrode of the second RF power amplifier 270b via the choke inductor 240c. The bypass capacitor 245c is shunt-coupled between the output terminal 412 of the DC-DC converter 280 and the choke inductor 240c. The impedance as the DC-DC converter 280 is seen from the second RF power amplifier 270b is designed to be sufficiently high.

The shutdown signal input terminal 218 and the first RF power amplifier/second RF power amplifier switch control terminal 217 are coupled to the baseband processing circuit 285.

One electrode of the coupling capacitor 255 and the other electrode thereof are respectively coupled to the drain electrode of the first RF power amplifier 270a and the drain electrode of the second RF power amplifier 270b.

Input and output terminals of the output matching circuit 220c are respectively coupled to the drain electrode of the first RF power amplifier 270a and the RF signal output terminal 290.

The semiconductor chip 205 includes at least the driver stage amplifier 230, the first RF power amplifier 270a, the second RF power amplifier 270b, the coupling capacitors 250a and 250b, and the bias supply circuit 265. The RF power amplifier module 200 includes at least the semiconductor chip 205, the input matching circuit 220a, the output matching circuit 220c, and the DC-DC converter 280. The RF power amplifier module 200 is configured in the form of one package formed with an encapsulating resin. The semiconductor chip 205 including the driver stage amplifier 230, the first RF power amplifier 270a, the second RF power amplifier 270b, the coupling capacitors 250a and 250b and the bias supply circuit 265, and the DC-DC converter 280 are built in one package for the RF power amplifier module 200. Incidentally, the semiconductor chip 205 may also be equipped with some or all of the input matching circuit 220a, the interstage matching circuit 220b, the output matching circuit 220c and the DC-DC converter 280. The semiconductor chip 205 and another semiconductor chip that configures the DC-DC converter 280 are built in the one package for the RF power amplifier module 200. In this case, the RF power amplifier module 200 becomes a system-in-package (SIP).

Further, the RF power amplifier module 200 includes an insulating support substrate or a metal support frame for mounting the semiconductor chip 205. In particular, the RF power amplifier module 200 is equipped with a heat radiation structure for radiating heat generated from the driver stage amplifier 230, the first RF power amplifier 270a and the second RF power amplifier 270b to the outside of the RF power amplifier module 200. This heat radiation structure is made possible even by thermal vias or heat sink formed inside the insulating support substrate while being enabled even by the metal support frame.

<<Bias Supply Circuit>>

Figure 2:
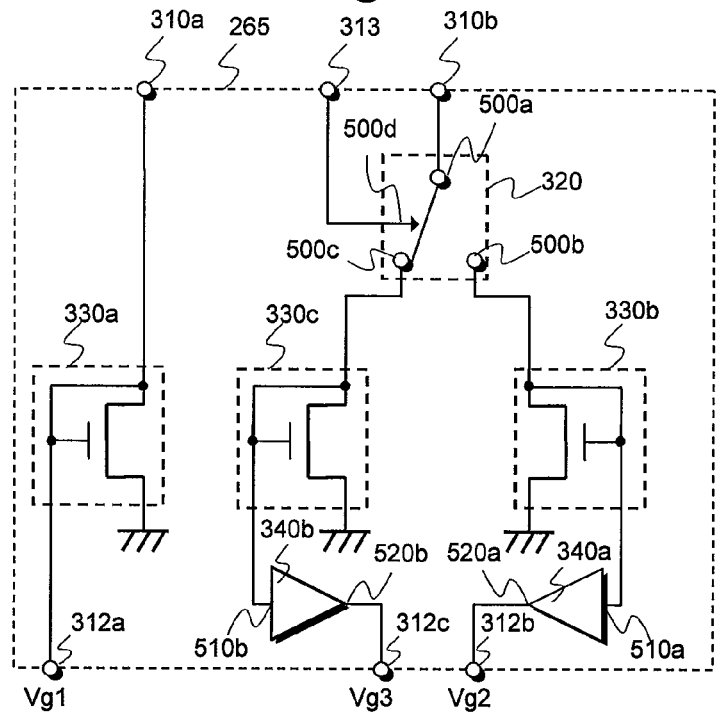
FIG. 2 is a diagram illustrating a configuration of a bias supply circuit 265 included in the RF power amplifier device shown in FIG. 1.

FIG. 2 is a diagram showing the configuration of the bias supply circuit 265 included in the RF power amplifier device according to the first embodiment of the present invention shown in FIG. 1.

In the bias supply circuit 265 shown in FIG. 2, reference numerals 310a and 310b indicate bias current input terminals, reference numerals 312a, 312b and 312c indicate bias signal output terminals, reference numeral 313 indicates a first RF power amplifier/second RF power amplifier switch signal input terminal, reference numeral 320 indicates a selector, reference numerals 330a, 330b and 330c indicate N-type LDMOS transistors, and reference numerals 340a and 340b indicate buffer amplifiers each configured as a voltage follower.

The N-type LDMOS transistors 330a, 330b and 330c are three terminal circuit devices each having at least source, drain and gate electrodes.

The commonly-coupled drain and gate electrodes of the N-type LDMOS transistor 330a are coupled to the bias current input terminal 310a and the bias signal output terminal 312a, and the source electrode of the N-type LDMOS transistor 330a is coupled to a ground potential.

The selector 320 is a circuit having four terminals of two inputs and two outputs. The control input terminal 500d is connected to the first RF power amplifier/second RF power amplifier switch signal input terminal 313. The bias current input terminal 500a is coupled to the bias current input terminal 310b. The two output terminals 500b and 500c are respectively coupled to the drain electrodes of the N-type LDMOS transistors 330b and 330c. The drain electrodes of the N-type LDMOS transistors 330b and 330c are coupled to their corresponding gate electrodes of the transistors. The source electrodes of the N-type LDMOS transistors 330b and 330c are coupled to the ground potential. Non-inversion input terminals 510a and 510b of the buffer amplifiers 340a and 340b each configured as the voltage follower are respectively coupled to the drain electrodes of the N-type LDMOS transistors 330b and 330c. Output terminals 520a and 520b of the buffer amplifiers 340a and 340b are respectively coupled to the bias signal output terminals 312b and 312c. Incidentally, although not shown in FIG. 2, the buffer amplifiers 340a and 340b function as the voltage followers by directly coupling the output terminals 520a and 520b of the buffer amplifiers 340a and 340b to their corresponding inversion input terminals.

<<DC-DC Converter>>

FIG. 3 is a diagram showing the configuration of the DC-DC converter 280 included in the RF power amplifier device according to the first embodiment of the present invention shown in FIG. 1.

In the DC-DC converter 280 shown in FIG. 3, reference numeral 410 denotes a power supply terminal, reference numeral 412 denotes an output terminal, reference numeral 413 denotes a shutdown terminal, reference numeral 420 denotes an inverter circuit, reference numeral 430a denotes a P-type MOS transistor, reference numerals 430b, 430c and 430d denote N-type LDMOS transistors, reference numerals 440a and 440b denote charge pump capacitors, reference numeral 450 denotes a switching clock generator, and reference numerals 460a, 460b and 460c denote nodes. Reference numerals 530a, 530b, 530c and 530d respectively denote a power supply terminal, a ground terminal, an input terminal, and an output terminal included in the switching clock generator 450. Reference numerals 540a, 540b, 540c and 540d respectively denote a power supply terminal, a ground terminal, an input terminal, and an output terminal included in the inverter circuit 420. The DC-DC converter 280 shown in FIG. 3 operates as a ½ step-down charge pump circuit.

The power supply terminal 410 is coupled to the power supply terminal 530a of the switching clock generator 450, the source electrode of the P-type MOS transistor 430a, and the power supply terminal 540a of the inverter circuit 420. The switching clock generator 450 is a four terminal circuit equipped with at least the power terminal 530a, the ground terminal 530b, the input terminal 530c and the output terminal 530d, in which the power supply terminal 530a is coupled to the power supply terminal 410, the ground terminal 530b is coupled to a ground potential, the input terminal 530c is coupled to the shutdown terminal 413, and the output terminal 530d is coupled to the input terminal 540c of the inverter circuit 420, the gate electrode of the P-type MOS transistor 430a and the gate electrodes of the N-type LDMOS transistors 430c and 430d.

The inverter circuit 420 is a four terminal circuit having the power supply terminal 540a, the ground terminal 540b, the input terminal 540c and the output terminal 540d, in which the power supply terminal 540a is coupled to the power supply terminal 410, the ground terminal 540b is coupled to the ground potential, the input terminal 540c is coupled to the output terminal 530d of the switching clock generator 450, and the output terminal 540d is coupled to its corresponding gate electrode of the N-type LDMOS transistor 430b.

Each of the P-type MOS transistor 430a and the N-type LDMOS transistors 430b, 430c and 430d is a three terminal circuit element having at least source, drain and gate electrodes. The drain electrode of the P-type MOS transistor 430a and the source electrode of the N-type LDMOS transistor 430c are coupled to the node 460a, the drain electrode of the N-type LDMOS transistor 430d and the drain electrode of the N-type LDMOS transistor 430b are coupled to the node 460b, the source electrode of the N-type LDMOS transistor 430c and the source electrode of the N-type LDMOS transistor 430b are coupled to the node 460c, and the source electrode of the N-type LDMOS transistor 430d is coupled to the ground potential.

One terminal of the charge pump capacitor 440a and the other terminal thereof are respectively coupled to the nodes 460a and 460b. One terminal of the charge pump capacitor 440b is coupled to the node 460c and the output terminal 412, and the other terminal of the charge pump capacitor 440b is coupled to the ground potential, respectively.

<<Operation of RF Power Amplifier Device>>

The operation of the RF power amplifier device according to the first embodiment of the present invention will next be explained with reference to FIGS. 1, 2 and 3.

In the RF power amplifier device according to the first embodiment of the present invention shown in FIG. 1, an RF signal generated from an unillustrated signal source is supplied to the gate electrode of the driver stage amplifier 230 through the RF signal input terminal 210 and the input matching circuit 220a. The input matching circuit 220a has the function of matching the output load impedance of the unillustrated signal source and the input load impedance of the driver stage amplifier 230 to each other. A bias voltage Vg1 is inputted from the bias supply circuit 265 to the gate electrode of the driver stage amplifier 230. A first power supply voltage Vcc1 is supplied from the power supply terminal 215a to the drain electrode of the driver stage amplifier 230 via the choke inductor 240a.

The RF signal supplied to the gate electrode of the driver stage amplifier 230 is amplified by the driver stage amplifier 230 and outputted from the drain electrode of the driver stage amplifier 230. The RF signal outputted from the drain electrode of the driver stage amplifier 230 is supplied to the gate electrode of the first RF power amplifier 270a and the gate electrode of the second RF power amplifier 270b via the interstage matching circuit 220b and the coupling capacitors 250a and 250b.

The bias current generating circuit 266 generates a bias current for supply to the driver stage amplifier 230, the first RF power amplifier 270a and the second RF power amplifier 270b, using a bias set signal supplied to the input terminal 216 and supplies it to the bias current input terminals 310a and 310b of the bias supply circuit 265.

The baseband processing circuit 285 generates a power level signal in which an RF output power signal to be outputted from the RF signal output terminal 290 of the RF power amplifier module 200 is indicative of either high output power or low output power and supplies it to each of the shutdown signal input terminal 218 and the first RF power amplifier/second RF power amplifier switch control terminal 217. The RF power amplifier device according to the first embodiment of the present invention carries out the operation of switching between activity and inactivity of the respective circuits of the first RF power amplifier 270a, the second RF power amplifier 270b and the DC-DC converter 280 in response to the power level signal. This operation will hereinafter be described in detail.

<<Operation for Low Power Output>>

In the case of the low power output, the baseband processing circuit 285 generates a power level signal L indicative of a low power output state and supplies it to each of the shutdown signal input terminal 218 and the first RF power amplifier/second RF power amplifier switch control terminal 217.

In response to the power level signal L, the switching clock generator 450 of the DC-DC converter 280 is brought to an active state, so that the DC-Dc converter 280 is brought to an active state. For this reason, a fourth power supply voltage Vcc4 having a voltage level equivalent to approximately ½ of a third power supply voltage Vcc3 supplied to the drive power supply terminal 215c of the second RF power amplifier 270b is supplied from the output terminal 412 to the drain electrode of the second RF power amplifier 270b via the choke inductor 240c. On the other hand, the drain electrode of the first RF power amplifier 270a is supplied with a second power supply voltage Vcc2 from the drive power supply terminal 215b of the first RF power amplifier 270a through the choke inductor 240b.

In response to the power level signal L, the selector 320 of the bias supply circuit 265 shown in FIG. 2 is brought to a state of coupling the bias current input terminal 310b and the drain electrode of the transistor 330c. Then, since no electric current flows into the drain electrode of the transistor 330b, a gate-source voltage of the transistor 330b becomes a potential sufficiently lower than a threshold voltage of the transistor 330b. As a result, a second bias voltage Vg2 supplied to the gate electrode of the first RF power amplifier 270a via the bias signal output terminal 312b also becomes a potential sufficiently lower than a threshold voltage of the transistor of the first RF power amplifier 270a. For this reason, the first RF power amplifier 270a assumes a cutoff state and thereby does not perform its amplifying operation. On the other hand, since an electric current flows from the bias current input terminal 310b to the drain electrode of the transistor 330c of the bias supply circuit 265, a third bias voltage Vg3 of the bias signal output terminal 312c also becomes a predetermined voltage, so that a predetermined bias current flows through the second RF power amplifier 270b, where its amplifying operation is conducted. The RF signal amplified by the second RF power amplifier 270b is generated from the drain electrode of the second RF power amplifier 270b.

Incidentally, the buffer amplifiers 340a and 340b respectively have the function of making sufficiently high the impedances of the bias signal output terminals 312b and 312c as viewed from the transistors 330b and 330c. For this reason, they do not affect the second bias voltage Vg2 and the third bias voltage Vg3 or the values of the bias currents flowing through the first RF power amplifier 270a and the second RF power amplifier 270b.

<<Operation for High Power Output>>

In the case of the high power output, the baseband processing circuit 285 generates a power level signal H indicative of a high power output state and supplies it to each of the shutdown signal input terminal 218 and the first RF power amplifier/second RF power amplifier switch control terminal 217.

In response to the power level signal H, the switching clock generator 450 of the DC-DC converter 280 is brought to an inactive state, so that the DC-Dc converter 280 is brought to an inactive state. For this reason, no fourth power supply voltage Vcc4 is outputted from the output terminal 412 and not supplied even to the drain electrode of the second RF power amplifier 270b. On the other hand, the drain electrode of the first RF power amplifier 270a is directly supplied with a second power supply voltage Vcc2 from the drive power supply terminal 215b of the first RF power amplifier 270a through the choke inductor 240b.

In response to the power level signal H, the selector 320 of the bias supply circuit 265 shown in FIG. 2 is brought to a state of coupling the bias current input terminal 310b and the drain electrode of the transistor 330b. Then, since no electric current flows into the drain electrode of the transistor 330c, a gate-source voltage of the transistor 330c becomes a potential sufficiently lower than a threshold voltage of the transistor 330c. As a result, a third bias voltage Vg3 supplied to the gate electrode of the second RF power amplifier 270b via the bias signal output terminal 312c also becomes a potential sufficiently lower than a threshold voltage of the transistor of the second RF power amplifier 270b. For this reason, the second RF power amplifier 270b assumes a cutoff state and thereby does not carry out its amplifying operation. On the other hand, since an electric current flows from the bias current input terminal 310b to the drain electrode of the transistor 330b of the bias supply circuit 265, a second bias voltage Vg2 of the bias signal output terminal 312b becomes a predetermined potential, so that a predetermined bias current flows through the first RF power amplifier 270a, where its amplifying operation is carried out. The RF signal amplified by the first RF power amplifier 270a is generated from the drain electrode of the first RF power amplifier 270a.

As a result of the above control, the first RF power amplifier 270a is operated to enable the output of high power at the high power output, whereas at the low power output, in order to reduce current consumption of the RF power amplifier device, the first RF power amplifier 270a is stopped and the second RF power amplifier 270b and the DC-DC converter 280 for supplying the power supply voltage and operating current to the second RF power amplifier 270b are operated. Incidentally, as another embodiment, the maximum output power of the RF power amplifier device can also be further increased by operating the DC-DC converter 280 and the second RF power amplifier 270b as well as the operation of the first RF power amplifier 270a at the high power output.

In the RF power amplifier device according to the first embodiment of the present invention described with reference to FIGS. 1, 2 and 3, the RF output signal generated from the drain electrode of the first RF power amplifier 270a is outputted to the RF signal output terminal 290 via the output matching circuit 220c. The RF output signal generated from the drain electrode of the second RF power amplifier 270b is outputted to the RF signal output terminal 290 via the coupling capacitor 255 and the output matching circuit 220c. That is, the RF power amplifier device achieves the operations of amplifying the RF signal inputted to the RF signal input terminal 210 by the driver stage amplifier 230 and the first RF power amplifier 270a and outputting it to the RF signal output terminal 290 at the high power output, and in contrast, at the low power output, supplying the fourth power supply voltage Vcc4 to the second RF power amplifier 270b by the DC-DC converter 280, amplifying the RF signal inputted to the RF signal input terminal 210 by the driver stage amplifier 230 and the second RF power amplifier 270b and outputting it to the RF signal output terminal 290.

<<Effect of Reducing Current Consumption>>

The effect of reducing average current consumption of the RF power amplifier device according to the first embodiment of the present invention described with reference to FIGS. 1, 2 and 3 will hereinafter be described in detail.

The effect of reducing current consumption of the second RF power amplifier 270b by the DC-DC converter 280 will first be described in detail using the following equation (1).

In the following equation (1), Idd indicates a drain current that is supplied to the drain electrode of the second RF power amplifier 270b by the DC-DC converter 280, and Ibat indicates current consumption of the second RF power amplifier 270b, i.e., an electric current that is supplied from the drive power supply terminal 215c of the second RF power amplifier 270b to the DC-DC converter 280.

$V_{DCDC}$ indicates an output voltage at the output terminal 412 of the DC-DC converter 280, Vbat indicates an input voltage at the input terminal 410 of the DC-DC converter 280, $V_{DcDc}$/Vbat indicates the effect of reducing current consumption due to a drop in power supply voltage. In the first embodiment of the present invention using the DC-DC converter 280 operated as a ½ step-down charge pump circuit, the value of $V_{DCDC}$/Vbat is ½. Further, $Eff_{DcDc}$ indicates power efficiency of the DC-DC converter 280 and generally ranges from about 80% to about 90% at the output of 70 to 100 mA.

Thus, according to the following equation (1), the DC-DC converter 280 operated as the ½ step-down charge pump circuit used in the first embodiment of the present invention enables the current consumption of the second RF power amplifier 270b operated at the low power output to be reduced about 40% comparing to the case where the DC-DC converter 280 is not used.

$$I_{bat} = I_{dd} \times \frac{V_{DCDC}}{V_{bat}} \times \frac{100}{Eff_{DCDC}} \qquad \text{Equation 1}$$

The effect of reducing current consumption of the RF power amplifier device according to the first embodiment of the present invention will next be explained.

Figure 9:
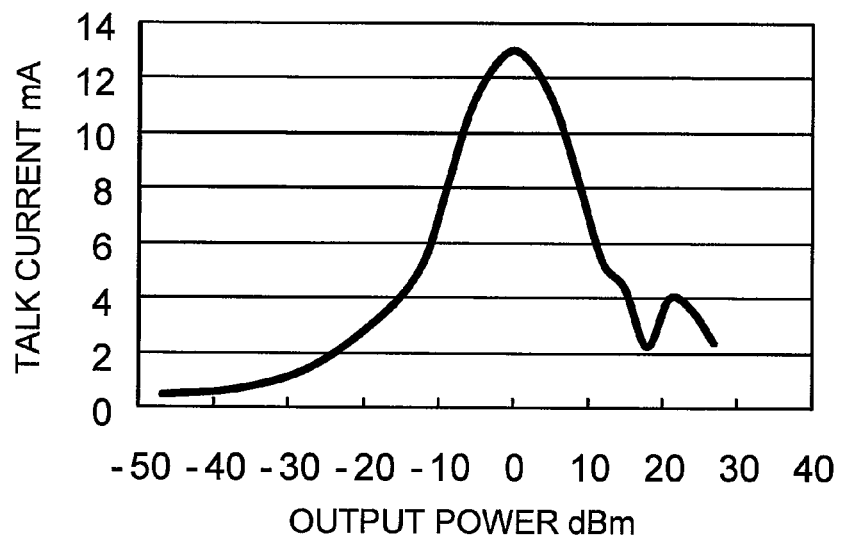
FIG. 9 is a diagram showing a characteristic generally called talk current, in which the characteristic of FIG. 5 at the RF power amplifier of FIG. 4 and the characteristic of FIG. 8 thereat are multiplied by each other.
Figure 10:
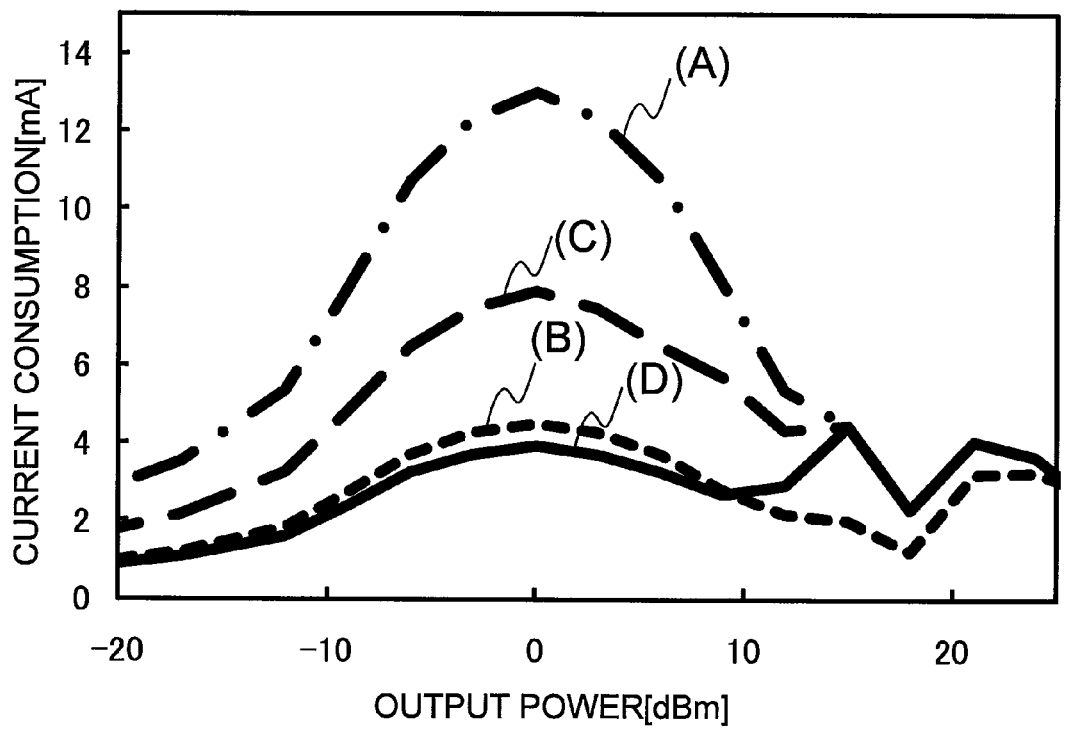
FIG. 10 is a diagram illustrating current consumption of the RF power amplifier shown in FIG. 4, current consumption of the RF power amplifier device according to the first embodiment of the present invention explained with reference to FIGS. 1, 2 and 3, current consumption of the RF power amplifier described in the patent document 1, and current consumption of the RF power amplifier described in the patent document 2.

FIG. 10 is a diagram showing current consumption of the RF power amplifier discussed by the present inventors prior to the present invention shown in FIG. 4, current consumption of the RF power amplifier device according to the first embodiment of the present invention explained with reference to FIGS. 1, 2 and 3, current consumption of the RF power amplifier described in the patent document 1, and current consumption of the RF power amplifier described in the patent document 2. Incidentally, the characteristics shown in FIG. 10 are current consumption characteristics each called talk current explained in FIG. 9.

Figure 4:
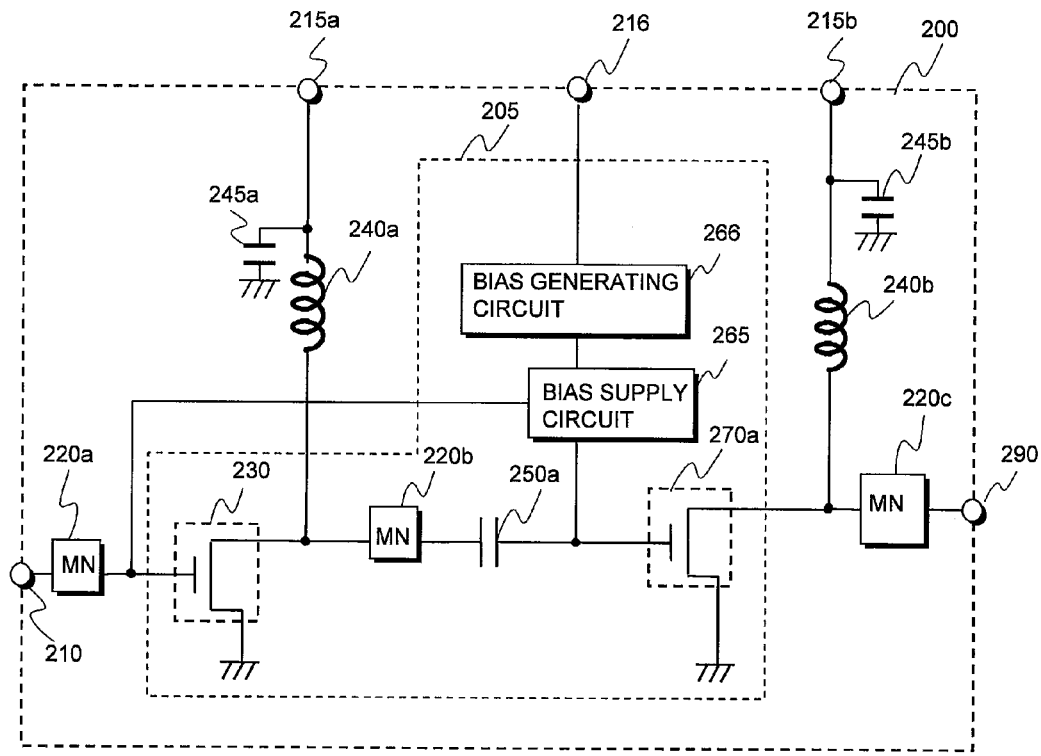
FIG. 4 is a diagram showing a configuration of an RF power amplifier discussed by the present inventors prior to the present invention.
Figure 5:
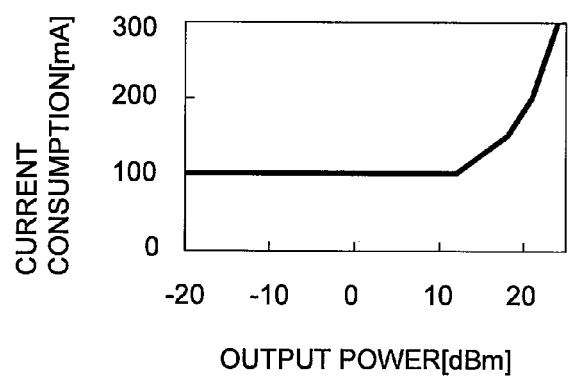
FIG. 5 is a diagram illustrating the relationship between output power of the RF power amplifier shown in FIG. 4 and current consumption of a first RF power amplifier 270a thereof.
Figure 6:
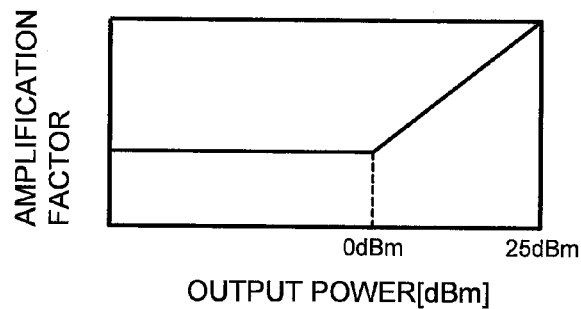
FIG. 6 is a diagram showing the manner in which a predetermined amplification factor of the first RF power amplifier 270a is ensured by allowing a substantially constant dc current to flow through a drain electrode of the first RF power amplifier 270a without reference to a reduction in output power when low power is outputted from the RF power amplifier of FIG. 4.
Figure 7:
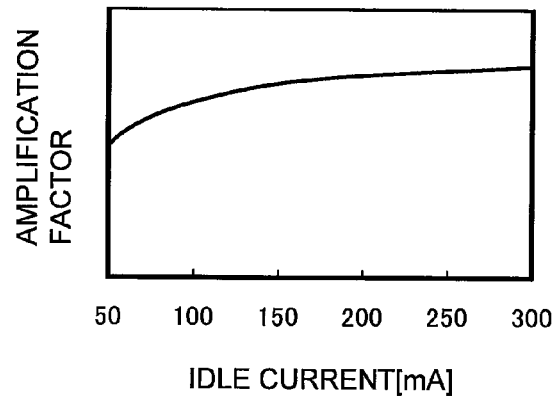
Figure 8:
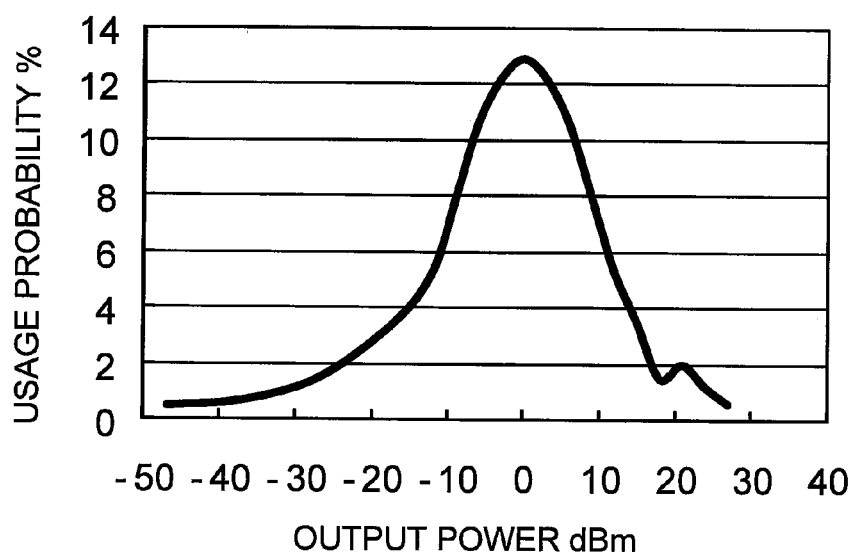
FIG. 8 is a diagram depicting a usage probability distribution of output power under an actual use environment of a portable phone terminal, which uses the RF power amplifier of FIG. 4.

The characteristic (A) indicates the current consumption of the RF power amplifier shown in FIG. 4, the characteristic (B) indicates the current consumption of the RF power amplifier described in the patent document 1, the characteristic (C) indicates the current consumption of the RF power amplifier described in the patent document 2, and the characteristic (D) indicates the current consumption of the RF power amplifier device according to the first embodiment of the present invention described with reference to FIGS. 1, 2 and 3. Incidentally, the characteristic (D) of FIG. 10 indicates a result of simulation performed assuming that the first RF power amplifier 270a is operated when RF transmission output power Pout is greater than or equal to 12 dBm and the second RF power amplifier 270b is operated when the RF transmission output power Pout is less than or equal to 12 dBm. It is understood from FIG. 10 that the effect of reducing the current consumption is most satisfactory in the RF power amplifier device according to the first embodiment of the present invention described with reference to FIGS. 1, 2 and 3.

Figure 11:
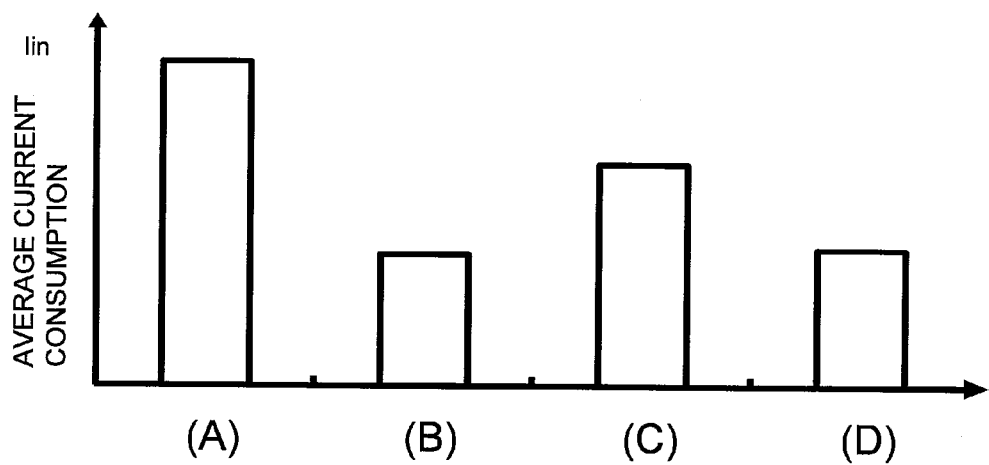
FIG. 11 is a diagram showing average current consumption of the RF power amplifier shown in FIG. 4, average current consumption of the RF power amplifier device according to the first embodiment of the present invention explained with reference to FIGS. 1, 2 and 3, average current consumption of the RF power amplifier described in the patent document 1, and average current consumption of the RF power amplifier described in the patent document 2.

FIG. 11 is a diagram showing average current consumption of the RF power amplifier discussed by the present inventors prior to the present invention shown in FIG. 4, average current consumption of the RF power amplifier device according to the first embodiment of the present invention explained with reference to FIGS. 1, 2 and 3, average current consumption of the RF power amplifier described in the patent document 1, and average current consumption of the RF power amplifier described in the patent document 2. Incidentally, the characteristics shown in FIG. 11 are characteristics calculated by integrating or adding up the talk currents with respect to output power. Even in the case of FIG. 11, the characteristic (A) indicates the average current consumption of the RF power amplifier shown in FIG. 4, the characteristic (B) indicates the average current consumption of the RF power amplifier described in the patent document 1, the characteristic (C) indicates the average current consumption of the RF power amplifier described in the patent document 2, and the characteristic (D) indicates the average current consumption of the RF power amplifier device according to the first embodiment of the present invention explained with reference to FIGS. 1, 2 and 3. It is understood even from FIG. 11 that the effect of reducing the average current consumption is most satisfactory in the RF power amplifier device according to the first embodiment of the present invention described with reference to FIGS. 1, 2 and 3.

The RF power amplifier device according to the first embodiment of the present invention described with reference to FIGS. 1, 2 and 3 can be reduced in average current consumption by about 50% as compared with the RF power amplifier shown in FIG. 4 and about 30% as compared with the RF power amplifier described in the patent document 2 respectively, and is capable of obtaining a large current consumption reducing effect similar to the RF power amplifier of the patent document 1. Incidentally, the RF power amplifier device according to the first embodiment of the present invention explained with reference to FIGS. 1, 2 and 3 is able to obtain a similar advantageous effect even if the signals supplied to the first RF power amplifier/second RF power amplifier switch control terminal 217 and the shutdown signal input terminal 218 are supplied from circuits other than the baseband processing circuit 285.

<<Reducing Effect of Mounting Area>>

The effect of reducing the mounting area of the RF power amplifier device according to the first embodiment of the present invention will next be explained.

Figure 12:
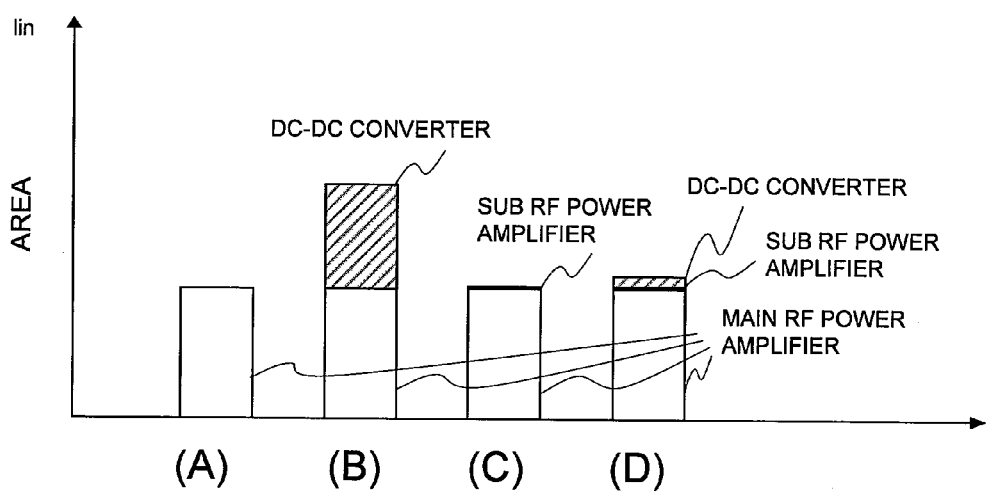
FIG. 12 is a diagram illustrating a mounting area of the RF power amplifier shown in FIG. 4, a mounting area of the RF power amplifier device according to the first embodiment of the present invention explained with reference to FIGS. 1, 2 and 3, a mounting area of the RF power amplifier described in the patent document 1, and a mounting area of the RF power amplifier described in the patent document 2.

FIG. 12 is a diagram showing the mounting area of the RF power amplifier discussed by the present inventors prior to the present invention shown in FIG. 4, the mounting area of the RF power amplifier device according to the first embodiment of the present invention explained with reference to FIGS. 1, 2 and 3, the mounting area of the RF power amplifier described in the patent document 1, and the mounting area of the RF power amplifier described in the patent document 2. In FIG. 12, a histogram (A) indicates the mounting area of the RF power amplifier of FIG. 4, a histogram (B) indicates the mounting area of the RF power amplifier described in the patent document 1, a histogram (C) indicates the mounting area of the RF power amplifier described in the patent document 2, and a histogram (D) indicates the mounting area of the RF power amplifier device according to the first embodiment of the present invention described referring to FIGS. 1, 2 and 3.

In the configuration of the RF power amplifier described in the patent document 1, a DC-DC converter capable of supplying, for example, a large current of 1 A or the like is required to supply power to the RF power amplifier at the maximum output. Thus, as the mounting area of the DC-DC converter capable of supplying the large current, a mounting area of approximately 40 mm² is generally required when the areas required for a semiconductor chip having a mounting area of about 5 mm² or so, an inductor part requiring a mounting area of about 20 mm² or so, a capacitor part requiring a mounting area of about 2 mm² or so, and wirings that couple these semiconductor chip, inductor part and capacitor part over a circuit board are taken into consideration.

When this DC-DC converter is added to an RF power amplifier having a mounting area of approximately 50 mm², for example, the area of the entire RF power amplifier is increased about 80% by the DC-DC converter. Building the DC-DC converter having this configuration in an RF power amplifier module becomes therefore extremely difficult depending on its size.

In the RF power amplifier device according to the first embodiment of the present invention described with reference to FIGS. 1, 2 and 3, the DC-DC converter 280 used for the supply of the power supply voltage and operating current to the second RF power amplifier 270b can be configured by a ½ step-down charge pump circuit capable of supplying a relatively small current of 200 mA or so, for example. For this reason, its miniaturization becomes easy. The mounting area of the ½ step-down charge pump circuit is generally very small as in the case of approximately 4 mm² or so where the areas necessary for a semiconductor chip having a chip area of 1 mm² or so, a charge pump capacitor of 1.5 mm² or so, and wirings for coupling these semiconductor chip and capacitor over a circuit board are taken into consideration. That is, an increase in the mounting area of the entire RF power amplifier device due to the DC-DC converter 280 reaches 10% or less. It is thus sufficiently possible to build this small-sized DC-DC converter into the RF power amplifier module.

As apparent from the above description, the RF power amplifier device according to the first embodiment of the present invention described with reference to FIGS. 1, 2 and 3 enables a substantial reduction in mounting area although being approximately equivalent in average current consumption to the RF power amplifier described in the patent document 1 when compared therewith. The RF power amplifier device according to the first embodiment of the present invention is capable of greatly reducing the average current consumption while suppressing the mounting area to approximately equality as compared with the RF power amplifier described in the patent document 2.

That is, according to the RF power amplifier device of the first embodiment of the present invention, the average current consumption of the RF power amplifier device can be reduced using the DC-DC converter and on the other hand, a substantial reduction in the mounting area of the DC-DC converter is enabled. The DC-DC converter used in the RF power amplifier described in the patent document 1 makes use of an expensive inductor, but according to the configuration of the first embodiment of the present invention, the DC-DC converter 280 is of the ½ step-down charge pump circuit that eliminates the need for the inductor. It is therefore possible to reduce the cost of the entire RF power amplifier device.

[Second Embodiment]

<<Configuration of DC-DC Converter>>

FIG. 13 is a diagram showing a configuration of a DC-DC converter 280 mounted in an RF power amplifier device according to a second embodiment of the present invention. That is, the RF power amplifier device according to the second embodiment of the present invention is also exactly the same configuration as that of the RF power amplifier device according to the first embodiment of the present invention shown in FIG. 1.

The DC-DC converter 280 mounted in the RF power amplifier device according to the second embodiment of the present invention is a DC-DC converter configured by a step-down switching regulator (buck converter) using an inductor 472 as shown in FIG. 13, which is other than the DC-DC converter configured by the ½ step-down charge pump circuit shown in FIG. 3.

In the DC-DC converter 280 configured by the buck converter shown in FIG. 13, reference numeral 410 denotes a power supply terminal, reference numeral 412 denotes an output terminal, reference numeral 413 denotes a shutdown terminal, reference numeral 414 denotes a DC-DC converter output voltage set terminal, reference numeral 470 denotes a control circuit, reference numeral 471a denotes a P-type MOS transistor, reference numeral 471b denotes an N-type LDMOS transistor, reference numeral 472 denotes an inductor, reference numeral 475 denotes a comparator circuit, reference numeral 474 denotes an output voltage smoothing capacitor, and reference numeral 473 denotes a node. In the control circuit 470, reference numeral 550a denotes a power supply terminal, reference numeral 550b denotes a ground terminal, reference numerals 550c and 550d denote input terminals, and reference numerals 550e and 550f denote output terminals. In the comparator circuit 475, reference numeral 560a indicates a power supply terminal, reference numeral 560b indicates a ground terminal, reference numeral 560c indicates an inversion input terminal, reference numeral 560d indicates a non-inversion input terminal, and reference numeral 560e indicates an output terminal.

The structure of the RF power amplifier device of the present invention will first be explained with reference to FIG. 13.

The power supply terminal 410 is coupled to the power supply terminal 550a of the control circuit 470, the source electrode of the P-type MOS transistor 471a, the power supply terminal 560a of the comparator circuit 475, and the drive power supply terminal 215c of the second RF power amplifier 270b shown in FIG. 1. The control circuit 470 is a six terminal circuit equipped with at least one power supply terminal 550a, one ground terminal 550b, two output terminals 550e and 550f, and two input terminals 550c and 550d, in which the power supply terminal 550a is coupled to the power supply terminal 410, the ground terminal 550b is coupled to a ground potential, one input terminal 550c is coupled to the shutdown terminal 413, the other input terminal 550d is coupled to the output terminal of the comparator circuit 475, and the two output terminals 550e and 550f are coupled to the gate electrode of the P-type MOS transistor 471a and the gate electrode of the N-type LDMOS transistor 471b, respectively.

The comparator circuit 475 is a five terminal circuit equipped with a power supply terminal 560a, a ground terminal 560b, two input terminals 560c and 560d and an output terminal 560e. The power supply terminal 560a is coupled to the power supply terminal 410, the ground terminal 560b is coupled to the ground potential, one input terminal 560c is coupled to the node 473, the other input terminal 560d is coupled to the DC-DC converter output voltage set terminal 414, and the output terminal 560e is coupled to the input terminal 550d of the control circuit 470. The drain electrode of the P-type MOS transistor 471a is coupled to its corresponding drain electrode of the N-type LDMOS transistor 471b and coupled to the node 473 via the inductor 472. The source electrode of the N-type LDMOS transistor 471b is coupled to the ground potential. The DC-DC converter output voltage set terminal 414 is coupled to the baseband processing circuit 285 shown in FIG. 1. One terminal of the smoothing capacitor 474 is coupled to the node 473 and the output terminal 412, and the other terminal thereof is coupled to the ground potential. The RF power amplifier device according to the second embodiment of the present invention equipped with the DC-DC converter 280 shown in FIG. 13 is basically identical in other configuration to the RF power amplifier device according to the first embodiment of the present invention explained with reference to FIGS. 1, 2 and 3.

<<Operation of RF Power Amplifier Device with DC-DC Converter Built Therein>>

The operation of the RF power amplifier device that builds therein the DC-DC converter 280 in the second embodiment of the present invention will next be explained with reference to FIG. 13.

Firstly, when the RF power amplifier device according to the second embodiment of the present invention is at the high power output as with the RF power amplifier device according to the first embodiment of the present invention explained with reference to FIGS. 1, 2 and 3, a power level signal H indicative of being its high power output state is supplied from the baseband processing circuit 285 to the shutdown control terminal 413 to bring the control circuit 470 to an inactive state and thereby bring the DC-DC converter 280 to an inactive state, so that no fourth power supply voltage Vcc4 is generated from the output terminal 412. On the other hand, when the RF power amplifier device is at the low power output, a power level signal L indicative of being its low power output state is supplied from the baseband processing circuit 285 to the shutdown control terminal 413 to bring the control circuit 470 to an active state and thereby bring the DC-DC converter 280 to an active state, so that the fourth power supply voltage Vcc4 is generated from the output terminal 412.

The operation of the RF power amplifier device according to the second embodiment of the present invention at the low power output will be further explained in detail.

That is, the DC-DC converter 280 built in the RF power amplifier device according to the second embodiment of the present invention is a buck converter (step-down switching regulator) whose output voltage is variable. Thus, the baseband processing circuit 285 is capable of controlling the output voltage of the DC-DC converter 280 to a voltage level corresponding to transmission output power of the RF power amplifier device. For example, the baseband processing circuit 285 calculates the voltage level of the power supply voltage Vcc4 to be supplied to the drain electrode of the second RF power amplifier 270b to bring current consumption to the minimum value while linearity is being maintained by the second RF power amplifier 270b. Then, the baseband processing circuit 285 generates an output voltage set signal for setting the fourth power supply voltage Vcc4 generated from the output terminal 412 of the DC-DC converter 280 to the calculated voltage level and supplies it to the DC-DC converter output voltage set terminal 414 of the DC-DC converter 280.

In response to the output voltage set signal supplied to the DC-DC converter output voltage set terminal 414, the DC-DC converter 280 controls the voltage level of the fourth power supply voltage Vcc4 generated from the output terminal 412 and supplied to the drain electrode of the second RF power amplifier 270b so as to be set to such a voltage level that current consumption reaches the minimum value, while linearity is being maintained by the second RF power amplifier 270b.

The operation of the DC-DC converter 280 according to the second embodiment of the present invention where it is in the active state will next be explained.

The output voltage set signal supplied to the DC-DC converter output voltage set terminal 414 is supplied to the non-inversion input terminal 560d of the comparator circuit 475, where the potential of the node 473 and the potential of the DC-DC converter output voltage set terminal 414 are compared with each other.

When the node 473 is at a potential higher than that at the DC-DC converter output voltage set terminal 414, the comparator circuit 475 supplies a signal for lowering the potential of the node 473 to the control circuit 470. The control circuit 470 controls an on period of the P-type MOS transistor 471a to be short and on the other hand, controls an on period of the N-type LDMOS transistor 471b to be long. As a result, the potential of the node 473 is lowered to coincide with the voltage level of the DC-DC converter output voltage set terminal 414. That is, the potential of the node 473 is gradually lowered so as to coincide with the voltage level of the DC-DC converter output voltage set terminal 414 in accordance with a time constant determined by the inductor 472 and the output voltage smoothing capacitor.

When the node 473 is at a potential lower than that of the DC-DC converter output voltage set terminal 414, the comparator circuit 475 supplies a signal for allowing the potential of the node 473 to rise to the control circuit 470. The control circuit 470 controls an on period of the P-type MOS transistor 471a to be long and on the other hand, controls an on period of the N-type LDMOS transistor 471b to be short. As a result, the potential of the node 473 rises to coincide with the voltage level of the DC-DC converter output voltage set terminal 414. That is, the potential of the node 473 gradually rises so as to coincide with the voltage level of the DC-DC converter output voltage set terminal 414 in accordance with a time constant determined by the inductor 472 and the output voltage smoothing capacitor.

By executing the above operations, the DC-DC converter 280 according to the second embodiment of the present invention generates an approximately constant output voltage designated by the output voltage set signal supplied to the DC-DC converter output voltage set terminal 414 from the output terminal 412 as the power supply voltage Vcc4.

The RF power amplifier device according to the second embodiment of the present invention equipped with the DC- DC converter 280 shown in FIG. 13 is basically similar in other operations to the RF power amplifier device according to the first embodiment of the present invention explained with reference to FIGS. 1, 2 and 3.

Due to the reasons to be described below, the effect of reducing current consumption of the RF power amplifier device according to the second embodiment of the present invention becomes more satisfactory than the effect of reducing current consumption of the RF power amplifier device according to the first embodiment of the present invention.

That is, in the above equation (1) indicative of the current consumption reducing effect by the DC-DC converter, the value of $V_{DCDC}$/Vbat indicative of the effect of reducing current consumption due to the drop in the power supply voltage was ½ in the first embodiment of the present invention referred to above. On the other hand, however, since the output voltage $V_{DCDC}$ of the DC-DC converter 280 is variable in the second embodiment of the present invention, the value thereof can be brought to ¼, for example. Power efficiency $Eff_{DCDC}$ of the DC-DC converter 280 of the second embodiment of the present invention is a sufficiently high value as with the DC-DC converter 280 of the first embodiment of the present invention. As a result, according to the RF power amplifier device according to the second embodiment of the present invention, the current consumption at the low power output can be reduced to half as compared with the first embodiment of the present invention.

Assume where in the RF power amplifier device according to the first embodiment of the present invention, the third power supply voltage Vcc3 supplied to the drive power supply terminal 215c of the second RF power amplifier 270b is supplied from, for example, a secondary battery such as a lithium ion battery. In this case, the third power supply voltage Vcc3 is 4.2V or so when the remaining capacity of the lithium ion battery is nearly full, but is lowered to 2.9V or so when the remaining capacity of the lithium ion battery is gradually reduced with the progress of its discharge and approaches empty. Since the DC-DC converter 280 is of the ½ step-down charge pump circuit in the RF power amplifier device according to the first embodiment of the present invention, the fourth power supply voltage Vcc4 from this circuit to the drain electrode of the second RF power amplifier 270b fluctuates between approximately 2.1V and 1.45V. For this reason, the amplification factor of the second RF power amplifier 270b varies greatly. According to the second embodiment of the present invention, since the DC-DC converter 280 is of the buck converter whose output voltage is variable, the fourth power supply voltage Vcc4 supplied to the second RF power amplifier 270b can be stabilized to a predetermined voltage of 2.1V, for example, thus making it possible to suppress the variation in the amplification factor of the second RF power amplifier 270b.

Incidentally, the second embodiment of the present invention is capable of obtaining an advantageous effect similar to the above even if the output voltage set signal is supplied from the circuit other than the baseband processing circuit 285 to the DC-DC converter output voltage set terminal 414 of the DC-DC converter 280. Although the control system of the DC-DC converter 280 shown in FIG. 13 is a control system called "a hysteresis control system" that generates a constant fourth power supply voltage Vcc4 using a comparator 475 called "a hysteresis comparator", a buck converter of another system is also capable of obtaining a current consumption reducing effect similar to the second embodiment of the present invention.

[Third Embodiment]

<<Configuration of RF Power Amplifier Device According to the Third Embodiment of the Present Invention>>

Figure 14:
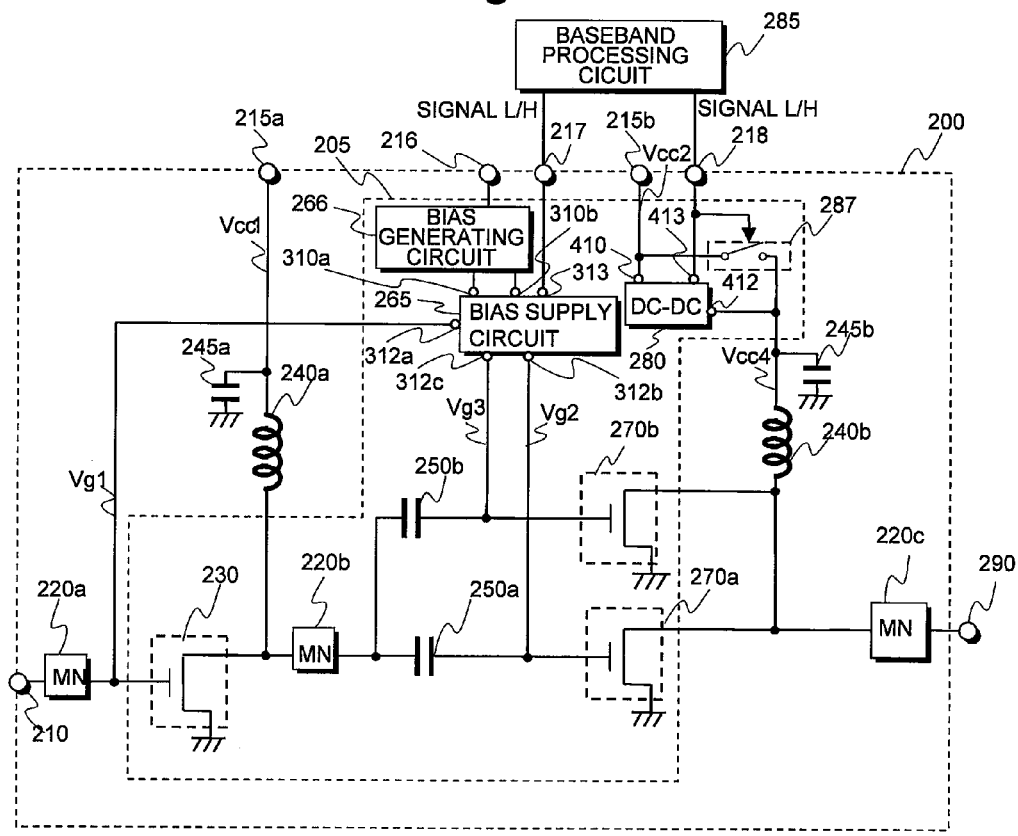
FIG. 14 is a diagram illustrating a configuration of an RF power amplifier device according to a third embodiment of the present invention.

FIG. 14 is a diagram showing the configuration of the RF power amplifier device according to the third embodiment of the present invention.

The RF power amplifier device according to the third embodiment of the present invention shown in FIG. 14 differs from the RF power amplifier device according to the first embodiment of the present invention explained with reference to FIGS. 1, 2 and 3 in that a bypass path of a through switch 287 is coupled between the input terminal 410 of the DC-DC converter 280 and its output terminal 412, and the bypass path of the through switch 287 is on/off-controlled by a control signal supplied to the shutdown signal input terminal 218 and that the coupling capacitor 255, bypass capacitor 245c, choke inductor 240c and drive power terminal 215c of second RF power amplifier 270b included in the RF power amplifier device according to the first embodiment of the present invention are omitted. The RF power amplifier device according to the third embodiment of the present invention is identical in other points to the RF power amplifier device according to the first embodiment of the present invention.

That is, the through switch 287 is a three terminal circuit equipped with an input terminal, an output terminal and a control terminal, in which the input terminal is coupled to the drive power supply terminal 215b of the first RF power amplifier and the input terminal 410 of the DC-DC converter 280, the control terminal is coupled to the shutdown signal input terminal 218, and the output terminal is coupled to the output terminal 412 of the DC-DC converter 280. Further, the drain electrode of the first RF power amplifier 270a and the drain electrode of the second RF power amplifier 270b are coupled to the output terminal of the through switch 287 and the output terminal 412 of the DC-DC converter 280 via the common choke inductor 240b.

<<Operation of RF Power Amplifier Device According to the Third Embodiment of the Present Invention>>

The operation of the RF power amplifier device according to the third embodiment of the present invention shown in FIG. 14 will next be explained below.

In the case of high power output, a power level signal H indicative of a high power output state, which is generated from the baseband processing circuit 285, is supplied to the shutdown terminal 413 of the DC-DC converter 280 via the shutdown signal input terminal 218. In response to the power level signal H, the switching clock generator 450 of the DC-DC converter 280 shown in FIG. 3 becomes an inactive state, so that the DC-DC converter 280 is brought to an inactive state. Further, since the through switch 287 is brought to an on state in response to the power level signal H, a second power supply voltage Vcc2 applied to the drive power supply terminal 215b of the first RF power amplifier 270a is supplied to the drain electrode of the first RF power amplifier 270a and the drain electrode of the second RF power amplifier 270b via the through switch 287 brought to the on state and the choke inductor 240b.

In the case of low power output, a power level signal L indicative of a low power output state, which is generated from the baseband processing circuit 285, is supplied to the shutdown terminal 413 of the DC-DC converter 280 via the shutdown signal input terminal 218. In response to the power level signal L, the switching clock generator 450 of the DC-DC converter 280 shown in FIG. 3 becomes an active state, so that the DC-DC converter 280 is brought to an active state. Further, since the through switch 287 is brought to an off state in response to the power level signal L, a fourth power supply voltage Vcc4 is supplied from the output terminal 412 of the DC-DC converter 280 to the drain electrodes of the second RF power amplifier 270b and the first RF power amplifier 270a through the choke inductor 240b.

Since the RF power amplifier device according to the third embodiment of the present invention shown in FIG. 14 is exactly identical in other operation to the RF power amplifier device according to the first embodiment of the present invention described with reference to FIGS. 1, 2 and 3, the description thereof is omitted.

<<Reducing Effect of Mounting Area>>

The effect of reducing a mounting area of the RF power amplifier device according to the third embodiment of the present invention shown in FIG. 14 will next be explained.

That is, the coupling capacitor 255, the bypass capacitor 245c, the choke inductor 240c and the drive power supply terminal 215c of the second RF power amplifier are omitted in the RF power amplifier module 200 according to the third embodiment of the present invention shown in FIG. 14 as compared with the RF power amplifier device according to the first embodiment of the present invention. It is therefore possible to miniaturize the RF power amplifier module 200. When, for example, such a chip inductor that the mounting area of the choke inductor 240c is about 0.5 mm$^2$ and such chip capacitors that the mounting areas of the coupling capacitor 255 and the bypass capacitor 245c are about 0.2 mm$^2$ respectively, are taken in the first embodiment of the present invention, the above three elements take up an area of 1.5 mm$^2$ or so where wiring areas are taken into consideration. In the RF power amplifier module 200 according to the third embodiment of the present invention shown in FIG. 14, which has omitted the above three elements, about 1.5 mm$^2$ reduction in mounting area is enabled as compared with the first embodiment of the present invention.

[Fourth Embodiment]

<<Configuration of RF Power Amplifier Device According to the Fourth Embodiment of the Present Invention>>

FIG. 15 is a diagram showing the configuration of the RF power amplifier device according to the fourth embodiment of the present invention.

The RF power amplifier device according to the fourth embodiment of the present invention shown in FIG. 15 is different from the RF power amplifier device according to the first embodiment of the present invention explained with reference to FIGS. 1, 2 and 3 in that a series regulator circuit 281 is coupled between the output terminal 412 of the DC-DC converter 280 and the choke inductor 240c. The RF power amplifier device shown in FIG. 15 is basically identical in other points to the RF power amplifier device according to the first embodiment.

Figure 16:
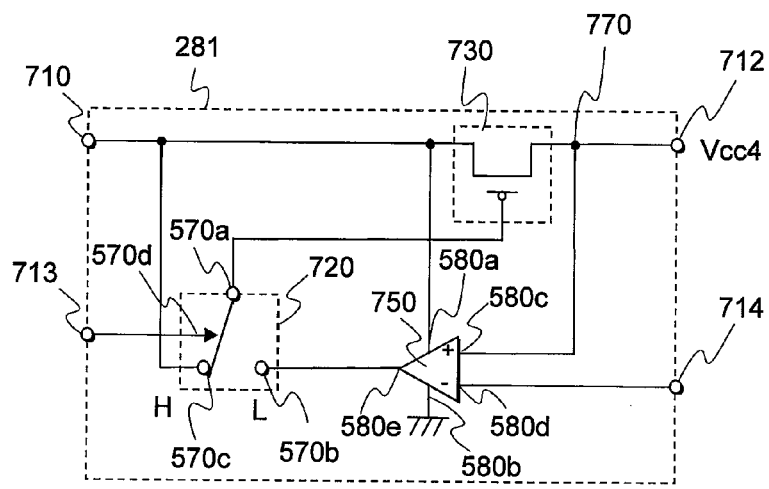
FIG. 16 is a diagram depicting a configuration of a series regulator circuit 281 included in the RF power amplifier device shown in FIG. 15.

FIG. 16 is a diagram showing a configuration of the series regulator circuit 281 included in the RF power amplifier device according to the fourth embodiment of the present invention shown in FIG. 15.

That is, in FIG. 16, reference numeral 710 denotes a power input terminal, reference numeral 712 denotes a power supply output terminal, reference numeral 713 denotes a shutdown terminal, reference numeral 714 denotes an output voltage set terminal, reference numeral 720 denotes a changeover switch, reference numeral 730 denotes a P-type MOS transistor, reference numeral 750 denotes an error amplifier, and reference numeral 770 denotes a node. In the changeover switch 720, reference numeral 570a denotes an output terminal, reference numerals 570b and 570c denote input terminals, and reference numeral 570d denotes a control terminal. In the error amplifier 750, reference numeral 580a denotes a power supply terminal, reference numeral 580b denotes a ground terminal, reference numeral 580c denotes a non-inversion input terminal, reference numeral 580d denotes an inversion input terminal, and reference numeral 580e denotes an output terminal.

The configuration of the RF power amplifier device according to the fourth embodiment of the present invention will next be described in further detail with reference to FIGS. 15 and 16.

In FIG. 15, the input terminal 410 of the DC-DC converter 280 is coupled to its corresponding drive power supply terminal 215c of the second RF power amplifier 270b. The output terminal 412 of the DC-DC converter 280 is coupled to the power supply input terminal 710 of the series regulator circuit 281 without being directly coupled to the choke inductor 240c. The series regulator circuit 281 is a four terminal circuit equipped with at least the power supply input terminal 710, shutdown terminal 713, output voltage set terminal 714 and power supply output terminal 712, in which the power supply input terminal 710 is coupled to the output terminal 412 of the DC-DC converter 280, the shutdown terminal 713 is coupled to the shutdown signal input terminal 218, the output voltage set terminal 714 is coupled to the baseband processing circuit 285 via the output voltage set terminal 219, and the power supply output terminal 712 is coupled to its corresponding drain electrode of the second RF power amplifier 270b via the choke inductor 240c.

In FIG. 16, the power supply input terminal 710 is coupled to the input terminal 570c of the changeover switch 720, the source electrode of the P-type MOS transistor 730 and the power supply terminal 580a of the error amplifier 750. The changeover switch 720 is a four terminal circuit equipped with at least the output terminal 570a, two input terminals 570b and 570c and control terminal 570d, in which the control terminal 570d is coupled to the shutdown terminal 713, the input terminal 570b is coupled to the output terminal 580e of the error amplifier 750, the input terminal 570c is coupled to the power supply input terminal 710, and the output terminal 570a is coupled to its corresponding gate electrode of the P-type MOS transistor 730. The error amplifier 750 is a five terminal circuit equipped with the power supply terminal 580a, ground terminal 580b, non-inversion input terminal 580c, inversion input terminal 580d, and output terminal 580e, in which the power supply terminal 580a is coupled to the power supply input terminal 710, the ground terminal 580b is coupled to the ground potential, the non-inversion input terminal 580c is coupled to the node 770, the inversion input terminal 580d is coupled to the output voltage set terminal 714, and the output terminal 580e is coupled to the input terminal 570b of the changeover switch 720. The drain electrode of the P-type MOS transistor 730 is coupled to the node 770, the non-inversion input terminal 580c of the error amplifier 750 and the power supply output terminal 712.

The RF power amplifier device according to the fourth embodiment of the present invention shown in FIGS. 15 and 16 is basically identical in other configuration to the RF power amplifier device according to the first embodiment of the present invention described with reference to FIGS. 1, 2 and 3.

<<Operation of RF Power Amplifier Device According to the Fourth Embodiment of the Present Invention>>

The operation of the RF power amplifier device according to the fourth embodiment of the present invention shown in FIGS. 15 and 16 will next be explained below.

In the case of low power output, a power level signal L indicative of a low power output state, which is generated from the baseband processing circuit 285, is supplied to the shutdown terminal 413 of the DC-DC converter 280 and the shutdown terminal 713 of the series regulator circuit 281 via the shutdown signal input terminal 218.

In response to the power level signal L, the switching clock generator 450 of the DC-DC converter 280 is brought to an active state, so that the DC-Dc converter 280 is brought to an active state. For this reason, a fourth power supply voltage Vcc4 having a voltage level equal to approximately ½ of a third power supply voltage Vcc3 supplied to the drive power supply terminal 215c of the second RF power amplifier 270b is generated from the output terminal 412.

Further, in response to the power level signal L, the changeover switch 720 of the series regulator circuit 281 is brought to a state of coupling the gate electrode of the P-type MOS transistor 730 and the output terminal of the error amplifier 750. As a result, the series regulator circuit 281 assumes an active state and thereby supplies, as a fourth power supply voltage Vcc4, a power supply output voltage specified by the output voltage set terminal 714 from the power supply output terminal 712 to the drain electrode of the second RF power amplifier 270b via the choke inductor 240c.

In the case of high power output, a power level signal H indicative of a high power output state, which is generated from the baseband processing circuit 285, is supplied to the shutdown terminal 413 of the DC-DC converter 280 and the shutdown terminal 713 of the series regulator circuit 281 via the shutdown signal input terminal 218.

In response to the power level signal H, the switching clock generator 450 of the DC-DC converter 280 is brought to an inactive state, so that the DC-DC converter 280 is brought to an inactive state. For this reason, the fourth power supply voltage Vcc4 is not generated from the output terminal 412.

Further, in response to the power level signal H, the changeover switch 720 of the series regulator circuit 281 becomes a state of coupling the gate electrode of the P-type MOS transistor 730 and the power supply input terminal 710. As a result, the series regulator circuit 281 is brought to an inactive state, thus resulting in no supply of the fourth power supply voltage Vcc4 from the power supply output terminal 712 to the drain electrode of the second RF power amplifier 270b via the choke inductor 240c.

In the RF power supply device according to the fourth embodiment of the present invention shown in FIGS. 15 and 16, the series regulator circuit 281 is a series regulator circuit capable of varying an output voltage. Thus, for example, the baseband processing circuit 285 supplies an output voltage set signal responsive to transmission output power of the RF power amplifier device to the inversion input terminal 580d of the error amplifier 750 via the output voltage set terminal 714 of the series regulator circuit 281. Accordingly, the error amplifier 750 compares the potential of the node 770 and the potential of the output voltage set terminal 714.

When the node 770 is at a potential higher than that at the output voltage set terminal 714, the output potential of the error amplifier 750 becomes high so that the potential of the gate electrode of the P-type MOS transistor 730a supplied with the output potential of the error amplifier 750 via the changeover switch 720 is rendered high to lower the value of a drain current. As a result, since the fourth power supply voltage Vcc4 of the power supply output terminal 712 of the series regulator circuit 281 is reduced, the fourth power supply voltage Vcc4 coincides with the potential of the output voltage set terminal 714.

When the node 770 is at a potential lower than that at the output voltage set terminal 714, the output potential of the error amplifier 750 becomes low so that the potential of the gate electrode of the P-type MOS transistor 730a supplied with the output potential of the error amplifier 750 via the changeover switch 720 is rendered low to increase the value of a drain current. As a result, since the fourth power supply voltage Vcc4 of the power supply output terminal 712 of the series regulator circuit 281 rises, the fourth power supply voltage Vcc4 coincides with the potential of the output voltage set terminal 714.

Since the RF power amplifier device according to the fourth embodiment of the present invention shown in FIGS. 15 and 16 is exactly identical in other operation to the RF power amplifier device according to the first embodiment of the present invention described with reference to FIGS. 1, 2 and 3, the description thereof is omitted.

<<Effects by Series Regulator Circuit>>

Advantageous effects obtained by the series regulator circuit 281 of the RF power amplifier device according to the fourth embodiment of the present invention shown in FIGS. 15 and 16 will next be explained below.

That is, assume where in the RF power amplifier device according to the first embodiment of the present invention described with reference to FIGS. 1, 2 and 3, the third power supply voltage Vcc3 applied to the drive power supply terminal 215c of the second RF power amplifier 270b is supplied from, for example, a secondary battery such as a lithium ion battery. The third power supply voltage Vcc3 is 4.2V or so when the remaining capacity of the lithium ion battery is nearly full, but is lowered to 2.9V or so when the remaining capacity of the lithium ion battery is gradually reduced with the progress of its discharge and approaches empty. Thus, since the DC-DC converter 280 is configured by the ½ step-down charge pump circuit in the first embodiment of the present invention, the operating voltage supplied to the drain electrode of the second RF power amplifier 270b from the DC-DC converter 280 fluctuates between approximately 2.1V and 1.45V. As a result, the amplification factor of the second RF power amplifier 270b is assumed to vary.

On the other hand, in the RF power amplifier device according to the fourth embodiment of the present invention shown in FIGS. 15 and 16, the fourth power supply voltage Vcc4 supplied from the power supply output terminal 712 of the series regulator circuit 281 to the second RF power amplifier 270b via the choke coil 240c can be stabilized to the predetermined voltage of the output voltage set terminal 714, thereby making it possible to suppress the above-described variation in the amplification factor of the second RF power amplifier 270b.

The series regulator circuit 281 does not generate switching noise and further has the effect of suppressing noise at the output voltage of the power supply output terminal 712 even when noise is superimposed on the power input voltage supplied to the power supply input terminal 710. Thus, when it is necessary to suppress the propagation of the switching noise of the DC-DC converter 280 to the RF transmission output of the RF power amplifier device according to the first embodiment of the present invention, for example, the adoption of the RF power amplifier device according to the fourth embodiment of the present invention shown in FIGS. 15 and 16 is effective. That is, the switching noise superimposed on the output voltage of the DC-DC converter 280 can be effectively suppressed by the series regulator circuit 281 of the RF power amplifier device according to the fourth embodiment of the present invention.

[Fifth Embodiment]

<<Configuration of RF Power Amplifier Device According to the Fifth Embodiment of the Present Invention>>

Figure 17:
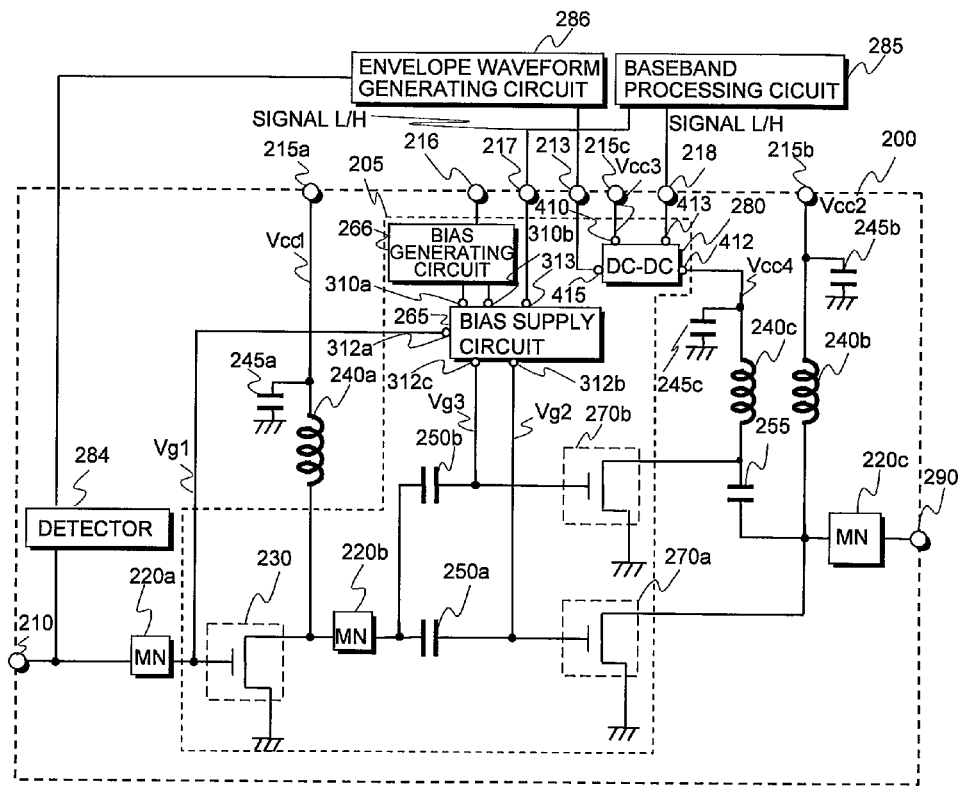
FIG. 17 is a diagram showing a configuration of an RF power amplifier device according to a fifth embodiment of the present invention.

FIG. 17 is a diagram showing the configuration of the RF power amplifier device according to the fifth embodiment of the present invention.

The RF power amplifier device according to the fifth embodiment of the present invention shown in FIG. 17 is different from the RF power amplifier device according to the first embodiment of the present invention explained with reference to FIGS. 1, 2 and 3 in that an input terminal of a detector 284 is coupled to its corresponding RF signal input terminal 210 for envelope tracking, an output terminal of the detector 284 is coupled to its corresponding input terminal of an envelope waveform generating circuit 286 lying outside an RF power amplifier module 200, and an output terminal of the envelope waveform generating circuit 286 is coupled to its corresponding output level control input terminal 415 of a DC-DC converter 280. The RF power amplifier device shown in FIG. 17 is basically identical in other points to the RF power amplifier device according to the first embodiment. As a result, the RF power amplifier device according to the fifth embodiment of the present invention shown in FIG. 17 is operated by a system called an envelope-tracking RF power amplifier.

That is, a part of an RF input signal applied to the RF signal input terminal 210 is supplied to the detector 284. Then, the detector 284 detects the RF signal and supplies the so-detected output signal to the input terminal of the envelope waveform generating circuit 286. The envelope waveform generating circuit 286 converts the detected output signal to an output voltage control signal suitable for output voltage control of the DC-DC converter 280 and supplies it to the output level control input terminal 415 of the DC-DC converter 280 via the envelope waveform input terminal 213. The DC-DC converter 280 is a four terminal circuit equipped with at least the input terminal 410, output terminal 412, shutdown control terminal 413 and output level control input terminal 415, in which the input terminal 410 is coupled to it corresponding drive power supply terminal 215c of the second RF power amplifier 270b, the shutdown control terminal 413 is coupled to its corresponding shutdown signal input terminal 218, the output level control input terminal 415 is coupled to its corresponding envelope waveform input terminal 213, and the output terminal 412 is coupled to its corresponding drain electrode of the second RF power amplifier 270b via the choke inductor 240c.

Further, in the RF power amplifier device according to the fifth embodiment of the present invention shown in FIG. 17, the buck converter (step-down switching regulator) shown in FIG. 13 is particularly used in the DC-DC converter 280.

Incidentally, in the fifth embodiment of the present invention shown in FIG. 17, the envelope waveform generating circuit 286 may be built in the baseband processing circuit 285.

<<Operation of RF Power Amplifier Device According to the Fifth Embodiment of the Present Invention>>

The operation of the RF power amplifier device according to the fifth embodiment of the present invention shown in FIG. 17 will next be explained below with reference to FIG. 18.

Figure 18:
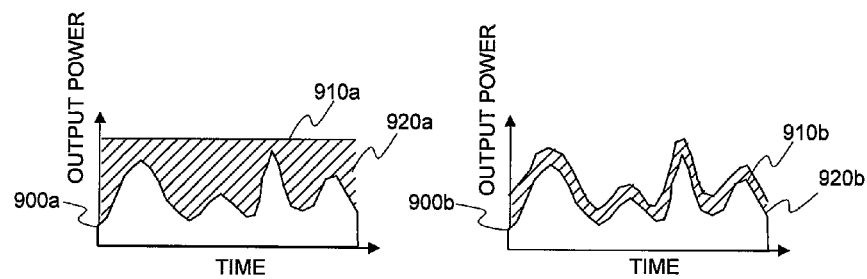
FIG. 18 is a diagram for describing a normal operation of the RF power amplifier device according to the first embodiment of the present invention described in FIGS. 1, 2 and 3, and an envelope tracking operation of the RF power amplifier device according to the fifth embodiment of the present invention shown in FIG. 17.

FIG. 18 is a diagram for describing a normal operation of the RF power amplifier device according to the fifth embodiment of the present invention described in FIGS. 1, 2 and 3, and an envelope tracking operation of the RF power amplifier device according to the fifth embodiment of the present invention shown in FIG. 17.

Operation waveforms of respective parts in the normal operation of the RF power amplifier device according to the first embodiment of the present invention are shown on the left side of FIG. 18. Operation waveforms of respective parts in the envelope tracking operation of the RF power amplifier device according to the fifth embodiment of the present invention are shown on the right side of FIG. 18.

In FIG. 18, reference numerals 910a and 910b indicate curves each indicative of operation supply power supplied from the drive power supply terminal 215c of the second RF power amplifier 270b to the second RF power amplifier 270b via the output terminal 412 of the DC-DC converter 280. Reference numerals 900a and 900b denote curves each indicative of a transmission output power waveform outputted from the RF signal output terminal 290. Reference numerals 920a and 920b denote areas shown in slanting lines to indicate power (hereinafter called backoff power) consumed as backoff at the second RF power amplifier 270b.

Upon the normal operation of the RF power amplifier device according to the first embodiment of the present invention as shown on the left side of FIG. 18, the operation supply power 910a supplied from the DC-DC converter 280 to the drain electrode of the second RF power amplifier 270b is rendered approximately constant. Thus, the backoff power 920a changes in inverse proportion to a change in the transmission output power waveform 900a of the RF power amplifier device. Accordingly, power consumption becomes large upon the normal operation of the RF power amplifier device according to the first embodiment of the present invention.

Upon the envelope tracking operation of the RF power amplifier device according to the fifth embodiment of the present invention as shown on the right side of FIG. 18, the operation supply power 910b supplied from the DC-DC converter 280 to the drain electrode of the second RF power amplifier 270b is changed following the transmission output power waveform 900b of the RF power amplifier device while ensuring the constant backoff power 920b, thereby reducing the backoff power 920b. Accordingly, power consumption can be reduced by the envelope tracking operation of the RF power amplifier device according to the fifth embodiment of the present invention as compared with the normal operation of the RF power amplifier device according to the first embodiment of the present invention.

Further, the RF power amplifier device according to the fifth embodiment of the present invention shown in FIG. 17 is capable of achieving an envelope-tracking RF power amplifier which is small in current capacity and small-sized and is capable of providing follow-up at high speed due to the following reasons, as compared with the RF power amplifier described in the patent document 1, for example.

That is, as described above, the buck converter shown in FIG. 13 is particularly used in the DC-DC converter 280 in the RF power amplifier device according to the fifth embodiment of the present invention shown in FIG. 17. In the buck converter shown in FIG. 13, the frequency with which each of the P-type MOS transistor 471a and the N-type LDMOS transistor 471b is on/off-operated, is called a switching frequency. In order to cause the envelope-tracking RF power amplifier to perform a high-speed follow-up operation, the DC-DC converter 280 needs the speed of response for making it possible to follow the envelope signal at high speed. To this end, a fast switching speed is required as compared with the normal DC-DC converter. If a comparison is made between switching frequencies, a general DC-DC converter needs a switching frequency ranging from 1 to 3 MHz or so, whereas when the envelope tracking system is used in a W-CDMA RF power amplifier, for example, a switching frequency of 20 MHz or so is required.

Generally, each device used in the DC-DC converter needs to use a device size large in proportion to the magnitude of supply power. Since, however, the operating speed of an electric circuit is generally inverse proportional to the device size, the limit switching frequency of the DC-DC converter using the large device size is reduced and a high-efficiency voltage conversion operation is made impossible. For example, the RF power amplifier described in the patent document needs a DC-DC converter capable of outputting a current ranging from 1 to 2 A. There is however a need to suppress the operating speed to a low switching frequency of about 3 MHz or less in order to operate the DC-DC converter having the large current-carrying capacity highly efficiently. This however makes it difficult to operate such an RF power amplifier as the envelope-tracking RF power amplifier for W-CDMA.

On the other hand, the RF power amplifier device according to the fifth embodiment of the present invention shown in FIG. 17 assumes a small current capacity as in the case where the output current of the DC-DC converter 280 is 200 mA or less. It is therefore possible to use a small device size as compared with the DC-DC converter of the RF power amplifier described in the patent document 1. Accordingly, the DC-DC converter 280 of the RF power amplifier device according to the fifth embodiment of the present invention shown in FIG. 17 is capable of high speed operation at 20 MHz or so. As a result, the RF power amplifier device according to the fifth embodiment of the present invention shown in FIG. 17 can be operated as the envelope-tracking RF power amplifier for W-CDMA, and the backoff power for reducing power consumption can be reduced.

[Sixth Embodiment]

<<Configuration of RF Power Amplifier Device According to the Sixth Embodiment of the Present Invention>>

FIG. 19 is a diagram showing the configuration of the RF power amplifier device according to the sixth embodiment of the present invention.

The RF power amplifier device according to the sixth embodiment of the present invention shown in FIG. 19 is different from the RF power amplifier device according to the first embodiment of the present invention described with reference to FIGS. 1, 2 and 3 in that a branch path of a switch 291 is coupled between the output terminal 412 of the DC-DC converter 280 and the drive power supply terminal 215a of the driver stage amplifier 230, and the choke inductor 240a and the bypass capacitor 245a, and control for selection of the branch path of the switch 291 is conducted by a control signal supplied to the shutdown signal input terminal 218. The RF power amplifier device shown in FIG. 19 is basically identical in other points to the RF power amplifier device according to the first embodiment.

That is, in the RF power amplifier device according to the sixth embodiment of the present invention shown in FIG. 19, the switch 291 is a four terminal circuit equipped with at least two input terminals 590a and 590b, one control terminal 590d and one output terminal 590c, in which the input terminal 590a is coupled to the drive power supply terminal 215a of the driver stage amplifier 230, the input terminal 590b is coupled to the output terminal 412 of the DC-DC converter 280, the control terminal 590d is coupled to the shutdown signal input terminal 218, and the output terminal 590c is coupled to the choke inductor 240a and the bypass capacitor 245a.

<<Operation of RF Power Amplifier Device According to the Sixth Embodiment of the Present Invention>>

The operation of the RF power amplifier device according to the sixth embodiment of the present invention shown in FIG. 19 will next be explained below.

In the case of high power output, a power level signal H indicative of a high power output state, which is generated from the baseband processing circuit 285, is supplied to the shutdown terminal 413 of the DC-DC converter 280 via the shutdown signal input terminal 218. In response to the power level signal H, the switching clock generator 450 of the DC-DC converter 280 shown in FIG. 3 becomes an inactive state, so that the DC-DC converter 280 is brought to an inactive state. Further, the switch 291 is brought to a state of coupling the drive power supply terminal 215a of the driver stage amplifier 230 and the choke inductor 240a thereof in response to the power level signal H, so that a first power supply voltage Vcc1 applied to the drive power supply terminal 215a of the driver stage amplifier 230 is supplied to the drain electrode of the driver stage amplifier 230 via the choke inductor 240a.

In the case of low power output, a power level signal L indicative of a low power output state, which is generated from the baseband processing circuit 285, is supplied to the shutdown terminal 413 of the DC-DC converter 280 via the shutdown signal input terminal 218. In response to the power level signal L, the switching clock generator 450 of the DC-DC converter 280 shown in FIG. 3 becomes an active state, so that the DC-DC converter 280 is brought to an active state. Further, the switch 291 is brought to a state of coupling the output terminal 412 of the DC-DC converter 280 and the choke inductor 240c, so that a relatively low fourth power supply voltage Vcc4 from the output terminal 412 of the DC-DC converter 280 is supplied to the drain electrode of the driver stage amplifier 230 through the choke inductor 240a.

Thus, in the RF power amplifier device according to the sixth embodiment of the present invention shown in FIG. 19, current consumption of the driver stage amplifier 230 and current consumption of the second RF power amplifier 270b are reduced by the DC-DC converter 280 at the low power output. Thus, as compared with the RF power amplifier device according to the first embodiment of the present invention described with reference to FIGS. 1, 2 and 3, the RF power amplifier device according to the sixth embodiment of the present invention shown in FIG. 19 enables a reduction in the average current consumption of the driver stage amplifier 230.

Since the RF power amplifier device according to the sixth embodiment of the present invention shown in FIG. 19 is exactly identical in other operation to the RF power amplifier device according to the first embodiment of the present invention described with reference to FIGS. 1, 2 and 3, the description thereof is omitted.

[Seventh Embodiment]

<<Configuration of RF Power Amplifier Device According to the Seventh Embodiment of the Present Invention>>

FIG. 20 is a diagram showing the configuration of the RF power amplifier device according to the seventh embodiment of the present invention.

The RF power amplifier device according to the seventh embodiment of the present invention shown in FIG. 20 is different from the RF power amplifier device according to the sixth embodiment of the present invention described with reference to FIG. 19 in that a signal switch 295 is added, and an input terminal, a control terminal and an output terminal of the signal switch 295 are respectively coupled to the drain electrode of the driver stage amplifier 230, the switch control terminal 296 and the drain electrode of the first RF power amplifier 270a. The RF power amplifier device shown in FIG. 20 is basically identical in other points to the RF power amplifier device shown in FIG. 19. That is, the signal switch 295 is a three terminal circuit equipped with at least the input terminal, control terminal and output terminal, in which the input terminal is coupled to the drain electrode of the driver stage amplifier 230, the control terminal is coupled to the baseband processing circuit 285 via the switch control terminal 296, and the output terminal is coupled to the drain electrode of the first RF power amplifier 270a.

<<Operation of RF Power Amplifier Device According to the Seventh Embodiment of the Present Invention>>

The operation of the RF power amplifier device according to the seventh embodiment of the present invention shown in FIG. 20 will next be explained below.

Even in the case of low power output, e.g., in the case of an output power of 0 dBm or less low in particular, the baseband processing circuit 285 supplies a specific low power level signal LL indicative of a state of transmission output power low in particular to the control terminal of the signal switch 295, the shutdown terminal 413 of the DC-DC converter 280, and the first RF power amplifier/second RF power amplifier switch signal input terminal 313 of the bias supply circuit 265. In the selector 320 of the bias supply circuit 265 shown in FIG. 2, the bias current input terminal 310b is brought to a state of being not coupled to both drain electrodes of the N-type LDMOS transistors 330b and 330c by the specific low power level signal LL. Thus, since no bias current is supplied to the first RF power amplifier 270a and the second RF power amplifier 270b, the first RF power amplifier 270a and the second RF power amplifier 270b are respectively brought to a cutoff state. On the other hand, the DC-DC converter 280 is brought to an inactive state and the signal switch 295 is brought to an on state. With this operation, an RF signal generated from the drain electrode of the driver stage amplifier 230 is outputted to the RF signal output terminal 290 via the signal switch 295 and the output matching circuit 220c.

The RF power amplifier device according to the seventh embodiment of the present invention shown in FIG. 20 is exactly identical in other operation to the RF power amplifier device according to the sixth embodiment of the present invention shown in FIG. 19.

That is, in the case of the normal low power output, a power level signal L indicative of a normal low power output state, which is generated from the baseband processing circuit 285, is supplied to the control terminal of the signal switch 295, the shutdown terminal 413 of the DC-DC converter 280 and the first RF power amplifier/second RF power amplifier switch signal input terminal 313 of the bias supply circuit 265. In the selector 320 of the bias supply circuit 265 shown in FIG. 2, the bias current input terminal 310b is coupled to the drain electrode of the N-type LDMOS transistor 330c by the power level signal L, so that a bias current is supplied to the second RF power amplifier 270b. For this reason, the second RF power amplifier 270b is brought to an active state. Then, the switching clock generator 450 of the DC-DC converter 280 shown in FIG. 3 becomes an active state in response to the power level signal L, so that the DC-DC converter 280 is brought to an active state. Further, the switch 291 is brought to a state of coupling between the output terminal 412 of the DC-DC converter 280 and the choke inductor 240a in response to the power level signal L, so that a relatively low fourth power supply voltage Vcc4 from the output terminal 412 of the DC-DC converter 280 is supplied to the drain electrode of the driver stage amplifier 230 via the choke inductor 240a. On the other hand, the signal switch 295 is brought to an off state so that an RF signal generated from the drain electrode of the driver stage amplifier 230 is amplified by the second RF power amplifier 270b held in the active state, followed by being outputted to the RF signal output terminal 290 via the output matching circuit 220c.

According to the RF power amplifier according to the seventh embodiment of the present invention shown in FIG. 20, as compared with the sixth embodiment of the present invention described in FIG. 19, current consumption of the second RF power amplifier 270b can be reduced because the second RF power amplifier 270b is brought to a cutoff state in the case of an output power of 0 dBm or less low in particular.

[Eighth Embodiment]

<<Configuration of Bias Supply Circuit According to the Eighth Embodiment of the Present Invention>>

FIG. 21 is a diagram showing the configuration of the bias supply circuit 265 according to the eighth embodiment of the present invention, which is usable in the RF power amplifier device according to any of the embodiments shown in FIGS. 1, 15, 17, 19 and 20 and FIGS. 22 and 23 to be described below.

The bias supply circuit 265 according to the eighth embodiment of the present invention shown in FIG. 21 is different from the bias supply circuit 265 included in the RF power amplifier device according to the first embodiment of the present invention of FIG. 1, which is shown in FIG. 2 in that a power supply switch terminal 315, power supply terminals 314a and 314b and a switch 350 are added, but is identical in other points thereto. In the switch 350, reference numerals 500e and 500f indicate input terminals, reference numeral 500g indicates an output terminal, and reference numeral 500h indicates a control terminal. In the buffer amplifier 340a, reference numeral 515a indicates a power supply terminal. In the buffer amplifier 350b, reference numeral 515b indicates a power supply terminal.

That is, the switch 350 is a four terminal device equipped with at least two input terminals 500e and 500f, one output terminal 500g and one control terminal 500h, in which the control terminal 500h is coupled to the supply switch terminal 315, the input terminals 500e and 500f are coupled to the power supply terminals 314a and 314b, and the output terminal 500g is coupled to the power supply terminals 515a and 515b of the buffer amplifiers 340a and 340b.

Although not illustrated in FIG. 21, the power supply terminal 314a is coupled to any of the drive power supply terminal 215a of the driver stage amplifier 230, the drive power supply terminal 215b of the first RF power amplifier 270a and the drive power supply terminal 215c of the second RF power amplifier 270b, the power supply terminal 314b is coupled to the output terminal 412 of the DC-DC converter 280, and the power supply switch terminal 315 is coupled to the shutdown signal input terminal 218. Since the present RF power amplifier device is exactly identical in other operation to the RF power amplifier device according to the first embodiment of the present invention explained with reference to FIGS. 1, 2 and 3, the description thereof is omitted.

Operations of Bias Supply Circuit and RF Power Amplifier Device According to the Eighth Embodiment of the Present Invention The operations of the bias supply circuit 265 and the RF power amplifier device according to the eighth embodiment of the present invention shown in FIG. 21 will next be explained below.

In the case of high power output, a power level signal H indicative of a high power output state, which is generated from the baseband processing circuit 285, is supplied to the shutdown terminal 413 of the DC-DC converter 280 via the shutdown signal input terminal 218. In response to the power level signal H, the switch 350 is brought to a state of the power supply terminals 515a and 515b of the buffer amplifiers 340a and 340b, and the power supply terminal 314a being coupled to each other, so that any of the first power supply voltage Vcc1, second power supply voltage Vcc2 and third power supply voltage Vcc3 is supplied to the power supply terminals 515a and 515b of the buffer amplifiers 340a and 340b.

At low power output, a power level signal L indicative of a low power output state, which is generated from the baseband processing circuit 285, is supplied to the shutdown terminal 413 of the DC-DC converter 280 via the shutdown signal input terminal 218. In response to the power level signal L, the switch 350 is brought to a state of the power supply terminals 515a and 515b of the buffer amplifiers 340a and 340b and the power supply terminal 314b being coupled to each other, so that a fourth power supply voltage Vcc4 stepped-down to a voltage lower than any of the first power supply voltage Vcc1, second power supply voltage Vcc2 and third power supply voltage Vcc3 by the DC-DC converter 280 is supplied from the output terminal 412 of the DC-DC converter 280 to the power supply terminal 515a and 515b of the buffer amplifiers 340a and 340b. Thus, in the bias supply circuit 265 according to the eighth embodiment of the present invention shown in FIG. 21, current consumption of the buffer amplifiers 340a and 340b of the bias supply circuit 265 can be reduced by the step-down operation by the DC-DC converter 280 in the case of the low power output.

[Ninth Embodiment]

<<Configuration of RF Power Amplifier Device According to the Ninth Embodiment of the Present Invention>>

Figure 22:
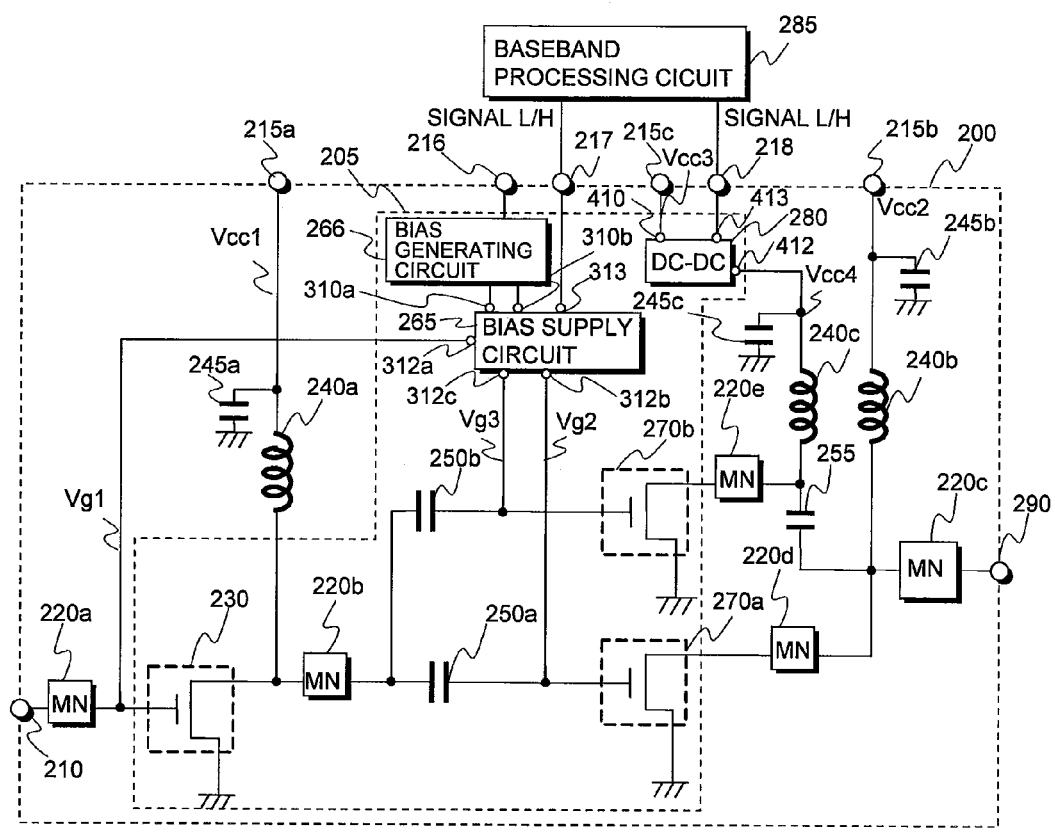
FIG. 22 is a diagram showing a configuration of an RF power amplifier device according to a ninth embodiment of the present invention.

FIG. 22 is a diagram showing the configuration of the RF power amplifier device according to the ninth embodiment of the present invention.

The RF power amplifier device according to the ninth embodiment of the present invention shown in FIG. 22 is different from the RF power amplifier device according to the first embodiment of the present invention described with reference to FIGS. 1, 2 and 3 in that an output matching circuit 220d is added between the drain electrode of the first RF power amplifier 270a and the input terminal of the output matching circuit 220c and that an output matching circuit 220e is further added between the drain electrode of the second RF power amplifier 270b and the input terminal of the output matching circuit 220c. The RF power amplifier device shown in FIG. 22 is basically identical thereto in other points to the RF power amplifier device according to the first embodiment.

That is, in the RF power amplifier device according to the ninth embodiment of the present invention shown in FIG. 22, the drain electrode of the first RF power amplifier 270a is coupled to the input terminal of the output matching circuit 220c via the output matching circuit 220d, and the drain electrode of the second RF power amplifier 270b is coupled to the input terminal of the output matching circuit 220c via the output matching circuit 220e.

<<Operation of RF Power Amplifier Device According to the Ninth Embodiment of the Present Invention>>

The operation of the RF power amplifier device according to the ninth embodiment of the present invention shown in FIG. 22 will next be explained below.

That is, in the case of a high power output operation, an RF signal generated from the drain electrode of the first RF power amplifier 270a is outputted from the RF signal output terminal 290 via the output matching circuits 220d and 220c. Further, in the case of a low power output operation, an RF signal generated from the drain electrode of the second RF power amplifier 270b is outputted from the RF signal output terminal 290 via the output matching circuits 220e and 220c. Thus, according to the RF power amplifier device related to the ninth embodiment of the present invention shown in FIG. 22, the state of matching between the output impedance of the first RF power amplifier 270a and the input impedance of the output matching circuit 220c can be so designed that they are respectively brought to the optimum by the output matching circuit 220d. The state of matching between the output impedance of the second RF power amplifier 270b and the input impedance of the output matching circuit 220c can be so designed that they are respectively brought to the optimum by the output matching circuit 220e, thereby making it possible to reduce an RF signal loss due to the mismatch of impedance.

[Tenth Embodiment]

<<Configuration of RF Power Amplifier Device According to the Tenth Embodiment of the Present Invention>>

Figure 23:
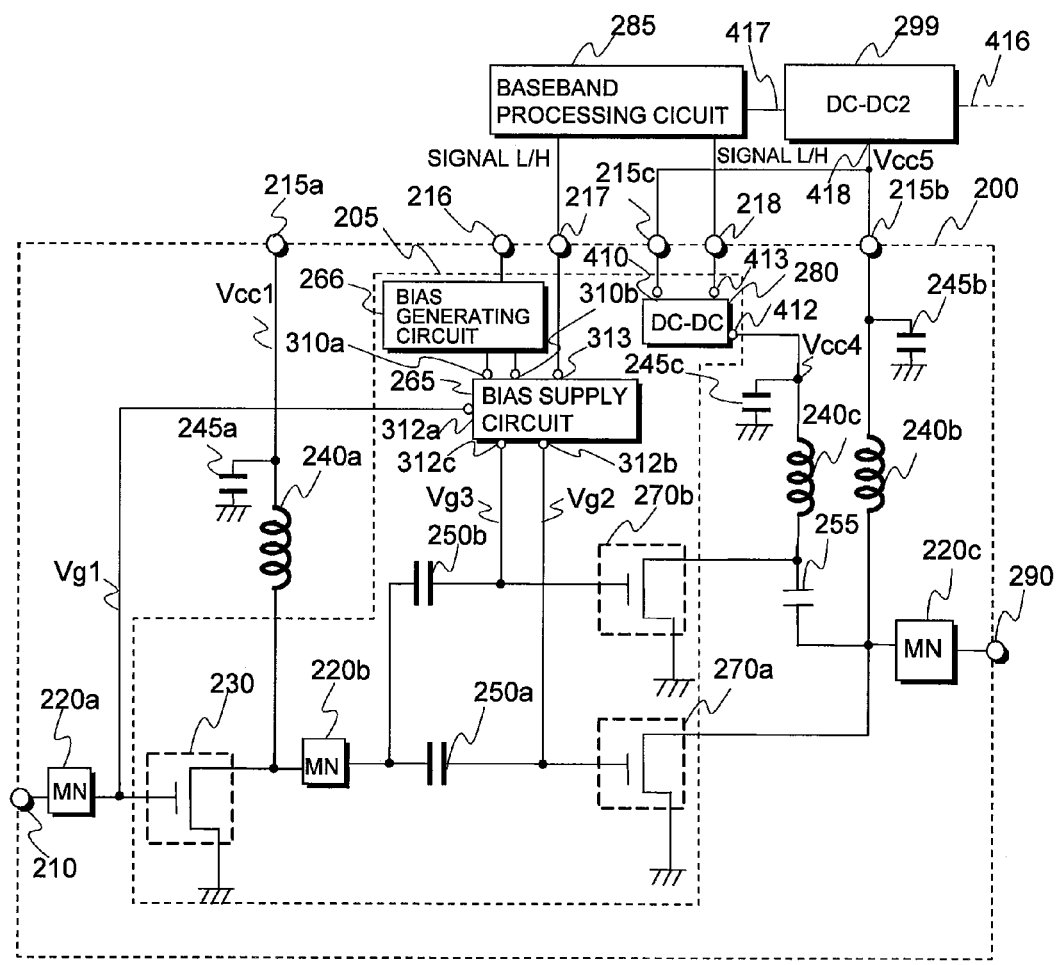
FIG. 23 is a diagram illustrating a configuration of an RF power amplifier circuit according to a tenth embodiment of the present invention.

FIG. 23 is a diagram showing the configuration of the RF power amplifier device according to the tenth embodiment of the present invention.

The RF power amplifier device according to the tenth embodiment of the present invention shown in FIG. 23 is different from the RF power amplifier device according to the first embodiment of the present invention described with reference to FIGS. 1, 2 and 3 in that a fifth power supply voltage Vcc5 generated from an external DC-DC converter 299 is supplied to the drive power supply terminal 215b of the first RF power amplifier 270a and the drive power supply terminal 215c of the second RF power amplifier 270b, and the level of the fifth power supply voltage Vcc5 can be adjusted by control of the baseband processing circuit 285. The RF power amplifier device shown in FIG. 23 is basically identical in other points to the RF power amplifier device according to the first embodiment. As the external DC-DC converter 299 added to the above RF power amplifier device, a boost converter (step-up switching regulator) or a buck boost converter (step-up/down switching regulator) can be used even in addition to the use of the buck converter (step-down switching regulator) shown in FIG. 13. In the external DC-DC converter 299, reference numeral 416 denotes a power supply input terminal, reference numeral 417 denotes a control input terminal, and reference numeral 418 denotes a power supply output terminal.

That is, the DC-DC converter 299 is a three terminal circuit equipped with at least the power supply input terminal 416, control input terminal 417 and power supply output terminal 418. The power supply input terminal 416 can be coupled to an output terminal of a battery unillustrated in FIG. 23, the control input terminal 417 can be coupled to the baseband processing circuit 285, and the power supply output terminal 418 can be coupled to the drive power supply terminal 215b of the first RF power amplifier 270a and the drive power supply terminal 215c of the second RF power amplifier 270b. Further, the power supply output terminal 418 can be coupled to the drive power supply terminal 215a of the driver stage amplifier 230.

<<Operation of RF Power Amplifier Device According to the Tenth Embodiment of the Present Invention>>

The operation of the RF power amplifier device according to the tenth embodiment of the present invention shown in FIG. 23 will next be explained below.

That is, the baseband processing circuit 285 supplies such a control signal that the external DC-DC converter 299 stably generates a fifth power supply voltage Vcc5 corresponding to a variable voltage responsive to a fixed voltage or transmission output power, to the control input terminal 417 of the external DC-DC converter 299. As a result, the external DC-DC converter 299 converts a battery voltage supplied from the power supply input terminal 416 to its corresponding fifth power supply voltage Vcc5 specified by the control signal generated from the baseband processing circuit 285 and supplies it to the drive power supply terminal 215b of the first RF power amplifier 270a and the drive power supply terminal 215c of the second RF power amplifier 270b. Further, the fifth power supply voltage Vcc5 can also be supplied to the drive power supply terminal 215a of the driver stage amplifier 230.

In the RF power amplifier device according to the first embodiment of the present invention described with reference to FIGS. 1, 2 and 3, when the third power supply voltage Vcc3 supplied to the drive power supply terminal 215c of the second RF power amplifier 270b is supplied from the secondary battery such as the lithium ion battery or the like, the third power supply voltage Vcc3 is a voltage of 4.2V or so when the remaining capacity of the lithium ion battery is nearly full, but is lowered to a voltage of 2.9V or so when its voltage is gradually reduced with the progress of its discharge and the remaining capacity thereof approaches empty. Since the DC-DC converter 280 is configured by the ½ step-down charge pump circuit in the first embodiment of the present invention, the voltage supplied to the drain electrode of the second RF power amplifier 270b from the ½ step-down charge pump circuit fluctuates between approximately 2.1V and 1.45V, so that the amplification factor of the second RF power amplifier 270b greatly varies.

On the other hand, according to the RF power amplifier device related to the tenth embodiment of the present invention shown in FIG. 23, variations in the amplification factor of the first RF power amplifier 270a and the amplification factor of the second RF power amplifier 270b can be suppressed because the fifth power supply voltage Vcc5 stabilized to the predetermined voltage as the power supply voltage for the first RF power amplifier 270a and the second RF power amplifier 270b is supplied from the power supply output terminal 418 of the external DC-DC converter 299.

[Eleventh Embodiment]

Figure 24:
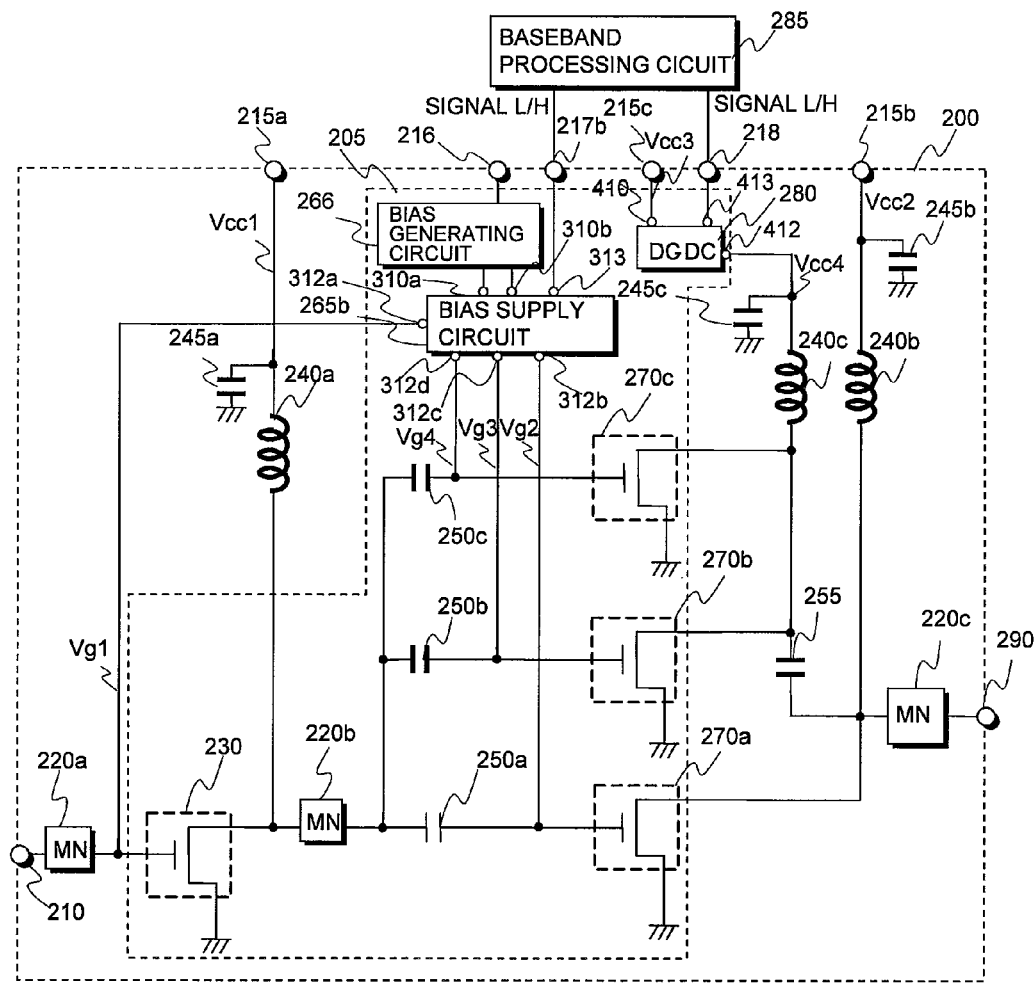
FIG. 24 is a diagram showing a configuration of an RF power amplifier device according to an eleventh embodiment of the present invention.

FIG. 24 is a diagram showing the configuration of the RF power amplifier device according to the eleventh embodiment of the present invention.

The RF power amplifier device according to the eleventh embodiment of the present invention shown in FIG. 24 is different from the RF power amplifier device according to the first embodiment of the present invention described referring to FIGS. 1, 2 and 3 in that a third RF power amplifier 270c and a coupling capacitor 250c both minimum in device size are added and that a bias potential Vg4 for a linear operation, which is generated from a bias supply circuit 265b, can be supplied to its corresponding gate electrode of the third RF power amplifier 270c, and a low power level signal L, a middle power level signal M and a high power level signal H are supplied to the shutdown signal input terminal 218 from the baseband processing circuit 285. Thus, it is of particular importance that the device size of the third RF power amplifier 270c is set smaller than that of the second RF power amplifier 270b. The RF power amplifier device shown in FIG. 24 is basically identical in other points to the RF power amplifier device according to the first embodiment. Incidentally, in FIG. 24, reference numeral 217b indicates a first RF power amplifier/second RF power amplifier/third RF power amplifier switch control terminal.

The operation of the RF power amplifier device according to the present embodiment will next be explained with reference to FIGS. 25 and 26.

<<Bias Supply Circuit>>

Figure 25:
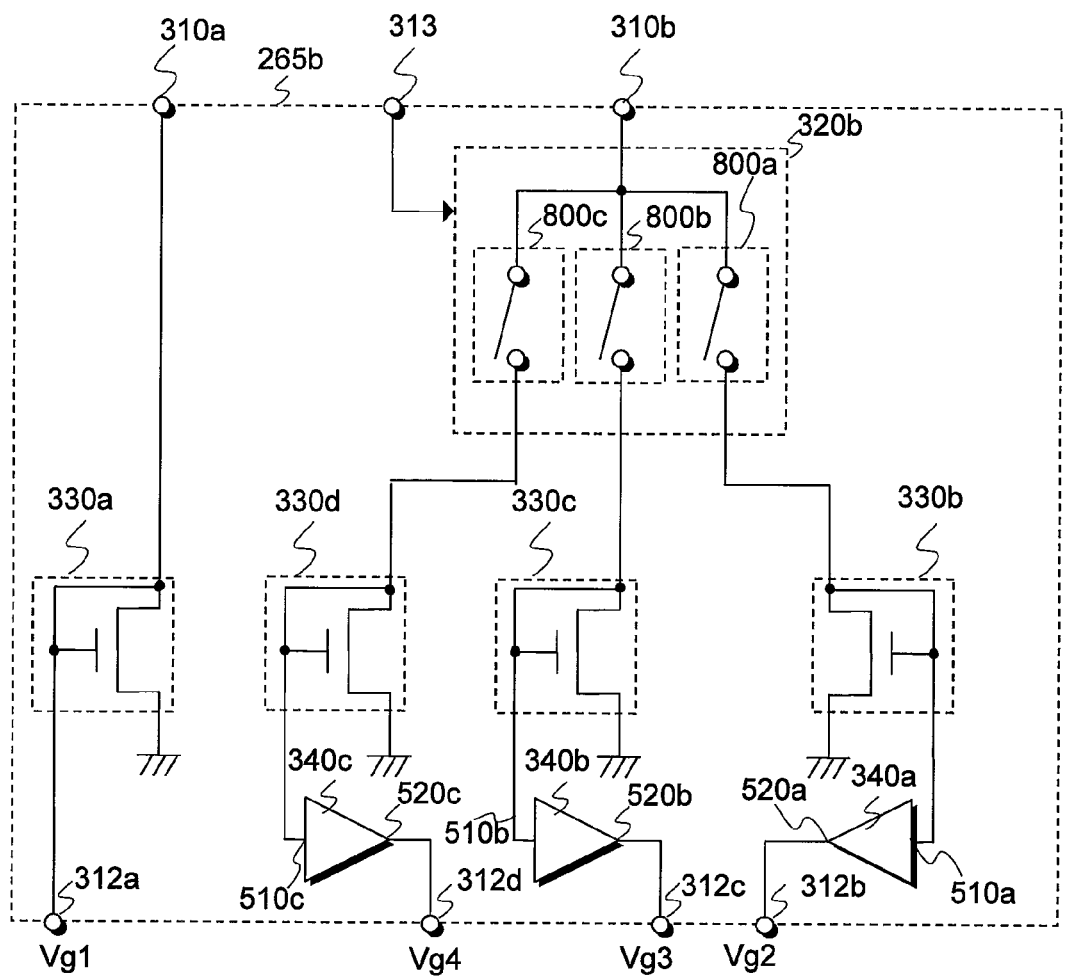
FIG. 25 is a diagram depicting a configuration of a bias supply circuit 265 included in the RF power amplifier device according to the eleventh embodiment of the present invention shown in FIG. 24.

FIG. 25 is a diagram showing the configuration of the bias supply circuit 265b included in the RF power amplifier device according to the eleventh embodiment of the present invention shown in FIG. 24.

The bias supply circuit 265b shown in FIG. 25 is different from the bias supply circuit 265 of the RF power amplifier device according to the first embodiment of the present invention of FIG. 1, which is shown in FIG. 2 in that a selector 320b is configured as a three output terminal, and an N-type LDMOS transistor 330d, a buffer amplifier 340c and a bias signal output terminal 312d are added, but is basically identical in other points thereto. In the selector 320b of the bias supply circuit 265b shown in FIG. 25, reference numerals 800a, 800b and 800c denote one-input/one-output switches respectively. In the buffer amplifier 340c added to the above bias supply circuit, reference numeral 510c denotes an input terminal and reference numeral 520c indicates an output terminal.

That is, in the RF power amplifier device according to the first embodiment of the present invention shown in FIG. 24, an input terminal of the coupling capacitor 250c is coupled to its corresponding input terminals of the coupling capacitors 250a and 250b. An output terminal of the coupling capacitor 250c is coupled to the bias signal output terminal 312d of the bias supply circuit 265b and the gate electrode of the third RF power amplifier 270c, and a drain electrode of the third RF power amplifier 270c is coupled to its corresponding drain electrode of the second RF power amplifier 270b and the choke inductor 240c.

Further, in the bias supply circuit 265b as shown in FIG. 25, the gate and drain electrodes of the N-type LDMOS transistor 330b and the input terminal 510a of the buffer amplifier 340a are coupled to an output terminal of the switch 800a of the one-input/three-output selector 320b. The output terminal 520a of the buffer amplifier 340a is coupled to its corresponding bias signal output terminal 312b. The gate and drain electrodes of the N-type LDMOS transistor 330c and the input terminal 510b of the buffer amplifier 340b are coupled to the output terminal of the switch 800b of the selector 320b. The output terminal 520b of the buffer amplifier 340b is coupled to its corresponding bias signal output terminal 312c. The gate and drain electrodes of the N-type LDMOS transistor 330d and the input terminal 510c of the buffer amplifier 340c are coupled to their corresponding output terminal of the switch 800c of the selector 320b. The output terminal 520c of the buffer amplifier 340c is coupled to the bias signal output terminal 312d.

<<Operation of RF Power Amplifier Device According to the Eleventh Embodiment of the Present Invention>>

The operation of the RF power amplifier device according to the eleventh embodiment of the present invention will next be explained.

In the case of high power output, a high power level signal H indicative of a high power output state, which is generated from the baseband processing circuit 285, is supplied to the shutdown signal input terminal 218 and the first RF power amplifier/second RF power amplifier/third RF power amplifier switch control terminal 217b. In response to the high power level signal H, the switching clock generator 450 of the DC-DC converter 280 is brought to an inactive state, so that the DC-DC converter 280 is brought to an inactive state. Thus, since no fourth power supply voltage Vcc4 is generated from the output terminal 412, the supply of the fourth power supply voltage Vcc4 to the drain electrode of the second RF power amplifier 270b and the drain electrode of the third RF power amplifier 270c is stopped. On the other hand, a second power supply voltage Vcc2 is supplied from the drive power supply terminal 215b of the first RF power amplifier to the drain electrode of the first RF power amplifier 270a via the choke inductor 240b.

On the other hand, in response to the high power level signal H, only the switch 800a of the three switches that configure the selector 320b of the bias supply circuit 265b shown in FIG. 25 is turned on, and the switches 800b and 800c are turned off. As a result, the second RF power amplifier 270*b* and the third RF power amplifier 270*c* are respectively brought to a cutoff state to stop their amplifying operations, whereas the first RF power amplifier 270*a* in which a predetermined bias current flows performs its amplifying operation. The RF amplification output signal amplified by the first RF power amplifier 270*a* is generated from the drain electrode of the first RF power amplifier 270*a*.

In the case of middle power output, a middle power level signal M indicative of a high power output state, which is generated from the baseband processing circuit 285, is supplied to the shutdown signal input terminal 218 and the first RF power amplifier/second RF power amplifier/third RF power amplifier switch control terminal 217*b*. In response to the middle power level signal M, the switching clock generator 450 of the DC-DC converter 280 is brought to an active state, so that the DC-DC converter 280 is brought to an active state. Thus, a fourth power supply voltage Vcc4 having a voltage level equal to ½ of a third power supply voltage Vcc3 supplied to the drive power supply terminal 215*c* for the second and third RF power amplifiers 270*b* and 270*c* is supplied from the output terminal 412 to the drain electrodes of the second and third RF power amplifiers 270*b* and 270*c* via the choke inductor 240*c*. On the other hand, a second power supply voltage Vcc2 from the drive power supply terminal 215*b* of the first RF power amplifier 270*a* is supplied to the drain electrode of the first RF power amplifier 270*a* via the choke inductor 240*b*.

In response to the middle power level signal M, only the switch 800*b* of the three switches that configure the selector 320*b* of the bias supply circuit 265*b* shown in FIG. 25 is turned on and the switches 800*a* and 800*c* are turned off. As a result, the first RF power amplifier 270*a* and the third RF power amplifier 270*c* are respectively brought to a cutoff state to stop their amplifying operations, whereas the second RF power amplifier 270*b* in which a predetermined bias current flows performs its amplifying operation. The RF amplification output signal amplified by the first power amplifier 270*a* is generated from the drain electrode of the first RF power amplifier 270*a*.

In the case of low power output, a low power level signal L indicative of a low power output state, which is generated from the baseband processing circuit 285, is supplied to the shutdown signal input terminal 218 and the first RF power amplifier/second RF power amplifier/third RF power amplifier switch control terminal 217*b*. In response to the low power level signal L, the switching clock generator 450 of the DC-DC converter 280 is brought to an active state, so that the DC-DC converter 280 is brought to an active state. Thus, a fourth power supply voltage Vcc4 having a voltage level equal to approximately ½ of the third power supply voltage Vcc3 supplied to the drive power supply terminal 215*c* for the second and third RF power amplifiers 270*b* and 270*c* is supplied from the output terminal 412 to the drain electrodes of the second and third RF power amplifiers 270*b* and 270*c* via the choke inductor 240*c*. On the other hand, a second power supply voltage Vcc2 from the drive power supply terminal 215*b* of the first RF power amplifier 270*a* is supplied to the drain electrode of the first RF power amplifier 2760*a* via the choke inductor 240*b*.

In response to the low power level signal L, only the switch 800*c* of the three switches that configure the selector 320*b* of the bias supply circuit 265*b* shown in FIG. 25 is turned on and the switches 800*a* and 800*b* are turned off. As a result, the first RF power amplifier 270*a* and the second RF power amplifier 270*b* are respectively brought to a cutoff state to stop their amplifying operations, whereas the third RF power amplifier 270*c* in which a predetermined bias current flows performs its amplifying operation. The RF amplification output signal amplified by the third power amplifier 270*c* is generated from the drain electrode of the third RF power amplifier 270*c*.

According to the RF power amplifier device related to the eleventh embodiment of the present invention shown in FIGS. 24 and 25, a reduction in current consumption corresponding to transmission output power is enabled because three-stage switching of transmission output power is made possible.

Incidentally, in the case of the middle power output, the eleventh embodiment of the present invention can also provide the operation of turning off only the switch 800*a* of the three switches that configure the selector 320*b* of the bias supply circuit 265*b* shown in FIG. 25 in response to the middle power level signal M, and turning on the switches 800*b* and 800*c*. In this case, the second RF power amplifier 270*b* and the third RF power amplifier 270*c* perform their amplifying operations at the middle power output. Further, the signal outputted by the baseband processing circuit 285 at the middle power output is divided into a high-middle power level signal M1 and a low-middle power level signal M2. In the case of the high-middle power level signal M1, only the switch 800*a* is turned off and the switches 800*b* and 800*c* are turned off, whereby the second RF power amplifier 270*b* and the third RF power amplifier 270*c* perform their amplifying operations. In the case of the low-middle power level signal M2, the switches 800*a* and 800*c* are turned off and only the switch 800*b* is turned on, so that the second RF power amplifier 270*b* can also execute its amplifying operation. In this case, output power changeover levels are taken in the form of fourth stages. Further, a reduction in current consumption responsive to the output power is enabled.

[Twelfth Embodiment]

<<Configuration of RF Power Amplifier Device According to the Twelfth Embodiment of the Present Invention>>

Figure 26:
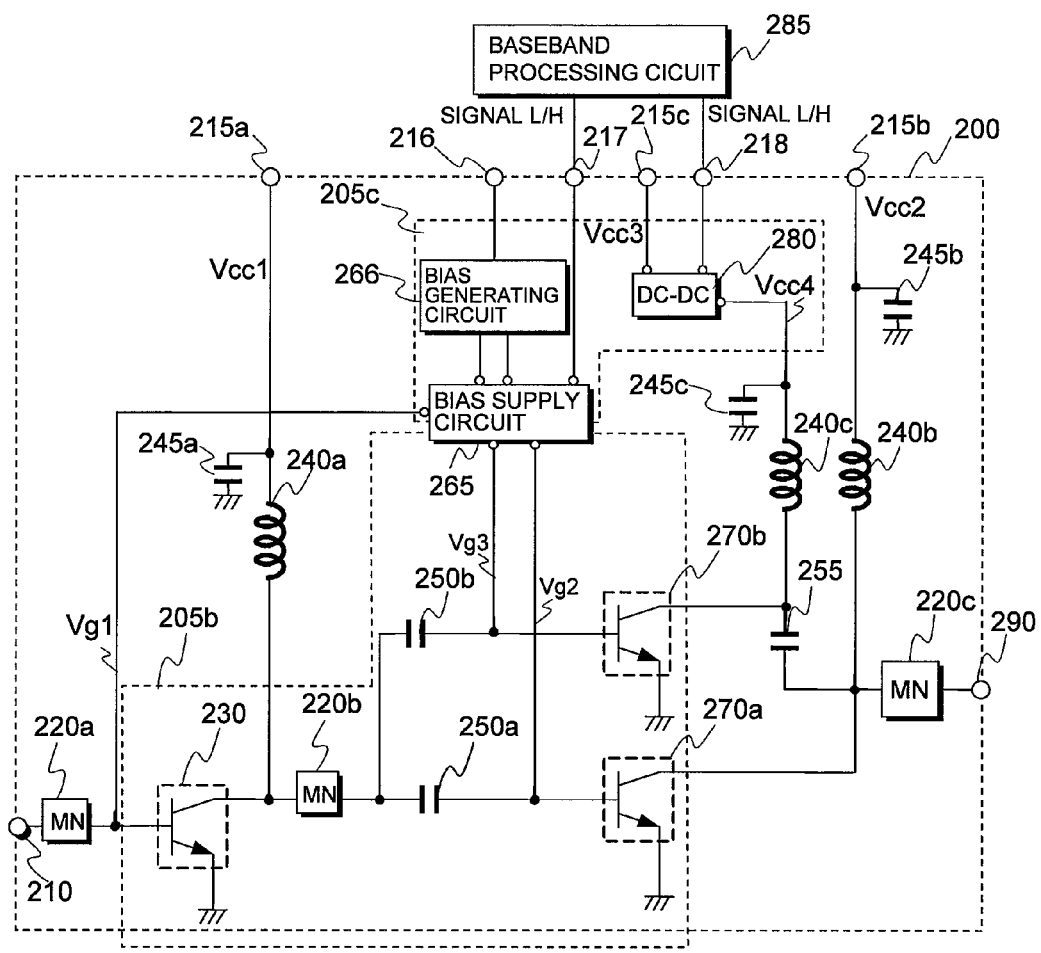
FIG. 26 is a diagram showing a configuration of an RF power amplifier device according to a twelfth embodiment of the present invention.

FIG. 26 is a diagram showing the configuration of the RF power amplifier device according to the twelfth embodiment of the present invention.

The RF power amplifier device according to the twelfth embodiment of the present invention shown in FIG. 26 is different from the RF power amplifier devices according to the first to eleventh embodiments of the present invention in the following points, but is basically identical in other points thereto.

That is, in the RF power amplifier device according to each of the first to eleventh embodiments of the present invention, the driver stage amplifier 230, the first RF power amplifier 270*a* and the second RF power amplifier 270*b* are respectively comprised of the N-type LDMOS transistors each having the gate, source and drain electrodes. On the other hand, in the RF power amplifier device according to the twelfth embodiment of the present invention shown in FIG. 26, the driver stage amplifier 230, the first RF power amplifier 270*a* and the second RF power amplifier 270*b* are respectively comprised of NPN-type HBT transistors each formed by a compound semiconductor such as GaAs, having base, emitter and collector electrodes. Incidentally, HBT is an abbreviation of Hetero-Junction Bipolar Transistor.

Thus, in the RF power amplifier device according to the twelfth embodiment of the present invention shown in FIG. 26, the driver stage amplifier 230, the first RF power amplifier 270*a*, the second RF power amplifier 270*b*, and the bias transistors 330*a*, 330*b* and 330*c* of the bias supply circuit 265 are integrated into a compound semiconductor chip 205*b*, whereas the bias generating circuit 266, the DC-DC converter 280 and the buffer amplifiers 340*a* and 340*b* of the bias supply circuit 265 are integrated into a silicon semiconductor chip 205*c*.

<<Operation of RF Power Amplifier Device According to the Twelfth Embodiment of the Present Invention>>

The operation of the RF power amplifier device according to the twelfth embodiment of the present invention shown in FIG. 26 in which the RF amplifying devices are respectively comprised of the HBT transistors, is basically identical to the operation of each of the RF power amplifier devices according to the first to eleventh embodiments of the present invention in which the RF amplifying devices are respectively comprised of the N-type LDMOS transistors, and dual explanations thereof will therefore be omitted.

[Thirteenth Embodiment]

<<Configuration of RF Power Amplifier Device According to the Thirteenth Embodiment of the Present Invention>>

FIG. 27 is a diagram showing the configuration of the RF power amplifier device according to the thirteenth embodiment of the present invention.

In FIG. 27, PA1 and PA2 indicate first and second RF power amplifiers, reference numeral 810 denotes an RF signal input terminal, reference numeral 815 denotes a power divider, reference numerals 820a and 830b denote +45-degree phase shifters, reference numerals 820b and 830a denote −45-degree phase shifters, reference numeral 840 denotes a power combiner, and reference numeral 890 denotes a final RF signal output terminal. Here, the respective RF power amplifiers of the first and second RF power amplifiers PA1 and PA2 correspond to the RF power amplifiers configured by any one of the first to twelfth embodiments of the present invention.

Firstly, since the RF power amplifier device according to the thirteenth embodiment of the present invention shown in FIG. 27 includes the first and second RF power amplifiers PA1 and PA2 operated in parallel, it is operated as a balanced power amplifier.

That is, the power divider 815 is a three terminal circuit equipped with an input terminal and two output terminals, in which the input terminal is coupled to the RF signal input terminal 810, one of the two output terminals is coupled to its corresponding input terminal of the first RF power amplifier PA1 via the +45-degree phase shifter 820a, and the other thereof is coupled to its corresponding input terminal of the second RF power amplifier PA2 via the −45-degree phase shifter 820b.

The respective RF power amplifiers of the first and second RF power amplifiers PA1 and PA2 are both four terminal circuits each equipped with an RF signal input terminal, two control input terminals and an RF signal output terminal. The RF signal input terminal of the first RF power amplifier PA1 is coupled to its corresponding output terminal of the +45-degree phase shifter 820a, and the RF signal input terminal of the second RF power amplifier PA2 is coupled to its corresponding output terminal of the −45-degree phase shifter 820b. The two control input terminals 217 and 218 of the first and second RF power amplifiers PA1 and PA2 are respectively coupled to the baseband processing circuit 285. The RF signal output terminal 290a of the first RF power amplifier PA1 is coupled to its corresponding input terminal of the −45-degree phase shifter 830a, and the RF signal output terminal 290b of the second RF power amplifier PA2 is coupled to its corresponding input terminal of the +45-degree phase shifter 830b. The power combiner 840 is a three terminal circuit equipped with two input terminals and an output terminal. One of the two input terminals is coupled to its corresponding output terminal of the −45-degree phase shifter 830a and the other thereof is coupled to its corresponding output terminal of the +45-degree phase shifter 830b, and the output terminal is coupled to the final RF signal output terminal 890.

The power divider 815, the −45-degree phase shifters 820b and 830a, the +45-degree phase shifters 820a and 830b, and the power combiner 840 are mountable over an insulating support substrate of an RF power amplifier module 200, whereas some thereof may also be integrated into semiconductor chips for the first and second RF power amplifiers PA1 and PA2. The DC-DC converter 280, bias supply circuit 265 and bias current generating circuit 266 for the first RF power amplifier PA1 can be integrated inside the semiconductor chip for the first RF power amplifier PA1. The DC-DC converter 280, bias supply circuit 265 and bias current generating circuit 266 for the second RF power amplifier PA2 can be integrated inside the semiconductor chip for the second RF power amplifier PA2. When the first and second RF power amplifiers PA1 and PA2 are integrated into the signal semiconductor chip, one DC-DC converter 280, one bias supply circuit 265 and one bias current generating circuit 266 shared by both of the first and second RF power amplifiers PA1 and PA2 can be integrated inside the single semiconductor chip. Further, in this case, some or all of the power divider 815, the −45-degree phase shifters 820b and 830a, the +45-degree phase shifters 820a and 830b and the power combiner 840 can be integrated inside the single semiconductor chip.

<<Operation of RF Power Amplifier Device According to the Thirteenth Embodiment of the Present Invention>>

The operation of the RF power amplifier device according to the thirteenth embodiment of the present invention will next be explained.

An RF input signal supplied to the RF signal input terminal 810 is divided by the power divider 815. Thus, the two RF input signals having a phase difference of 90 degrees with respect to each other are generated by the +45-degree phase shifter 820a and the −45-degree phase shifter 820b, followed by being supplied to the RF input terminals of the first and second RF power amplifiers PA1 and PA2.

An RF signal generated from the RF signal output terminal 290a of the first RF power amplifier PA1 and an RF signal generated from the RF signal output terminal 290b of the second RF power amplifier PA2 are respectively phase-converted by −45° and +45° by the −45-degree phase shifter 830a and the +45-degree phase shifter 830b. Accordingly, the RF signal at the output terminal of the −45-degree phase shifter 830a and the RF signal at the output terminal of the +45-degree phase shifter 830b are placed in phase and combined together by the power combiner 840, after which the so-combined RF output signal is outputted from the final RF signal output terminal 890. Upon the power combination by the power combiner 840, the power combiner 840 may have the function of providing match between the output impedances of the −45-degree phase shifter 830a and the +45-degree phase shifter 830b, and the input impedance (normally 50Ω) of the final RF signal output terminal 890.

When the first and second RF power amplifiers PA1 and PA2 of the RF power amplifier according to the thirteenth embodiment of the present invention shown in FIG. 27 are respectively operated as the balanced power amplifiers in particular, the difference in phase between the two RF output signals of the two RF signal output terminals 290a and 290b of the first and second RF power amplifiers PA1 and PA2 is 90°. When the load impedance of the final RF signal output terminal 890 of the RF power amplifier module 200 fluctuates, one of the load impedance of the RF signal output terminal 290a of the first RF power amplifier PA1 and the load impedance of the RF signal output terminal 290b of the second RF power amplifier PA2 is rotated to the inductive side on the Smith chart, whereas the other thereof is rotated to the capacitive side in the opposite direction. Thus, since one load impedance becomes high impedance and the other load impedance becomes low impedance, it is possible to correct distortion of the RF combined signal of the power combiner 840.

While the invention made above by the present inventors has been described specifically on the basis of the preferred embodiments, the present invention is not limited to the embodiments referred to above. It is needless to say that various changes can be made thereto within the scope not departing from the gist thereof.

In the various embodiments referred to above, for example, the driver stage amplifier 230, the first RF power amplifier 270a, the second RF power amplifier 270b and the transistors 330a, 330b, 330c, 430b, 430c and 430d of the bias supply circuit 265 have been comprised of the N-type LDMOS transistors each formed in the semiconductor chip 205 or the NPN-type HBT transistors each formed in the compound semiconductor chip 205b. It is however needless to say that transistors other than the above can be used. It is possible to use an HEMT (High Electron Mobility Transistor), a bipolar transistor using an SiGe heterojunction, etc., for example.

Further, it is needless to say that one package for the RF power amplifier module 200 is configured by ceramic encapsulation or metal encapsulation even in addition to the resin encapsulation.

What is claimed is:

1. An RF power amplifier device comprising:
   a driver stage amplifier;
   a first RF amplifier;
   a second RF amplifier; and
   a DC voltage converter,
   wherein the driver stage amplifier, the first RF amplifier, the second RF amplifier, and the DC voltage converter are operable by external power supply voltages supplied from the outside of the RF power amplifier device,
   wherein an output signal generated from an output terminal of the driver stage amplifier is capable of being supplied to an input terminal of the first RF amplifier and an input terminal of the second RF amplifier,
   wherein an effective device size of the first RF amplifier is set to a device size larger than an effective device size of the second RF amplifier,
   wherein the DC voltage converter is capable of generating an operating power supply voltage being a voltage lower than the external power supply voltage by being supplied with the external power supply voltage and supplying the operating power supply voltage to an output terminal of the second RF amplifier, and
   wherein the external power supply voltage supplied from the outside of the RF power amplifier device is capable of being supplied to an output terminal of the first RF amplifier without via the DC voltage converter.

2. The RF power amplifier device according to claim 1, further comprising:
   a bias circuit capable of supplying a first bias voltage, a second bias voltage, and a third bias voltage to an input terminal of the driver stage amplifier, the input terminal of the first RF amplifier, and the input terminal of the second RF amplifier respectively,
   wherein the bias circuit sets the second bias voltage and the third bias voltage to a low level and a high level respectively in response to a first state of each of external control signals supplied to external control terminals of the RF power amplifier device to thereby control the first RF amplifier to an inactive state and control the second RF amplifier to an active state, and
   wherein the bias circuit sets the second bias voltage and the third bias voltage to a high level and a low level respectively in response to a second state of each of the external control signals supplied to the external control terminals of the RF power amplifier device to thereby control the first RF amplifier to an active state and control the second RF amplifier to an inactive state.

3. The RF power amplifier device according to claim 2, wherein the DC voltage converter is controlled to an inactive state in response to the second state of the external control signal to stop the generation of the operating power supply voltage from the external power supply voltage by the DC voltage converter.

4. The RF power amplifier device according to claim 3, wherein, even when the external control signal is either the first state or the second state, the bias circuit sets the first bias voltage to a high level to thereby control the driver stage amplifier to an active state.

5. The RF power amplifier device according to claim 4, wherein the first bias voltage, the second bias voltage of high level, and the third bias voltage of high level generated from the bias circuit are respectively set to values at which the driver stage amplifier, the first RF amplifier, and the second RF amplifier are linearly operable respectively.

6. The RF power amplifier device according to claim 5, wherein the DC voltage converter is a DC-DC converter comprising a charge pump circuit.

7. The RF power amplifier device according to claim 5, wherein the DC voltage converter is a DC-DC converter comprising a switching regulator using an inductor.

8. The RF power amplifier device according to claim 5, further comprising:
   a switch coupled between an input terminal of the DC voltage converter supplied with the external power supply voltage and an output terminal of the DC voltage converter supplied with the operating power supply voltage,
   wherein the DC voltage converter is controlled to the inactive state in response to the second state of the external control signal to control the switch to an on state, and the switch held in the on state bypasses between the input terminal of the DC voltage converter and the output terminal thereof to thereby enable the external power supply voltage supplied from the outside to be supplied to the output terminal of the first RF amplifier.

9. The RF power amplifier device according to claim 5, further comprising:
   a series regulator coupled between the output terminal of the DC voltage converter from which the operating power supply voltage is generated, and the output terminal of the second RF amplifier,
   wherein, when the DC voltage converter is controlled to an active state in response to the first state of the external control signal, the series regulator supplied with the operating power supply voltage generated from the output terminal of the DC voltage converter is capable of generating a conversion operation power supply voltage adjusted by an output voltage set signal supplied from the outside of the RF power amplifier device and supplying the same to the output terminal of the second RF amplifier.

10. The RF power amplifier device according to claim 5, further comprising:
a detector capable of detecting an amplitude level of an RF input signal at the input terminal of the driver stage amplifier,
wherein the operating power supply voltage corresponding to the low voltage generated from the DC voltage converter is varied in response to the output signal detected by the detector, and the varied operating power supply voltage is capable of being supplied to the output terminal of the second RF amplifier.

11. The RF power amplifier device according to claim 5, further comprising:
a change-over switch having a first input terminal, a second input terminal, a control input terminal, and an output terminal,
wherein the external power supply voltage is capable of being supplied to the first input terminal of the change-over switch, the operating power supply voltage generated from the output terminal of the DC voltage converter is capable of being supplied to the second input terminal of the change-over switch, the control input terminal of the change-over switch is capable of responding to the first state and the second state of the external control signal, and the output terminal of the change-over switch is coupled to the output terminal of the driver stage amplifier,
wherein, in response to the second state of the external control signal supplied to the control input terminal of the change-over switch, the change-over switch supplies the external power supply voltage supplied to the first input terminal to the output terminal of the driver stage amplifier via the output terminal of the change-over switch, and
wherein, in response to the first state of the external control signal supplied to the control input terminal of the change-over switch, the change-over switch supplies the operating power supply voltage of the DC voltage converter supplied to the second input terminal to the output terminal of the driver stage amplifier via the output terminal of the change-over switch.

12. The RF power amplifier device according to claim 11, wherein the output terminal of the first RF amplifier and the output terminal of the second RF amplifier are coupled to an RF signal output terminal,
wherein the output terminal of the driver stage amplifier is further coupled to the RF signal output terminal via a signal switch,
wherein, in response to a third state in which the external control signals supplied to the external control terminals of the RF power amplifier device are respectively indicative of a lowest transmission output power state of the RF power amplifier device, the bias circuit sets the first bias voltage, the second bias voltage and the third bias voltage to a high level, a low level and a low level respectively to thereby control the driver stage amplifier to the active state, control the first RF amplifier to the inactive state and control the second RF amplifier to the inactive state, and
wherein the signal switch is controlled to an on state in response to the third state of the external control signal to transmit an amplified signal of the output terminal of the driver stage amplifier to the RF signal output terminal via the signal switch controlled to the on state.

13. The RF power amplifier device according to claim 5, wherein the bias circuit comprises a first buffer amplifier and a second buffer amplifier which respectively supply the second bias voltage and the third bias voltage to the input terminal of the first RF amplifier and the input terminal of the second RF amplifier,
wherein, in response to the second states of the external control signals supplied to the external control terminals of the RF power amplifier device, the bias circuit supplies the external power supply voltages supplied from the outside of the RF power amplifier device to the first buffer amplifier and the second buffer amplifier respectively, and
wherein, in response to the first state of each of the external control signals supplied to the external control terminals of the RF power amplifier device, the bias circuit supplies the operating power supply voltage corresponding to the low voltage generated from the DC voltage converter to the first buffer amplifier and the second buffer amplifier.

14. The RF power amplifier device according to claim 5, wherein the output terminal of the first RF amplifier and the output terminal of the second RF amplifier are coupled to an RF signal output terminal, and
wherein one end of an output matching circuit is coupled to the RF signal output terminal, a first interstage matching circuit is coupled between the other end of the output matching circuit and the output terminal of the first RF amplifier, and a second interstage matching circuit is coupled between the other end of the output matching circuit and the output terminal of the second RF amplifier.

15. The RF power amplifier device according to claim 5, wherein the external power supply voltage generated from a DC-DC converter located outside the RF power amplifier device is capable of being supplied to the RF power amplifier device, and the driver stage amplifier, the first RF amplifier, the second RF amplifier and the DC voltage converter are operable by the external power supply voltage.

16. The RF power amplifier device according to claim 5, further comprising:
a third RF amplifier set to a device size smaller than the effective device size of the second RF amplifier,
wherein the bias circuit generates a fourth bias voltage and supplies the same to an input terminal of the third RF amplifier, and
wherein the output signal generated from the output terminal of the driver stage amplifier is capable of being supplied to the input terminal of the third RF amplifier, and an output terminal of the third RF amplifier is coupled to an RF signal output terminal to which the output terminal of the first RF amplifier and the output terminal of the second RF amplifier are coupled.

17. The RF power amplifier device according to claim 5, wherein the driver stage amplifier, the first RF amplifier, and the second RF amplifier respectively comprise either a field effect transistor or a bipolar transistor.

18. An RF module comprising a balanced power amplifier provided inside one package, comprising:
a first RF power amplifier; and
a second RF power amplifier that is operable in parallel with the first RF power amplifier,
wherein the first and second RF power amplifiers respectively comprise an RF power amplifier device comprising:
a driver stage amplifier;
a first RF amplifier;
a second RF amplifier; and
a DC voltage converter, wherein the driver stage amplifier, the first RF amplifier, the second RF amplifier, and the DC voltage converter are operable by external power supply voltages supplied from the outside of the RF power amplifier device, wherein an output signal generated from an output terminal of the driver stage amplifier is capable of being supplied to an input terminal of the first RF amplifier and an input terminal of the second RF amplifier, wherein an effective device size of the first RF amplifier is set to a device size larger than an effective device size of the second RF amplifier, wherein the DC voltage converter is capable of generating an operating power supply voltage being a voltage lower than the external power supply voltage by being supplied with the external power supply voltage and supplying the operating power supply voltage to an output terminal of the second RF amplifier, and wherein the external power supply voltage supplied from the outside of the RF power amplifier device is capable of being supplied to an output terminal of the first RF amplifier without via the DC voltage converter.

19. A method for operating an RF power amplifier device comprising a driver stage amplifier, a first RF amplifier, a second RF amplifier, a DC voltage converter, and a bias circuit, comprising the steps of:

enabling the driver stage amplifier, the first RF amplifier, the second RF amplifier and the DC voltage converter to be operated by external power supply voltages supplied from the outside of the RF power amplifier device;

enabling an output signal generated from an output terminal of the driver stage amplifier to be supplied to an input terminal of the first RF amplifier and an input terminal of the second RF amplifier, and setting an effective device size of the first RF amplifier to a device size larger than an effective device size of the second RF amplifier;

enabling the DC voltage converter to generate an operating power supply voltage corresponding to a voltage lower than the external power supply voltage by being supplied with the external power supply voltage, and enabling the DC voltage converter to supply the operating power supply voltage to an output terminal of the second RF power amplifier;

enabling the external power supply voltage supplied from the outside of the RF power amplifier device to be supplied to an output terminal of the first RF amplifier without via the DC voltage converter;

enabling the bias circuit to generate a first bias voltage, a second bias voltage and a third bias voltage respectively and enabling the same to be supplied to an input terminal of the driver stage amplifier, the input terminal of the first RF amplifier and the input terminal of the second RF amplifier respectively;

causing the bias circuit to set the second bias voltage and the third bias voltage to a low level and a high level respectively in response to first states of external control signals supplied to external control terminals of the RF power amplifier device to thereby control the first RF amplifier to an inactive state and control the second RF amplifier to an active state; and causing the bias circuit to set the second bias voltage and the third bias voltage to a high level and a low level respectively in response to second states of the external control signals supplied to the external control terminals of the RF power amplifier device to thereby control the first RF amplifier to an active state and control the second RF amplifier to an inactive state.

20. The method according to claim 19, wherein the DC voltage converter is controlled to an inactive state in response to the second state of the external control signal thereby to stop the generation of the operating power supply voltage from the external power supply voltage by the DC voltage converter.

* * * * *